US012329024B2

(12) United States Patent
Morse et al.

(10) Patent No.: US 12,329,024 B2
(45) Date of Patent: Jun. 10, 2025

(54) ORGANIC SEMICONDUCTORS

(71) Applicant: RAYNERGY TEK INCORPORATION, Hsinchu (TW)

(72) Inventors: Graham Morse, Southampton (GB); Agnieszka Pron, Eastleigh (GB); Sebastian Kowalski, Darmstadt (DE); Priti Tiwana, North Baddesley (GB); Jonathan Snow, Salisbury (GB); Li Wei Tan, Chandlers Ford (GB)

(73) Assignee: RAYNERGY TEK INCORPORATION, Hsinchu (TW)

( * ) Notice: Subject to any disclaimer, the term of this patent is extended or adjusted under 35 U.S.C. 154(b) by 891 days.

(21) Appl. No.: 17/593,352

(22) PCT Filed: Mar. 17, 2020

(86) PCT No.: PCT/EP2020/057174
§ 371 (c)(1),
(2) Date: Sep. 16, 2021

(87) PCT Pub. No.: WO2020/187867
PCT Pub. Date: Sep. 24, 2020

(65) Prior Publication Data
US 2022/0173321 A1    Jun. 2, 2022

(30) Foreign Application Priority Data

Mar. 19, 2019  (EP) .................... 19163631

(51) Int. Cl.
*H10K 85/10* (2023.01)
*C08G 61/12* (2006.01)

(52) U.S. Cl.
CPC ......... *H10K 85/113* (2023.02); *C08G 61/126* (2013.01); *H10K 85/151* (2023.02); *C08G 2261/122* (2013.01); *C08G 2261/149* (2013.01); *C08G 2261/3223* (2013.01); *C08G 2261/3243* (2013.01); *C08G 2261/411* (2013.01); *C08G 2261/514* (2013.01)

(58) Field of Classification Search
CPC ............ H01L 51/0036; H01L 51/0047; C08G 2261/3243
See application file for complete search history.

(56) References Cited

U.S. PATENT DOCUMENTS

2020/0362097 A1* 11/2020 Yan ..................... C08G 61/126

FOREIGN PATENT DOCUMENTS

| CN | 104105734 A | 10/2014 |
| CN | 104136484 A | 11/2014 |
| WO | 2004022626 A1 | 3/2004 |
| WO | 2018065356 A1 | 4/2018 |
| WO | 2018068721 A1 | 4/2018 |
| WO | 2019218276 A1 | 11/2019 |

OTHER PUBLICATIONS

Mingyu Jeong, et al., Feasible D1-A-D2-A Random Copolymers for Simultaneous High-Performance Fullerene and Non-Fullerene Solar Cells, Adv. Energy Mater. 2017, 1702166.
Mai Ha Hoang, et al., High-Efficiency Non-Fullerene Polymer Solar Cell Fabricated by a Simple Process Using New Conjugated Terpolymers, J. Mater. Chem. C. 2019, 7, 111-118.
Yong Cui, et al., Achieving Over 15% Efficiency in Organic Photovoltaic Cells via Copolymer Design, Communication, Organic Solar Cells, Adv. Mater. 2019, 1808356.
International Search Report, PCT/EP2020/057174, Mar. 17, 2020, Merck Patent GMBH.
First Office Action mailed to corresponding Chinese Patent Application No. 202080022565.3 on Mar. 10, 2023.
Office Action mailed to Corresponding Chinese Patent Application No. 202080022565.3 on Sep. 12, 2023.

* cited by examiner

*Primary Examiner* — Shane Fang
(74) *Attorney, Agent, or Firm* — WPAT, PC

(57) ABSTRACT

The invention relates to novel organic semiconducting (OSC) random copolymers containing a halo-substituted 4,8-dithiophenyl-benzodithiophene unit and a benzodithiophene-dione unit, to methods for their preparation and educts or intermediates used therein, to compositions and formulations containing them, to the use of the copolymers and compositions as organic semiconductors in, or for the preparation of, organic electronic (OE) devices, especially organic photovoltaic (OPV) devices, perovskite-based solar cell (PSC) devices, organic photodetectors (OPD), organic field effect transistors (OFET) and organic light emitting diodes (OLED), and to OE devices comprising these copolymers or compositions.

24 Claims, No Drawings

ORGANIC SEMICONDUCTORS

TECHNICAL FIELD

The invention relates to novel organic semiconducting (OSC) random copolymers containing a halo-substituted 4,8-dithiophenyl-benzodithiophene unit and a benzodithiophene-dione unit, to methods for their preparation and educts or intermediates used therein, to compositions and formulations containing them, to the use of the copolymers and compositions as organic semiconductors in, or for the preparation of, organic electronic (OE) devices, especially organic photovoltaic (OPV) devices, perovskite-based solar cell (PSC) devices, organic photodetectors (OPD), organic field effect transistors (OFET) and organic light emitting diodes (OLED), and to OE devices comprising these copolymers or compositions.

BACKGROUND

In recent years, there has been development of OSC materials in order to produce more versatile, lower cost electronic devices. Such materials find application in a wide range of devices or apparatus, including organic field effect transistors (OFETs), organic light emitting diodes (OLEDs), organic photodetectors (OPDs), organic photovoltaic (OPV) cells, perovskite-based solar cell (PSC) devices, sensors, memory elements and logic circuits to name just a few. The OSC materials are typically present in the electronic device in the form of a thin layer, for example of between 50 and 300 nm thickness.

OSC materials are receiving ever-growing attention mostly due to their lucrative commercial prospects in organic electronics manufactured by cost effective solution processing technology at low temperature. It is generally believed that OSCs have a number of advantage over their inorganic counterparts, such as the potential of fabricating lightweight flexible backplanes, the opportunity to make large area displays using low-cost, high speed solution based fabrication techniques, and their optical and electronic properties being fine-tunable via rational chemical structure modifications.

One particular area of importance is organic photovoltaics (OPV). Conjugated OSC polymers and OSC small molecules have found use in OPVs, mainly in the photoactive layer, as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based photovoltaic devices are achieving efficiencies above 14%.

In photoactive layers containing a blend of an n-type OSC and a p-type OSC, typically a π-conjugated polymer, forming a bulk-heterojunction (BHJ), the π-conjugated polymer serves as the main absorber of the solar energy. Therefore a low band gap is a basic requirement for the polymer to absorb the maximum of the solar spectrum.

Thus, for use as donor OSC in OPV cells and OPDs, the conjugated polymer should have a low bandgap, which enables improved light harvesting by the photoactive layer and can lead to higher power conversion efficiency.

Polymerising π-π-donor-acceptor (D-A) monomers to synthesize D-A copolymers through transition metal catalysed polycondensation is a known strategy to achieve low bandgap semiconducting polymers for OPV and OPD applications. Conjugated D-A copolymers have also been found to demonstrate high charge carrier mobilities in OTFTs. It is generally accepted that the alternating D-A structure facilitates stronger intermolecular interactions, leading to smaller π-π-stacking distance and efficient intermolecular charge transfer due to static attractions between the donor and the acceptor monomer units.

Another particular area of importance are OFETs. The performance of OFET devices is principally based upon the charge carrier mobility of the semiconducting material and the current on/off ratio, so the ideal semiconductor should have a low conductivity in the off state, combined with high charge carrier mobility ($>1\times10^{-1}$ cm$^2$V$^{-1}$ s$^{-1}$). In addition, it is important that the semiconducting material is stable to oxidation i.e. it has a high ionisation potential, as oxidation leads to reduced device performance, like for example increased off current and threshold voltage shift. Further requirements for the semiconducting material are good processability, especially for large-scale production of thin layers and desired patterns, and high stability, film uniformity and integrity of the organic semiconductor layer.

Organic photodetectors (OPDs) are a further particular area of importance, for which conjugated light-absorbing polymers offer the hope of allowing efficient devices to be produced by solution-processing technologies, such as spin casting, dip coating or ink jet printing, to name a few only.

The photosensitive layer in an OPV or OPD device is usually composed of at least two materials, a p-type semiconductor, which is typically a conjugated polymer, an oligomer or a defined molecular unit, and an n-type semiconductor, which is typically a fullerene or substituted fullerene, graphene, a metal oxide, or quantum dots.

However, the OSC materials disclosed in prior art for use in OE devices do still have several drawbacks, such as poor solubility in solvents suitable for mass production, relatively low device performance such as inadequate charge-carrier mobility for commercial application for example in transistors, modest thermal, photo and electrical stability, poor long term stability and non-reproducible film forming properties. In addition, other OSC materials do not often form a favourable morphology and/or donor phase miscibility for use in organic photovoltaics or organic photodetectors.

Therefore there is still a need for OSC materials for use in OE devices like OPVs, OPDs and OFETs, which have advantageous properties, in particular good processability, high solubility in organic solvents, good structural organization and film-forming properties. In addition, the OSC materials should be easy to synthesize, especially by methods suitable for mass production. For use in OPV cells, the OSC materials should especially have a low bandgap, which enables improved light harvesting by the photoactive layer and can lead to higher cell efficiencies, high stability and long lifetime. For use in OFETs the OSC materials should especially have high charge-carrier mobility, high on/off ratio in transistor devices, high oxidative stability and long lifetime.

It was an aim of the present invention to provide new OSC compounds, including p-type and n-type OSCs, which can overcome the drawbacks of the OSCs from prior art, and which provide one or more of the above-mentioned advantageous properties, especially easy synthesis by methods suitable for mass production, good processability, high stability, long lifetime in OE devices, good solubility in organic solvents, high charge carrier mobility, and a low bandgap. Another aim of the invention was to extend the pool of OSC materials and p-type and n-type OSCs available to the expert. Other aims of the present invention are immediately evident to the expert from the following detailed description.

The inventors of the present invention have found that one or more of the above aims can be achieved by providing polymers as disclosed and claimed hereinafter, which are random copolymers comprising a benzodithiophene (BDT) unit of formula I which is 4,8-disubstituted by halogenated thiophene, and further comprising a benzodithiophene-dione (BDD) unit of formula II. It has been found that such copolymers can be used as OSCs which show advantageous properties as described above.

Alternating copolymers containing BDT and BDD units have been reported in prior art.

KR10-2018-0126814 A, Li et al., *Adv. Mater.* 2016, 28, 9423-9429 and Wang et al., *Nano Energy* 2018, 736-744 disclose the alternating copolymer PBDB-T of the structure below and its use as donor together with a non-fullerene acceptor in the photoactive layer of a BHJ OPV cell:

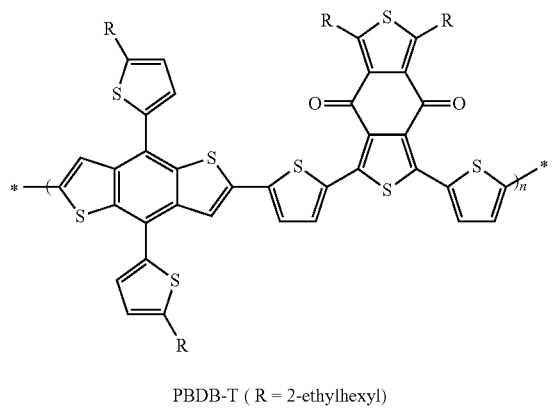

PBDB-T ( R = 2-ethylhexyl)

M. Zhang et al., *Adv. Mater.* 2015, 27, 4655-4660 report the structure-analogous difluorinated copolymer PM6, and its use as donor together with PCBM-C71 in the photoactive layer of a BHJ OPV cell:

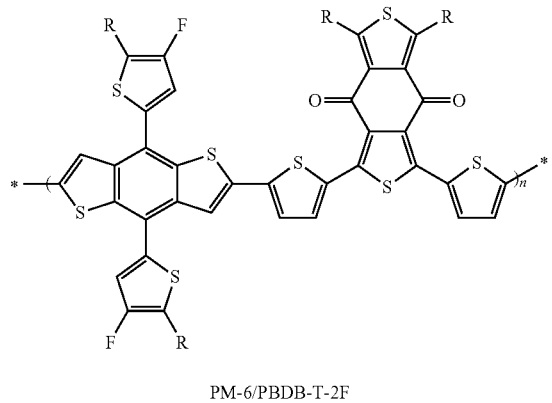

PM-6/PBDB-T-2F

S. Zhang et al., *Adv. Mater.* 2018, 30, 1800868; and Y. Zhang et al., *Sci. China Chem.* 2018, 61 disclose the difluorinated copolymer PBDB-T-2F which is similar to PM-6 above, and the corresponding dichlorinated copolymer PDBD-T-2Cl, and their use as donor together with a non-fullerene acceptor in the photoactive layer of a BHJ OPV cell:

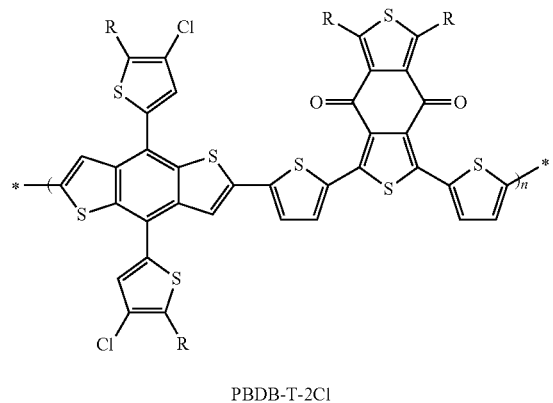

PBDB-T-2Cl

JP2013-185077 A discloses copolymers of BDT and BDD, and explicitly discloses the following alternating copolymer:

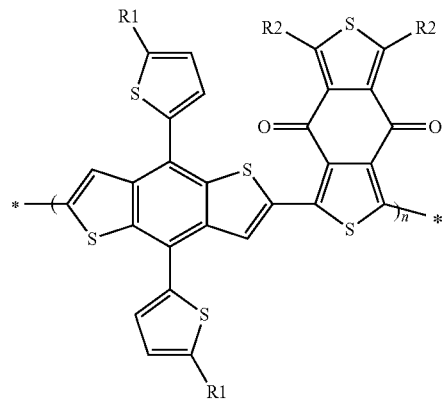

wherein R1 is 2-ethylhexyloxy and R2 is n-hexyl.

However, the above documents do not disclose random copolymers as disclosed and claimed hereinafter.

WO2018-065356 A2 discloses the following generic copolymer formulae:

P41

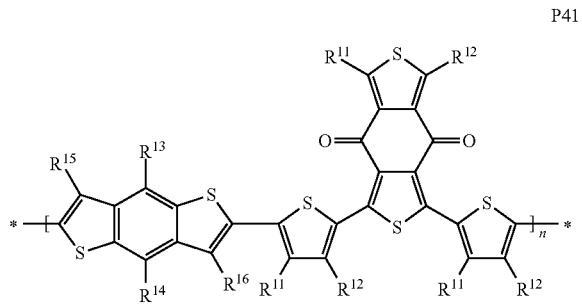

P42

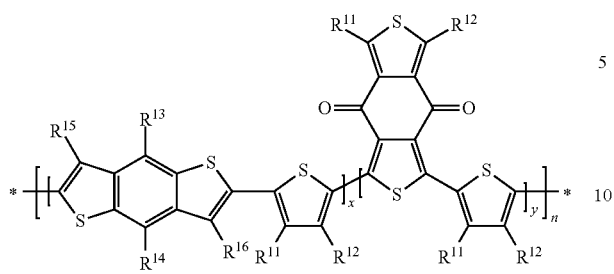

wherein R¹¹-16 are for example H, F, Cl, alkyl, aryl or heteroaryl groups, but does not disclose the specifically substituted copolymers as disclosed and claimed hereinafter.

SUMMARY

The invention relates to a conjugated copolymer comprising, preferably consisting of, one or more units of formula I and one or more units of formula that are distributed in random sequence along the polymer backbone

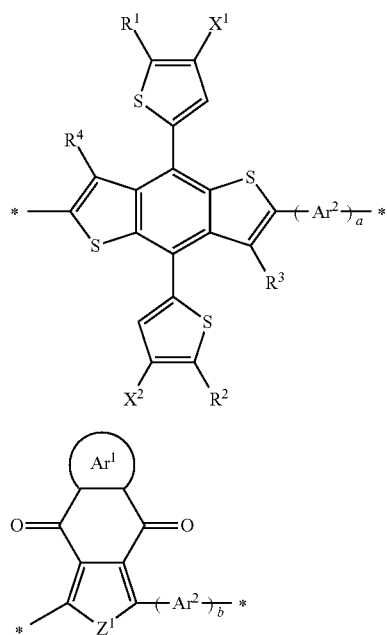

I

II wherein the individual radicals, independently of each other and on each occurrence identically or differently, have the following meanings Ar¹ a group selected from the following formulae and their mirror images

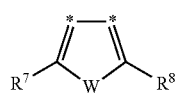
A1a

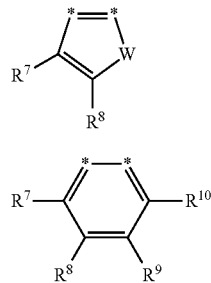
A1b

A1c

Ar² a group selected from the following formulae and their mirror images

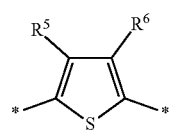
A2a

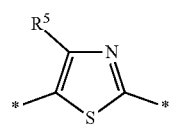
A2b

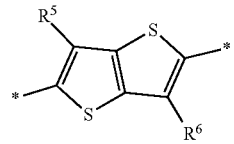
A2c

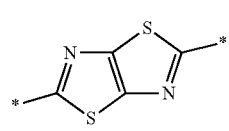
A2d

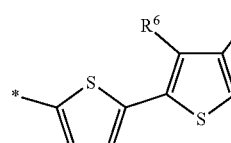
A2e $X^1$, $X^2$ H, F, Cl or straight-chain or branched alkyl with 1 to 20 C atoms that is optionally fluorinated, preferably H, F or Cl, very preferably F or Cl, most preferably Cl, W S, O, Se, $CR^1R^2$ or $NR^1$, preferably S, $R^{1-10}$ H, F, Cl, straight-chain, branched or cyclic alkyl with 1 to 30, preferably 1 to 20, C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl or heteroarylalkyl, wherein each of the aforementioned cyclic groups has 5 to 20 ring atoms, is mono- or polycyclic, does optionally contain fused rings, and is unsubstituted or substituted by one or more identical or different groups L, L F, Cl, —CN, —NC, —NCO, —NCS, —OCN, —SCN, $R^0$, $OR^0$, $SR^0$, —C(=O)$X^0$, —C(=O)$R^0$, —C(=O)—$OR^0$, —O—C(=O)—$R^0$, —NH$_2$, —NHR$^0$, —NR$^0$R$^{00}$, —C(=O)NHR$^0$, —C(=O)NR$^0$R$^{00}$, —SO$_3$R$^0$, —SO$_2$R$^0$, —OH, —NO$_2$, —CF$_3$, —SF$_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, —$OR^0$, —$SR^0$, —C(=O)—$R^0$, —C(=O)—$OR^0$, —O—C(=O)—$R^0$, —O—C(=O)—$OR^0$, —C(=O)—NHR$^0$, —C(=O)—NR$^0$R$^{00}$, $Y^1$, $Y^2$ H, F, Cl or CN, $X^0$ halogen, preferably F or Cl, $R^0$, $R^{00}$ H or straight-chain or branched alkyl with 1 to 20, preferably 1 to 12, C atoms that is optionally fluorinated, a, b 1 or 2, preferably 1.

The invention further relates to the use of a conjugated copolymer according to the present invention as electron donor or p-type semiconductor, or as electron acceptor or n-type semiconductor.

The invention further relates to the use of a conjugated copolymer according to the present invention as electron donor or electron acceptor component in a semiconducting material, formulation, polymer blend, device or component of a device.

The invention further relates to a semiconducting material, formulation, polymer blend, device or component of a device comprising a conjugated copolymer according to the present invention as electron donor component, and preferably further comprising one or more compounds having electron acceptor properties.

The invention further relates to a semiconducting material, formulation, polymer blend, device or component of a device comprising a conjugated copolymer according to the present invention as electron acceptor component, and preferably further comprising one or more compounds having electron donor properties.

The invention further relates to a composition, which may also be a polymer blend, comprising a conjugated copolymer according to the present invention, and further comprising one or more additional compounds selected from compounds having one or more of semiconducting, charge transport, hole or electron transport, hole or electron blocking, electrically conducting, photoconducting or light emitting properties.

The invention further relates to a composition comprising a conjugated copolymer according to the present invention, and further comprising one or more n-type organic semiconductors, preferably selected from fullerenes or substituted fullerenes.

The invention further relates to a composition comprising a conjugated copolymer according to the present invention, and further comprising one or more n-type organic semiconductors, preferably selected from small molecules that do not contain a fullerene moiety, hereinafter also referred to as non-fullerene acceptors (NFAs).

The invention further relates to a composition comprising a conjugated copolymer according to the present invention, and further comprising one or more electron donors or p-type semiconductors, preferably selected from conjugated polymers.

The invention further relates to a composition comprising a p-type semiconductor which is a conjugated copolymer according to the present invention, a first n-type semiconductor, which is preferably a fullerene or fullerene derivative, and a second n-type semiconductor, which is an NFA.

The invention further relates to a bulk heterojunction (BHJ) formed from a composition comprising a conjugated copolymer according to the present invention as electron donor or p-type semiconductor, and one or more compounds which are electron acceptor or n-type semiconductors and are preferably selected from fullerenes, substituted fullerenes or NFAs.

The invention further relates to a formulation comprising a conjugated copolymer or a composition according to the present invention, and further comprising one or more solvents, preferably selected from organic solvents.

The invention further relates to an organic semiconducting formulation comprising a conjugated copolymer according to the present invention, and further comprising one or more organic binders or precursors thereof, preferably having a permittivity ε at 1,000 Hz and 20° C. of 3.3 or less, and optionally one or more solvents preferably selected from organic solvents.

The invention further relates to an optical, electrooptical, electronic, electroluminescent or photoluminescent device, or a component thereof, or an assembly comprising it, which is prepared using a formulation according to the present invention.

The invention further relates to the use of a conjugated copolymer or composition according to the present invention as semiconducting, charge transport, electrically conducting, photoconducting or light emitting material, or in an optical, electrooptical, electronic, electroluminescent or photoluminescent device, or in a component of such a device or in an assembly comprising such a device or component The invention further relates to a semiconducting, charge transport, electrically conducting, photoconducting or light emitting material comprising a conjugated copolymer or composition according to the present invention.

The invention further relates to an optical, electrooptical, electronic, electroluminescent or photoluminescent device, or a component thereof, or an assembly comprising it, which comprises a conjugated copolymer or composition according to the present invention, or comprises a semiconducting, charge transport, electrically conducting, photoconducting or light emitting material according to the present invention.

The optical, electrooptical, electronic, electroluminescent and photoluminescent device includes, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells (PSC), laser diodes, Schottky diodes, photoconductors and photodetectors.

Preferred devices are OFETs, OTFTs, OPVs, PSCs, OPDs and OLEDs, in particular OTFTs, PSCs, OPDs and bulk heterojunction (BHJ) OPVs or inverted BHJ OPVs.

Further preferred is the use of a conjugated copolymer or composition according to the present invention as dye in a DSSC or a PSC. Further preferred is a DSSC or PSC comprising a v or composition according to the present invention.

The component of the above devices includes, without limitation, charge injection layers, charge transport layers, interlayers, planarising layers, antistatic films, polymer electrolyte membranes (PEM), conducting substrates and conducting patterns.

The assembly comprising such a device or component includes, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

In addition to the conjugated copolymers, compositions and formulations of the present invention can be used as electrode materials in batteries and in components or devices for detecting and discriminating DNA sequences.

The invention further relates to a bulk heterojunction which comprises, or is being formed from, a composition comprising a conjugated copolymer according to the present invention and one or more n-type organic semiconductors that are preferably selected from fullerenes or substituted fullerenes or NFAs. The invention further relates to a bulk heterojunction (BHJ) OPV device or inverted BHJ OPV device, comprising such a bulk heterojunction.

Terms and Definitions

As used herein, the term "polymer" will be understood to mean a molecule of high relative molecular mass, the structure of which essentially comprises multiple repetitions of units derived, actually or conceptually, from molecules of low relative molecular mass (*Pure Appl. Chem.*, 1996, 68, 2291). The term "oligomer" will be understood to mean a molecule of intermediate relative molecular mass, the structure of which essentially comprises a small plurality of units derived, actually or conceptually, from molecules of lower relative molecular mass (*Pure Appl. Chem.*, 1996, 68, 2291). In a preferred meaning as used herein present invention a polymer will be understood to mean a compound having >1, i.e. at least 2 repeat units, preferably 5, very preferably ≥10, repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, in a formula showing a polymer or a repeat unit an asterisk (*) will be understood to mean a chemical linkage, usually a single bond, to an adjacent unit or to a terminal group in the polymer backbone. In a ring, like for example a benzene or thiophene ring, an asterisk (*) will be understood to mean a C atom that is fused to an adjacent ring.

As used herein, in a formula showing a ring, a polymer or a repeat unit a dashed line (-----) will be understood to mean a single bond.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.*, 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerization reaction, like for example a group having the meaning of $R^{31}$ or $R^{32}$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerization reaction. Alternatively the endcapper can be added in situ to the reaction mixture before or during the polymerization reaction. In situ addition of an endcapper can also be used to terminate the polymerization reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, *Concise Dictionary of Physics*, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also *Pure Appl. Chem.*, 1994, 66, 1134).

As used herein, the term "conjugated" will be understood to mean a compound (for example a polymer) that contains mainly C atoms with sp²-hybridization (or optionally also sp-hybridization), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound.

As used herein, unless stated otherwise the molecular weight is given as the number average molecular weight Mn or weight average molecular weight Mw, which is determined by gel permeation chromatography (GPC) against polystyrene standards in eluent solvents such as tetrahydrofuran, trichloromethane (TCM, chloroform), chlorobenzene or 1,2,4-trichloro-benzene. Unless stated otherwise, chlorobenzene is used as solvent. The degree of polymerization, also referred to as total number of repeat units, n, will be understood to mean the number average degree of polymerization given as n=Mn/Mu, wherein Mn is the number average molecular weight and Mu is the molecular weight of the single repeat unit, see J. M. G. Cowie, *Polymers: Chemistry & Physics of Modern Materials*, Blackie, Glasgow, 1991.

As used herein, the term "carbyl group" will be understood to mean any monovalent or multivalent organic moiety which comprises at least one carbon atom either without any non-carbon atoms (like for example —C≡C—), or optionally combined with at least one non-carbon atom such as B, N, O, S, P, Si, Se, As, Te or Ge (for example carbonyl etc.).

As used herein, the term "hydrocarbyl group" will be understood to mean a carbyl group that does additionally contain one or more H atoms and optionally contains one or more hetero atoms like for example B, N, O, S, P, Si, Se, As, Te or Ge.

As used herein, the term "hetero atom" will be understood to mean an atom in an organic compound that is not a H- or C-atom, and preferably will be understood to mean B, N, O, S, P, Si, Se, Sn, As, Te or Ge.

A carbyl or hydrocarbyl group comprising a chain of 3 or more C atoms may be straight-chain, branched and/or cyclic, and may include spiro-connected and/or fused rings.

Preferred carbyl and hydrocarbyl groups include alkyl, alkoxy, thioalkyl, alkylcarbonyl, alkoxycarbonyl, alkylcarbonyloxy and alkoxycarbonyloxy, each of which is optionally substituted and has up to 40, preferably up to 25, very preferably up to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 1 to 40, preferably 6 to 40 C atoms, wherein each of these groups optionally contains one or more hetero atoms, preferably selected from B, N, O, S, P, Si, Se, As, Te and Ge.

Further preferred carbyl and hydrocarbyl group include for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group.

The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are each optionally replaced by a hetero atom, preferably selected from N, O, P, S, Si and Se, or by a —S(O)— or —S(O)$_2$— group. The non-aromatic carbo- and heterocyclic groups are mono- or polycyclic, may also contain fused rings, preferably contain 1, 2, 3 or 4 fused or unfused rings, and are optionally substituted with one or more groups L.

L is selected from F, Cl, —CN, —NO$_2$, —NC, —NCO, —NCS, —OCN, —SCN, —R$^0$, —OR$^0$, —SR$^0$, —C(=O)X$^0$, —C(=O)R$^0$, —C(=O)—OR$^0$, —O—C(=O)—R$^0$, —NH$_2$, —NHR$^0$, —NR$^0$R$^{00}$, —C(=O)NHR$^0$, —C(=O)NR$^0$R$^{00}$, —SO$_3$R$^0$, —SO$_2$R$^0$, —OH, —CF$_3$, —SF$_5$, or optionally substituted silyl, or carbyl or hydrocarbyl with 1 to 30, preferably 1 to 20 C atoms that is optionally substituted and optionally comprises one or more hetero atoms, wherein X$^0$ is halogen, preferably F or C, and R$^0$, R$^{00}$ each independently denote H or straight-chain or branched alkyl with 1 to 20, preferably 1 to 12 C atoms that is optionally fluorinated.

Preferably L is selected from F, —CN, R$^0$, —OR$^0$, —SR$^0$, —C(=O)—R$^0$, —C(=O)—OR$^0$, —O—C(=O)—R$^0$, —O—C(=O)—OR$^0$, —C(=O)—NHR$^0$ and —C(=O)—NR$^0$R$^{00}$.

Further preferably L is selected from F or alkyl, alkoxy, oxaalkyl, thioalkyl, fluoroalkyl, fluoroalkoxy, alkylcarbonyl, alkoxycarbonyl, with 1 to 16 C atoms, or alkenyl or alkynyl with 2 to 16 C atoms.

Preferred non-aromatic carbocyclic or heterocyclic groups are tetrahydrofuran, indane, pyran, pyrrolidine, piperidine, cyclopentane, cyclohexane, cycloheptane, cyclopentanone, cyclohexanone, dihydro-furan-2-one, tetrahydro-pyran-2-one and oxepan-2-one.

An aryl group as referred to above and below preferably has 4 to 30, very preferably 5 to 20, ring C atoms, is mono- or polycyclic and may also contain fused rings, preferably contains 1, 2, 3 or 4 fused or unfused rings, and is optionally substituted with one or more groups L as defined above.

A heteroaryl group as referred to above and below preferably has 4 to 30, very preferably 5 to 20, ring C atoms, wherein one or more of the ring C atoms are replaced by a hetero atom, preferably selected from N, O, S, Si and Se, is mono- or polycyclic and may also contain fused rings, preferably contains 1, 2, 3 or 4 fused or unfused rings, and is optionally substituted with one or more groups L as defined above.

An arylalkyl or heteroarylalkyl group as referred to above and below preferably denotes —(CH$_2$)$_a$-aryl or —(CH$_2$)$_a$-heteroaryl, wherein a is an integer from 1 to 6, preferably 1, and "aryl" and "heteroaryl" have the meanings given above and below. A preferred arylalkyl group is benzyl which is optionally substituted by L.

As used herein, "arylene" will be understood to mean a divalent aryl group, and "heteroarylene" will be understood to mean a divalent heteroaryl group, including all preferred meanings of aryl and heteroaryl as given above and below.

Preferred aryl and heteroaryl groups are phenyl in which, in addition, one or more CH groups may each be replaced by N, naphthalene, thiophene, selenophene, thienothiophene, dithienothiophene, fluorene and oxazole, all of which can be unsubstituted, mono- or polysubstituted with L as defined above. Very preferred aryl and heteroaryl groups are selected from phenyl, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, 2,5-dithiophene-2',5'-diyl, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, 4H-cyclopenta[2,1-b,3,4-b']dithiophene, 7H-3,4-dithia-7-sila-cyclopenta[a]pentalene, all of which can be unsubstituted, mono- or polysubstituted with L as defined above. Further examples of aryl and heteroaryl groups are those selected from the groups shown hereinafter.

An alkyl group or an alkoxy group, i.e., where the terminal $CH_2$ group is replaced by —O—, can be straight-chain or branched. Particularly preferred straight-chains have 2, 3, 4, 5, 6, 7, 8, 12 or 16 carbon atoms and accordingly denote preferably ethyl, propyl, butyl, pentyl, hexyl, heptyl, octyl, dodecyl or hexadecyl, ethoxy, propoxy, butoxy, pentoxy, hexoxy, heptoxy, octoxy, dodecoxy or hexadecoxy, furthermore methyl, nonyl, decyl, undecyl, tridecyl, tetradecyl, pentadecyl, nonoxy, decoxy, undecoxy, tridecoxy or tetradecoxy, for example.

An alkenyl group, i.e., wherein one or more $CH_2$ groups are each replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e., where one $CH_2$ group is replaced by —O—, can be straight-chain. Particularly preferred straight-chains are 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one $CH_2$ group is replaced by —C(O)—, these radicals are preferably neighbored. Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl or 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly, it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl or 5,5-bis-(ethoxycarbonyl)-hexyl.

A thioalkyl group, i.e., where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridized vinyl carbon atom is replaced.

A fluoroalkyl group can be perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, preferably with 1 to 15 C atoms, in particular 1,1-difluoroalkyl, all of the aforementioned being straight-chain or branched.

Preferably "fluoroalkyl" means a partially fluorinated (i.e. not perfluorinated) alkyl group.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-butyloctyl, 2-hexyldecyl, 2-octyldodecyl, 3,7-dimethyloctyl, 3,7,11-trimethyldodecyl, 2-propylpentyl, in particular 2-methylbutyl, 2-methylbutoxy, 2-methylpentoxy, 3-methyl-pentoxy, 2-ethyl-hexoxy, 2-butyloctoxyo, 2-hexyldecoxy, 2-octyldodecoxy, 3,7-dimethyloctoxy, 3,7,11-trimethyldodecoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-methoxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloro-propionyloxy, 2-chloro-3-methylbutyryloxy, 2-chloro-4-methyl-valeryloxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl and 2-fluoromethyloctyloxy for example. Very preferred are 2-methylbutyl, 2-ethylhexyl, 2-butyloctyl, 2-hexyldecyl, 2-octyldodecyl, 3,7-dimethyloctyl, 3,7,11-trimethyldodecyl, 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the substituents on an aryl or heteroaryl ring are independently of each other selected from primary, secondary or tertiary alkyl, alkoxy, oxaalkyl, thioalkyl, alkylcarbonyl or alkoxycarbonyl with 1 to 30 C atoms, wherein one or more H atoms are each optionally replaced by F, or aryl, aryloxy, heteroaryl or heteroaryloxy that is optionally alkylated, alkoxylated, alkylthiolated or esterified and has 4 to 30, preferably 5 to 20, ring atoms. Further preferred substituents are selected from the group consisting of the following formulae

SUB1

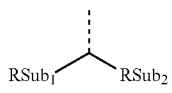
SUB2

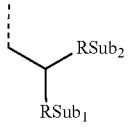
SUB3

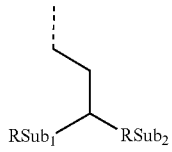
SUB4

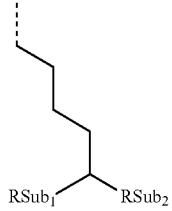
SUB5

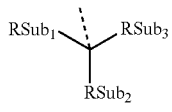
SUB6

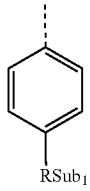
SUB7

-continued

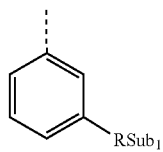
SUB8

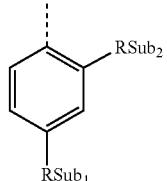
SUB9

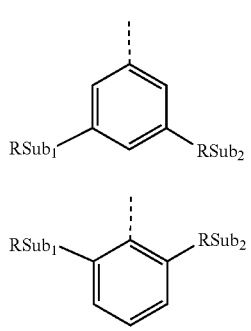
SUB10

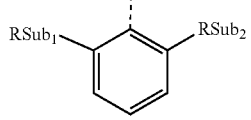
SUB11

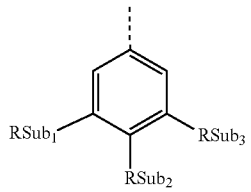
SUB12

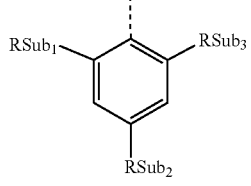
SUB13

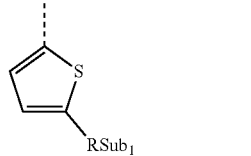
SUB14

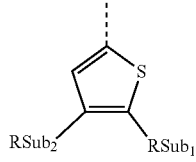
SUB15

SUB16

SUB17

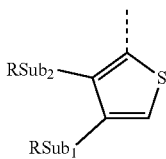

SUB18

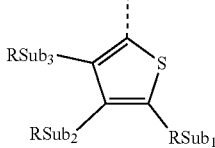

wherein RSub$_{1-3}$ each denote L as defined above and below and where at least, preferably all, of RSub$_{1-3}$ is alkyl, alkoxy, oxaalkyl, thioalkyl, alkylcarbonyl or alkoxycarbonyl with up to 24 C atoms, preferably up to 20 C atoms, that is optionally fluorinated, and wherein the dashed line denotes the link to the ring to which these groups are attached. Very preferred among these substituents are those wherein all RSub$_{1-3}$ subgroups are identical.

As used herein, if an aryl(oxy) or heteroaryl(oxy) group is "alkylated or alkoxylated", this means that it is substituted with one or more alkyl or alkoxy groups having from 1 to 24 C-atoms and being straight-chain or branched and wherein one or more H atoms are each optionally substituted by an F atom.

Above and below, $Y^1$ and $Y^2$ are independently of each other H, F, Cl or CN.

As used herein, —CO—, —C(=O)— and —C(O)— will be understood to mean a carbonyl group, i.e. a group having the structure

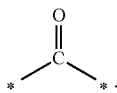

As used herein, C=CR$^1$R$^2$ will be understood to mean a group having the structure

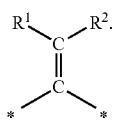

As used herein, "halogen" includes F, Cl, Br or I, preferably F, Cl or Br. A halogen atom that represents a substituent on a ring or chain is preferably F or Cl, very preferably F. A halogen atom that represents a reactive group in a monomer or an intermediate is preferably Br or I.

Above and below, the term "mirror image" means a moiety that can be obtained from another moiety by flipping it vertically or horizontally across an external symmetry plane or a symmetry plane extending through the moiety. For example the moiety

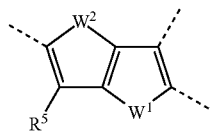

also includes the mirror images

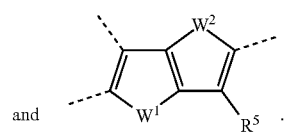

and

DETAILED DESCRIPTION

The polymers of the present invention are easy to synthesize and exhibit advantageous properties. They show good processability for the device manufacture process, high solubility in organic solvents, and are especially suitable for large scale production using solution processing methods.

In addition, the copolymers of the present invention show low bandgaps, high charge carrier mobilities, high external quantum efficiencies in BHJ solar cells, good morphology when used in p/n-type blends e.g. with fullerenes, high oxidative stability, a long lifetime in electronic devices, and are promising materials for organic electronic OE devices, especially for OPV devices with high power conversion efficiency (PCE).

The polymers of the present invention are suitable as p-type or n-type semiconductors, especially as p-type semiconductors, for the preparation of blends of p-type and n-type semiconductors which are suitable for use in BHJ photovoltaic devices.

Besides, the polymers of the present invention show the following advantageous properties:
  i) a higher PCE,
  ii) a higher solubility in organic solvents and better processability especially in device manufacture based on solution processing,
  iii) an improved morphology of the BHJ which can be achieved by modification of the solubilizing groups and which can lead to an increased fill factor (FF).

In a preferred embodiment of the present invention, in the units of formula I and its subformulae $R^1$ and $R^2$ are selected from the group A) consisting of straight-chain or branched alkyl, alkoxy or thioalkyl, preferably alkyl, each of the aforementioned having 1 to 30, preferably 1 to 20 C atoms and being optionally fluorinated, very preferably from formulae SUB1-SUB6 above.

In another preferred embodiment of the present invention, in the units of formula I and its subformulae $R^1$ and $R^2$ are selected from the group B) consisting of mono- or polycyclic aryl or heteroaryl, each of which is optionally substituted with one or more groups L as defined in formula I and has 5 to 20 ring atoms, and wherein two or more rings may be fused to each other or connected with each other by a covalent bond, very preferably from phenyl that is optionally substituted, preferably in 4-position, 2,4-positions, 2,4,6-positions or 3,5-positions, or thiophene that is optionally substituted, preferably in 5-position, 4,5-positions or 3,5-positions, with alkyl, alkoxy or thioalkyl having 1 to 16 C atoms, most preferably from formulae SUB7-SUB18 above.

In another preferred embodiment of the present invention, in the units of formula I and its subformulae $R^1$ and $R^2$ are selected from the group C) consisting of F, Cl, CN, —C(=O)—R″, —C(=O)—OR″, —C(=O)—NHR″ and —C(=O)—NR″R‴, wherein R‴ and R″ are independently of each other straight-chain or branched alkyl with 1 to 28, preferably 1 to 18 C atoms that is optionally fluorinated, very preferably F or Cl, most preferably Cl.

Preferably, in the units of formula I and its subformulae a is 1 and in the units of formula and its subformulae b is 1.

Preferably, in the units of formula I and its subformulae $X^1$ and $X^2$ denote H, F or Cl, very preferably F or Cl, most preferably Cl.

Preferably, in the units of formula and its subformulae $Ar^1$ is selected from the following formulae and their mirror images

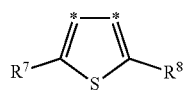

A1a1

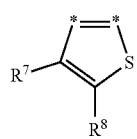

A1b1

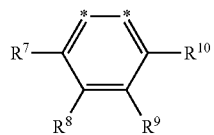

A1c wherein $R^{7-10}$ have one of the meanings given above and below.

In formula A1a and A1a1 preferably one or both of $R^7$ and $R^8$ are different from H, and are selected from group A), B) or C) as defined above, very preferably from group A).

In formula A1b and A1b1 preferably one or both of $R^7$ and $R^8$ are different from H, and are selected from group A), B) or C) as defined above. Preferably $R^8$ is selected from group A) as defined above, and $R^8$ is selected from group C) as defined above and most preferably denotes Cl. Further preferably $R^7$ and $R^8$ are selected from group A) as defined above.

In formula A1c preferably one or more, very preferably one or two, of $R^{7-10}$ are different from H, and are selected from group A), B) or C) as defined above, preferably from group A).

Preferably $Ar^1$ is selected from formulae A1a, A1b, A1a1 or A1b1, very preferably from formulae A1a or A1a1.

Preferably, in the units of formula I and II and their subformulae $Ar^2$ is selected from formulae A2a, A2c and A2e and their mirror images, very preferably from formulae A2a and A2c, most preferably of formula A2a.

Preferred units of formula I and are selected from the following subformulae:

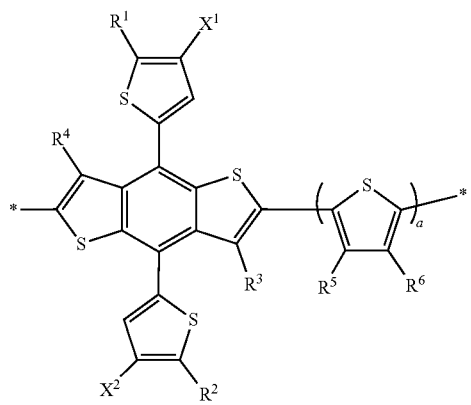

I1

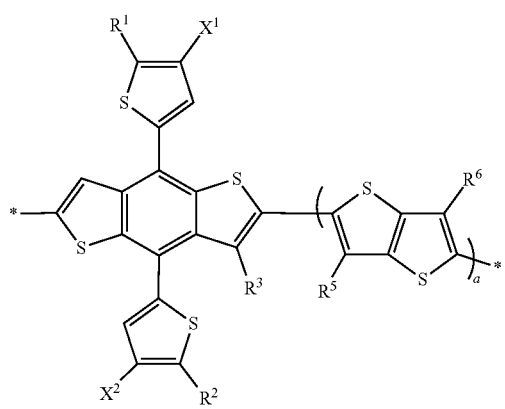

I2

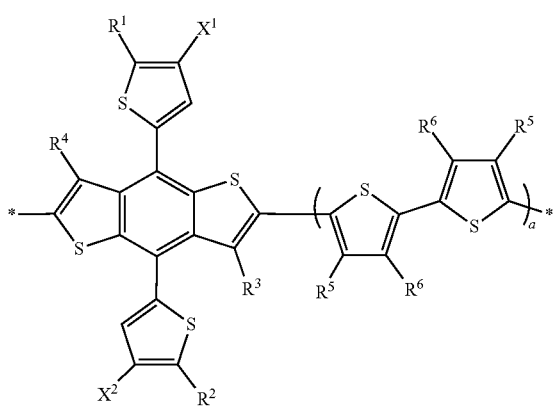

I3

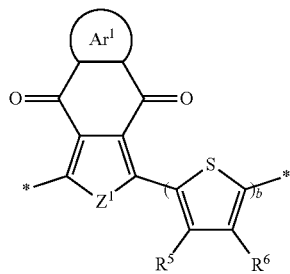

II1

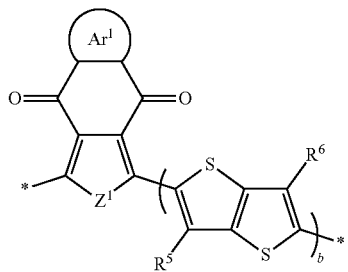

II2

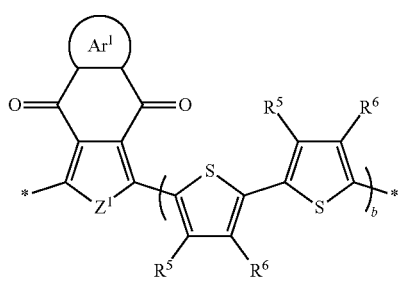

II3

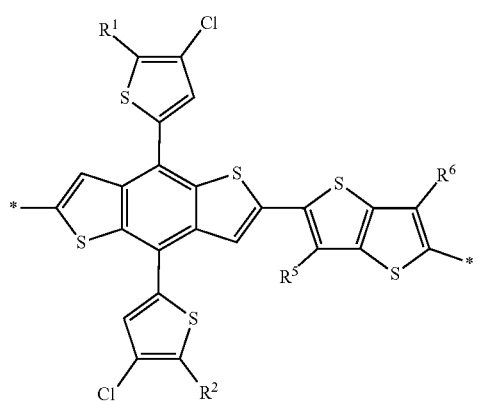

I2-1

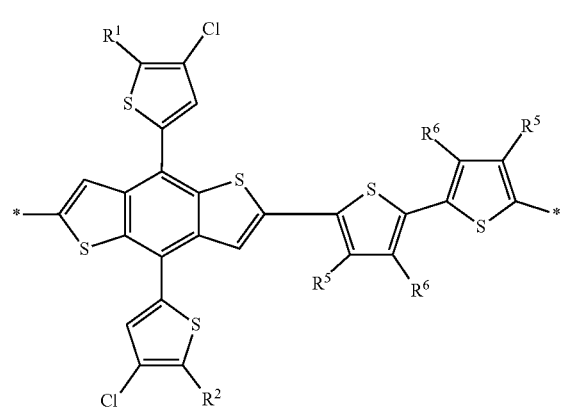

I3-1 wherein Ar¹, $X^{1,2}$, $Z^1$, $R^{1-6}$, a and b have, independently of each other and on each occurrence identically or differently, the meanings given above and below. $X^1$ and $X^2$ preferably denote Cl. $R^3$ and $R^4$ preferably denote H. $R^1$ and $R^2$ are preferably selected from group A) as defined above. $R^5$ and $R^6$ preferably denote H, further preferably $R^5$ and/or $R^6$ is selected from group A) as defined above.

Further preferred units of formula I and are selected from the following subformulae:

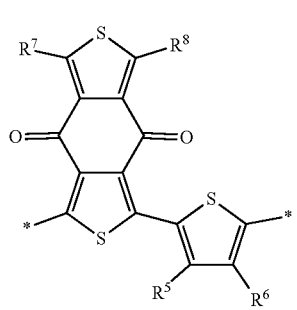

II1-1

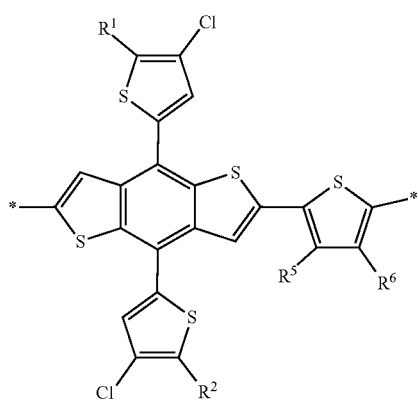

I1-1

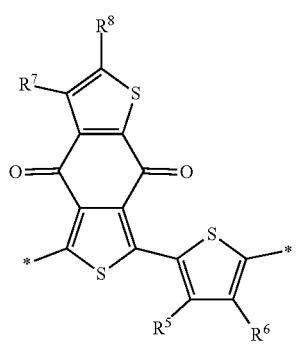

II1-2

-continued

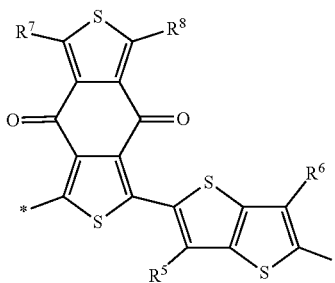
II2-1

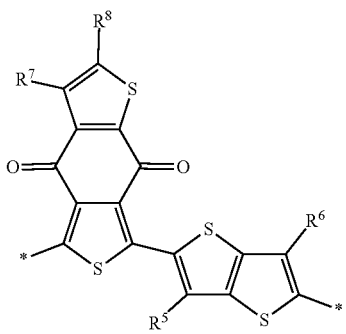
II2-2

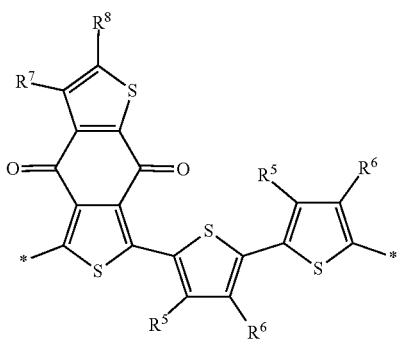
II3-1

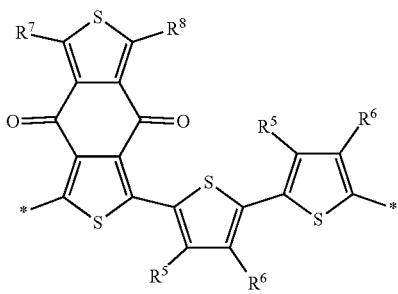
II3-2 wherein $R^{1-8}$ have, independently of each other and on each occurrence identically or differently, the meanings given above and below. $R^1$ and $R^2$ are preferably selected from group A) as defined above. $R^5$ and $R^6$ preferably denote H, further preferably $R^5$ and/or $R^6$ is selected from group A) as defined above. $R^7$ and $R^8$ are preferably different from H. In formula II1-1, II2-1 and II3-1 preferably $R^7$ and $R^8$ are selected from group A) as defined above. In formula II1-2, II2-2 and II3-2 preferably $R^8$ is Cl and $R^7$ is selected from group A) as defined above, further preferably $R^7$ and $R^6$ are both selected from group A) as defined above.

In a preferred embodiment of the present invention, in the units of formula I and its subformulae $R^3$ and $R^4$ denote H.

In another preferred embodiment of the present invention, in the units of formula I and its subformulae $R^3$ and/or $R^4$ is different from H.

In a preferred embodiment of the present invention, in the units of formula I and their subformulae $R^5$ and $R^6$ denote H.

In another preferred embodiment of the present invention, in the units of formula I and their subformulae $R^5$ and $R^6$ are different from H, further preferably one of $R^5$ and $R^6$ is different from H and the other is H.

In a preferred embodiment of the present invention, in the units of formula I and its subformulae $R^{7-10}$ denote H.

In another preferred embodiment of the present invention, in the units of formula and its subformulae one or more of $R^{7-10}$ is different from H.

In a preferred embodiment of the present invention, in the units of formula I and their subformulae, $R^{3-10}$, when being different from H, are each independently selected from group A) as defined above.

In another preferred embodiment of the present invention, in the units of formula I and II and their subformulae $R^{3-10}$, when being different from H, are each independently selected from group B) as defined above.

In another preferred embodiment of the present invention, in the units of formula I and II and their subformulae $R^{3-10}$, when being different from H, are each independently selected from group C) as defined above.

Preferred aryl and heteroaryl groups $R^{1-10}$, when being different from H, are each independently selected from the following formulae

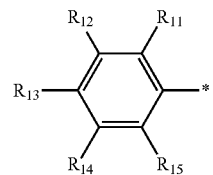
C1

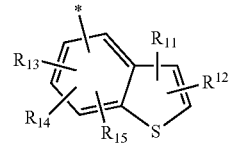
C2

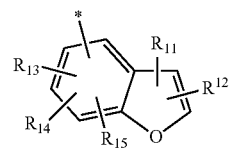
C3

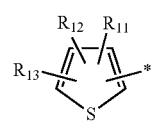
C4

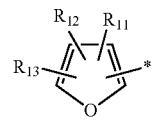
C5

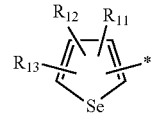
C6

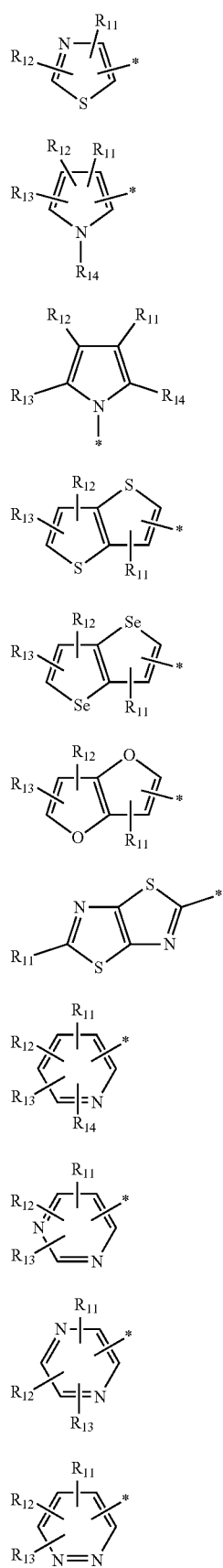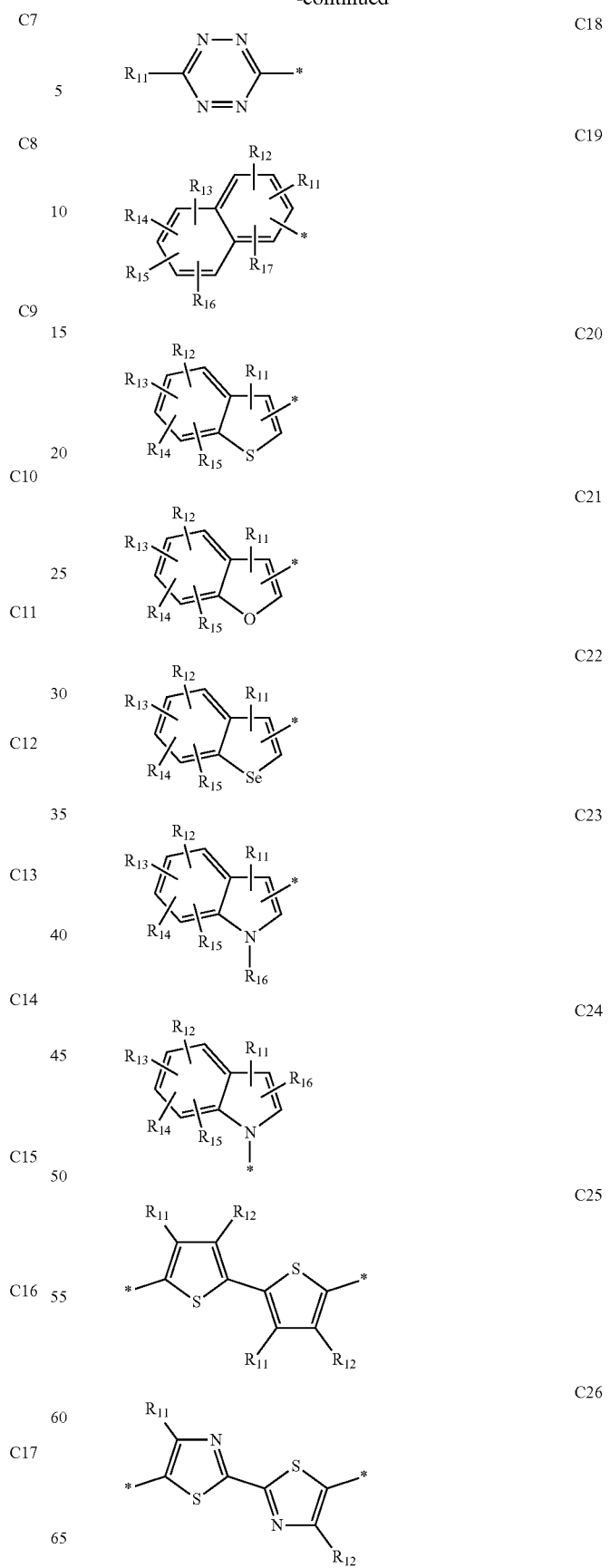

-continued

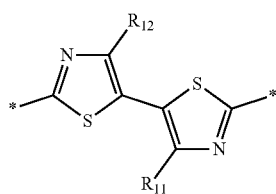

C27 wherein $R^{11-17}$, independently of each other, and on each occurrence identically or differently, have one of the meanings of $R^3$ in formula I.

Very preferred aryl and heteroaryl groups $R^{1-10}$, when being different from H, are each independently selected from the following formulae

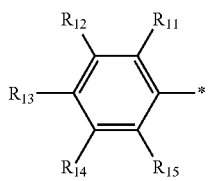 C1-1

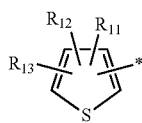 C4-1

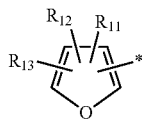 C5-1

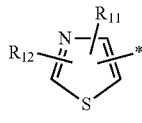 C7-1

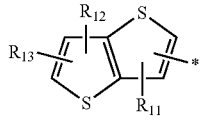 C10-1 wherein $R^{11-15}$ are as defined above. Most preferred aryl and heteroaryl groups $R^{1-10}$ are each independently selected from formulae SUB7-SUB18 as defined above.

In another preferred embodiment one or more of $R^{1-10}$, when being different from H, denote a straight-chain, branched or cyclic alkyl group with 1 to 50, preferably 2 to 50, very preferably 2 to 30, more preferably 2 to 24, most preferably 2 to 16 C atoms, in which one or more $CH_2$ or $CH_3$ groups are replaced by a cationic or anionic group.

The cationic group is preferably selected from the group consisting of phosphonium, sulfonium, ammonium, uronium, thiouronium, guanidinium or heterocyclic cations such as imidazolium, pyridinium, pyrrolidinium, triazolium, morpholinium or piperidinium cation.

Preferred cationic groups are selected from the group consisting of tetraalkylammonium, tetraalkylphosphonium, N-alkylpyridinium, N,N-dialkylpyrrolidinium, 1,3-dialkylimidazolium, wherein "alkyl" preferably denotes a straight-chain or branched alkyl group with 1 to 12 C atoms and very preferably is selected from formulae SUB1-6.

Further preferred cationic groups are selected from the group consisting of the following formulae

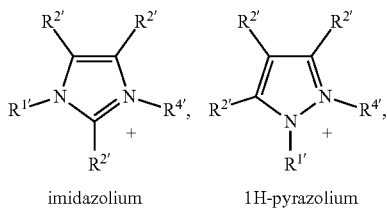

imidazolium     1H-pyrazolium

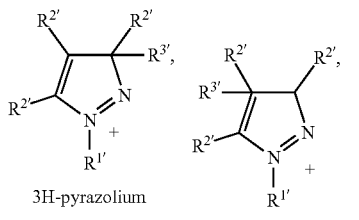

3H-pyrazolium     4H-pyrazolium

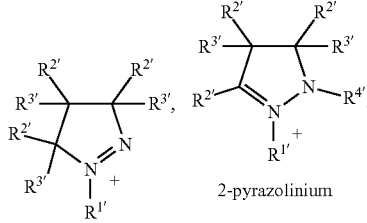

1-pyrazolinium     2-pyrazolinium

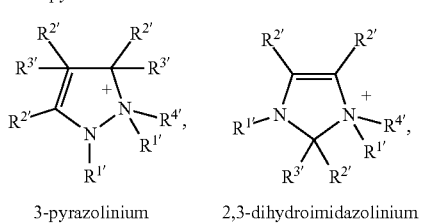

3-pyrazolinium     2,3-dihydroimidazolinium

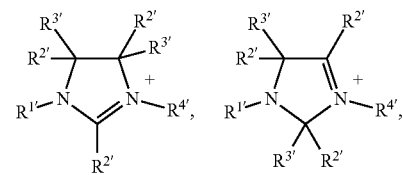

4,5-dihydroimidazolinium     2,5-dihydroimidazolinium

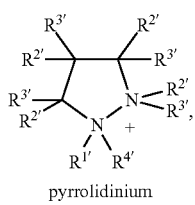

pyrrolidinium     1,2,4-triazolium

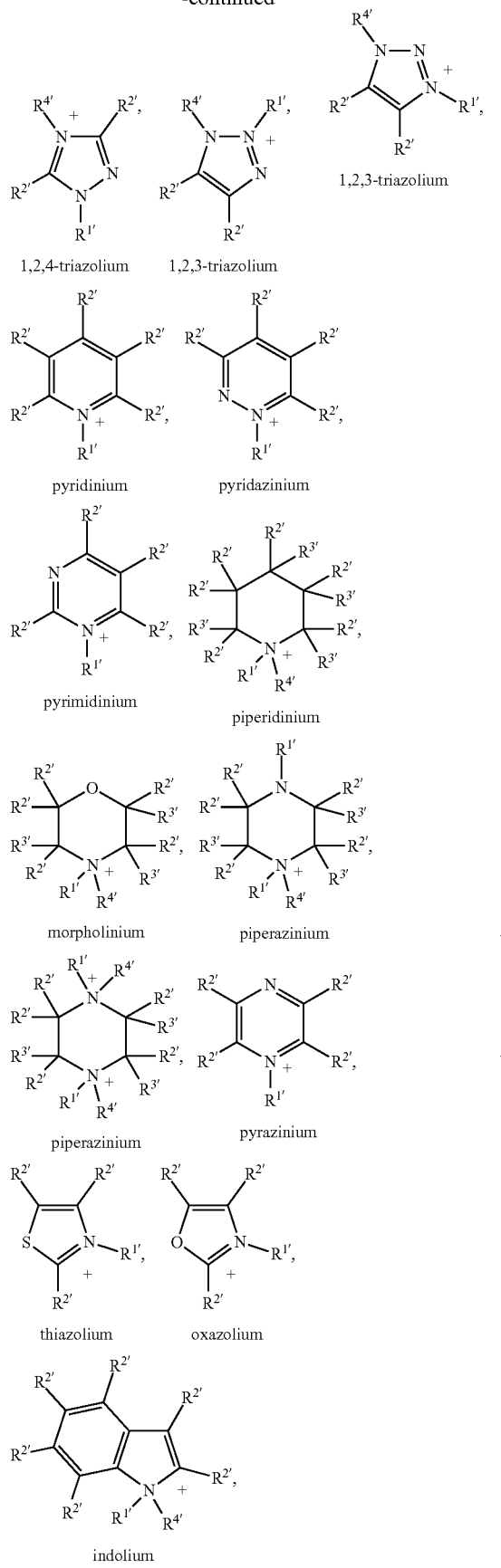
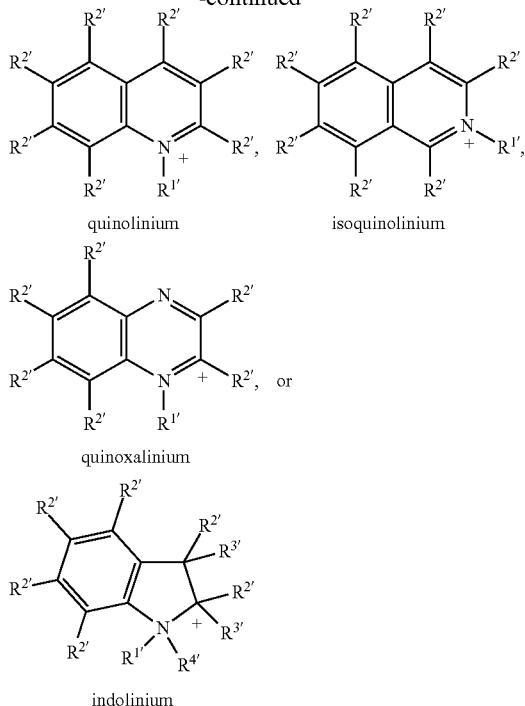

wherein R$^{1'}$, R$^{2'}$, R$^{3'}$ and R$^{4'}$ denote, independently of each other, H, a straight-chain or branched alkyl group with 1 to 12 C atoms or non-aromatic carbo- or heterocyclic group or an aryl or heteroaryl group, each of the aforementioned groups having 3 to 20, preferably 5 to 15, ring atoms, being mono- or polycyclic, and optionally being substituted by one or more identical or different substituents L as defined above, or denote a link to the respective group R$^1$-6.

In the above cationic groups of the above-mentioned formulae any one of the groups R$^{1'}$, R$^{2'}$, R$^{3'}$ and R$^{4'}$ (if they replace a CH$_3$ group) can denote a link to the respective group R$^1$-6, or two neighbored groups R$^{1'}$, R$^{2'}$, R$^{3'}$ or R$^{4'}$ (if they replace a CH$_2$ group) can denote a link to the respective group R$^1$-6.

The anionic group is preferably selected from the group consisting of borate, imide, phosphate, sulfonate, sulfate, succinate, naphthenate or carboxylate, very preferably from phosphate, sulfonate or carboxylate.

In the formulae above and below, L is preferably selected from the following groups
the group consisting of R$^L$, —OR$^L$ and —SR$^L$ wherein R$^L$ is straight-chain or branched alkyl with 1 to 25, preferably 1 to 18 C atoms which is optionally fluorinated,
the group consisting of F, Cl, CN, —C(=O)—R$^L$, —C(=O)OR$^L$, —OC(=O)—R$^L$, —C(=O)—NHR— and —C(=O)—NR$^L$R$^{LL}$, wherein R$^L$ and R$^{LL}$ are independently of each other straight-chain or branched alkyl with 1 to 25, preferably 1 to 18 C atoms that is optionally fluorinated.

The present invention also relates to a conjugated polymer, which is a random copolymer comprising, preferably consisting of, one or more units selected from formulae I and one or more units selected from formulae II, preferably consisting of one or more units selected from formulae I1, I2 and I3 and one or more units selected from formulae II1, II2 and II3, very preferably consisting of one or more units selected from formulae I1-1, I2-1 and I3-1 and one or more units selected from formulae II1-1, II1-2, II2-1, II2-2, II3-1 and II3-2.

Preferably the conjugated polymer is a random copolymer of formula III:

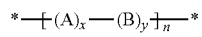   III wherein the individual radicals, independently of each other and on each occurrence identically or differently, have the following meanings A a unit of formula I, I1, I2, I3, I1-1, I2-1 or I3-1 as defined above and below, B a unit of formula II, II1, II2, II3, II1-1, II1-2, II2-1, II2-2, II3-1 or II3-2 as above and below, x, y >0 and <1, with x+y=1, and n an integer >1, preferably ≥5.

Very preferably the conjugated polymer is a random copolymer selected from the following subformulae:

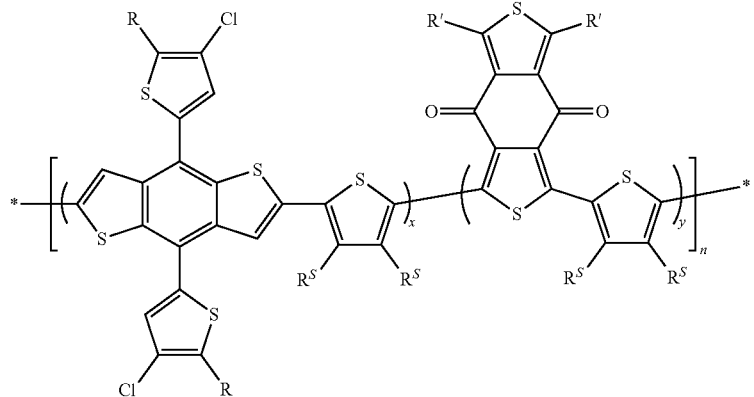

III1

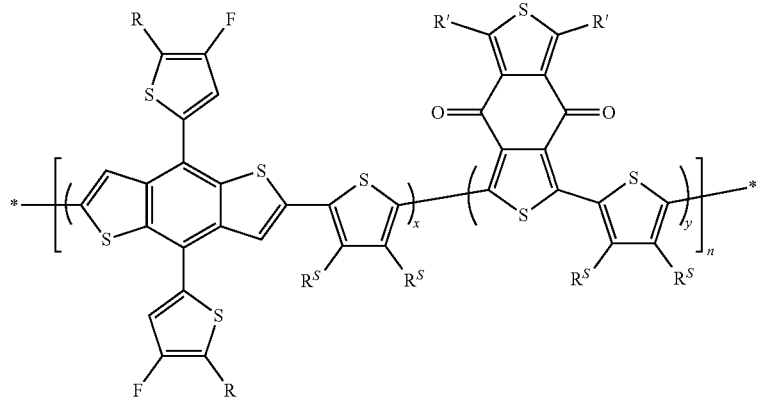

III2

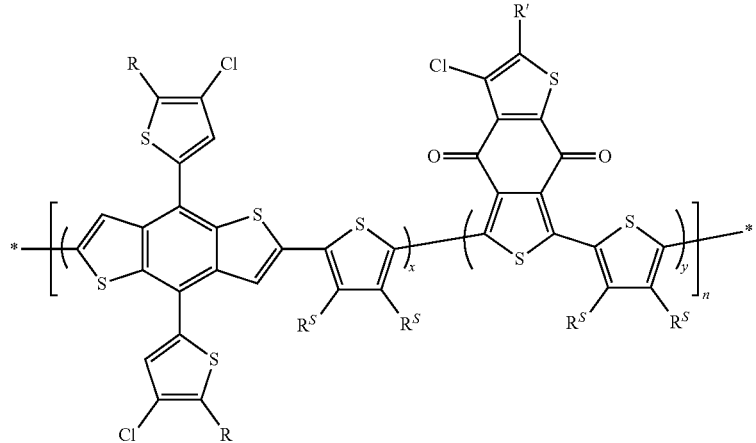

III3

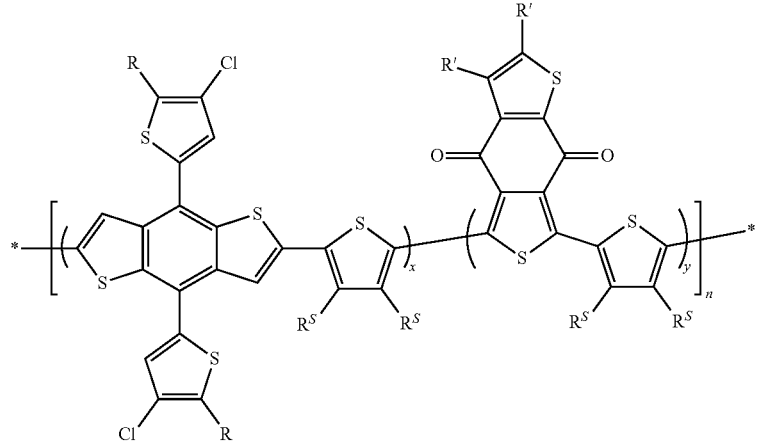
III4
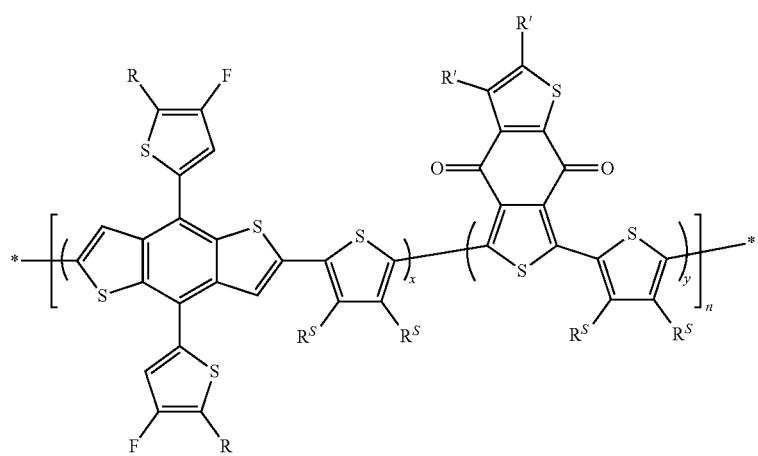
III5
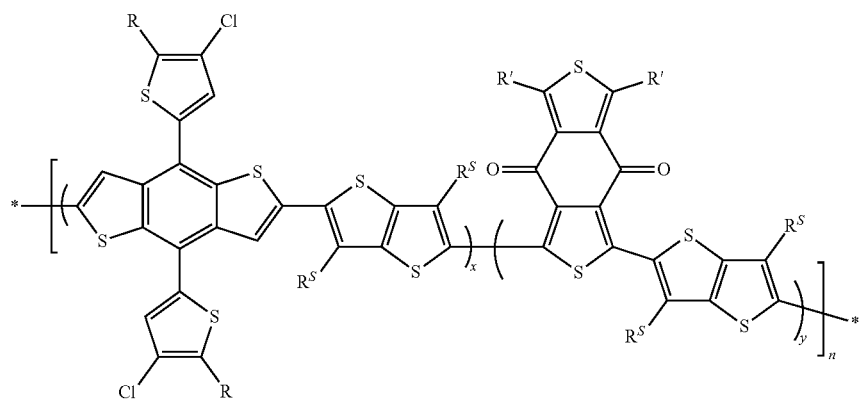
III6

-continued
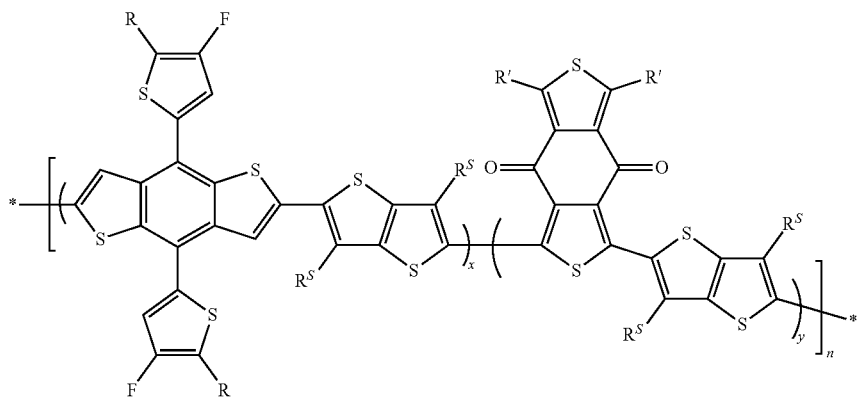
III7
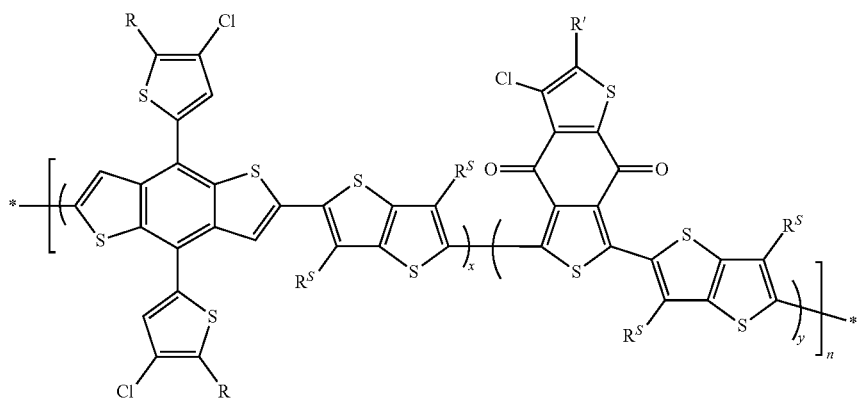
III8
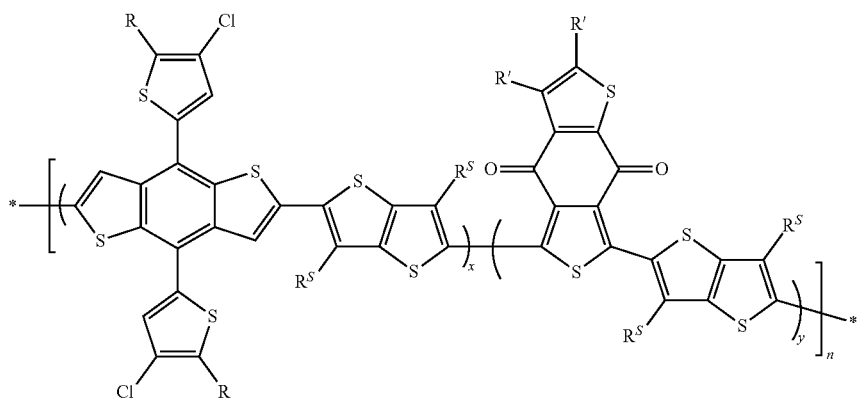
III9
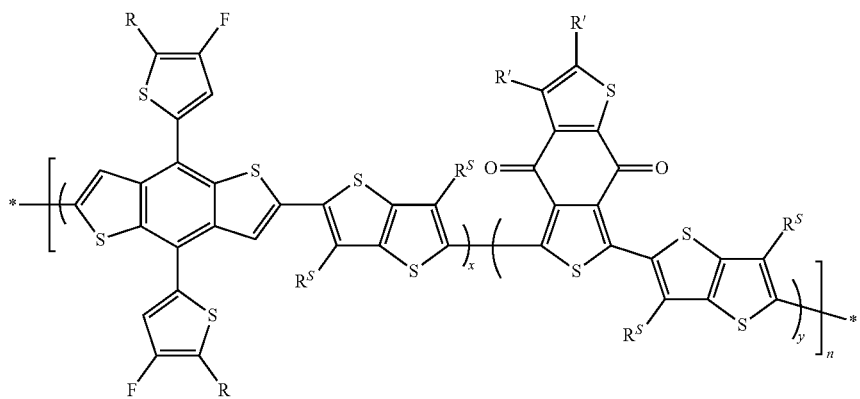
III10

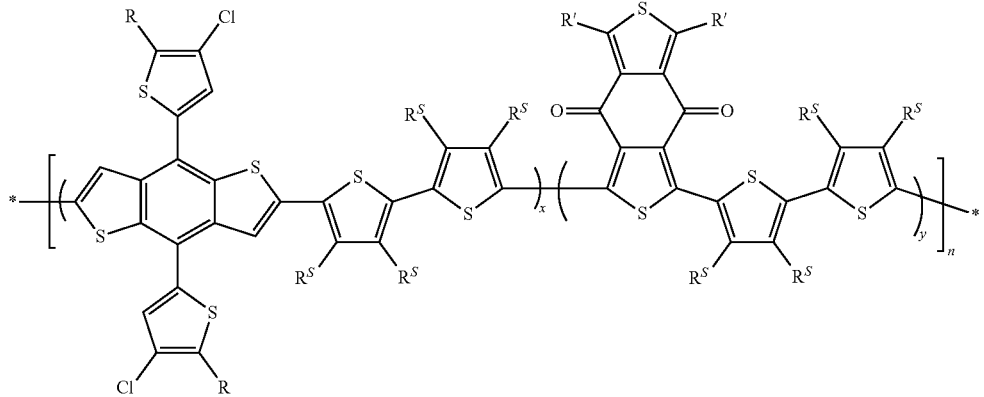
III11
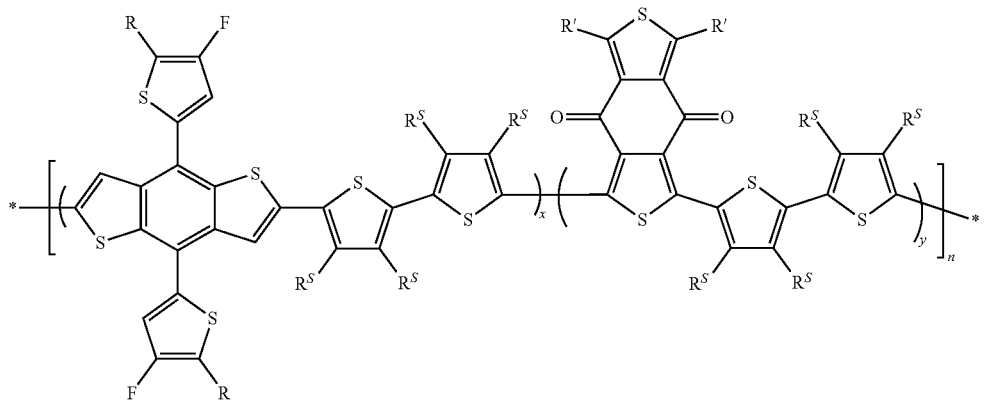
III12
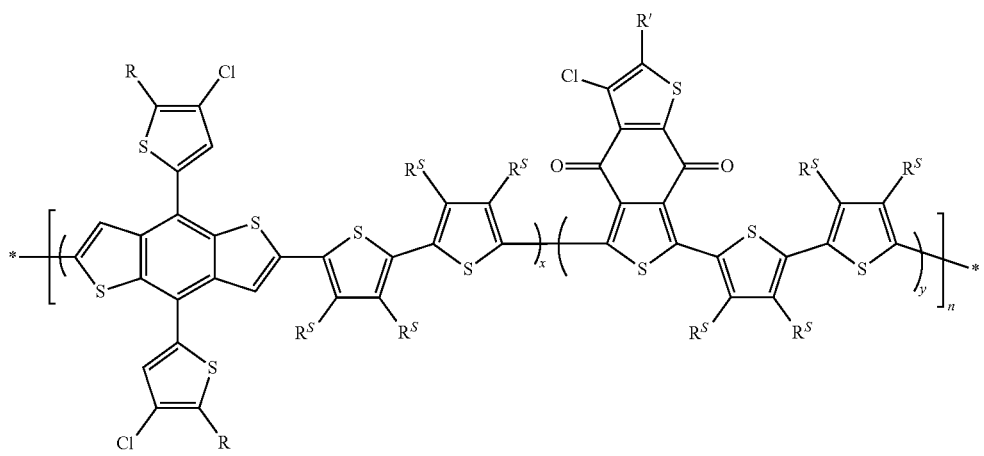
III-13

-continued

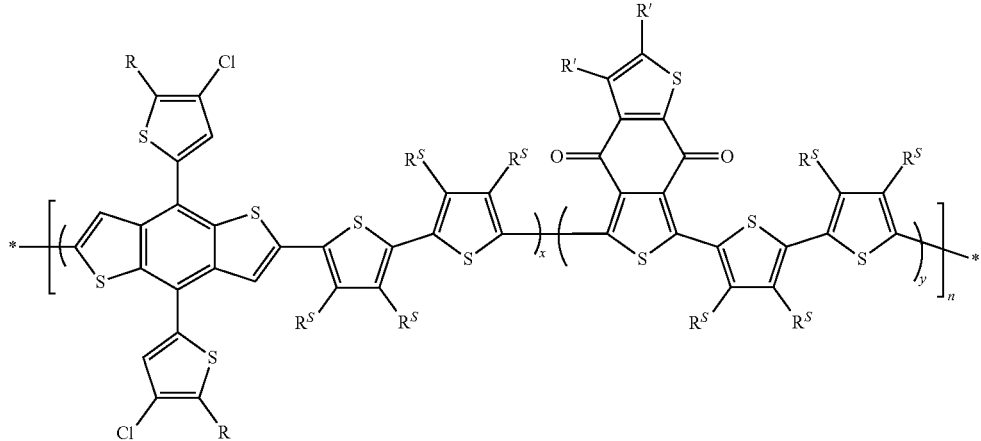

III-14

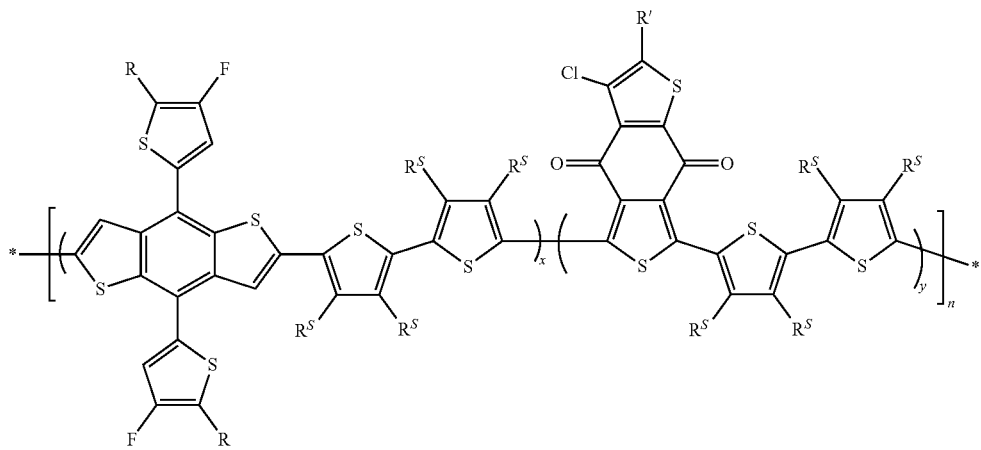

III-15 wherein x, y and n have the meanings of formula III, R has on each occurrence identically or differently one of the meanings given for $R^1$ and $R^2$ above and below, R' has on each occurrence identically or differently one of the meanings given for $R^7$ and $R^8$ above and below, $R^s$ has on each occurrence identically or differently one of the meanings given for $R^5$ and $R^6$ above and below. R is preferably selected from group A) as defined above, $R^s$ is preferably H or selected from group A) above, very preferably H, R' is preferably selected from group A) as defined above.

In another preferred embodiment the conjugated polymer comprises one or more additional units $Ar^3$ that are different from formula I and are each independently selected from arylene or heteroarylene that has from 5 to 20 ring atoms, is mono- or polycyclic, optionally contains fused rings, are is unsubstituted or substituted by one or more identical or different groups L as defined above.

In a preferred embodiment the conjugated polymer comprises one or more additional units $Ar^3$ that have preferably electron donor properties and are selected from the group consisting of the following formulae

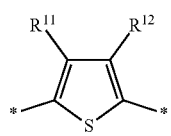

(D1)

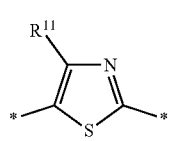

(D2)

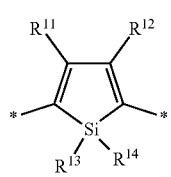

(D3)

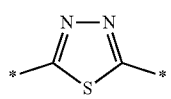
(D4)
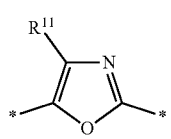
(D5)
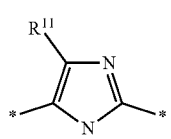
(D6)
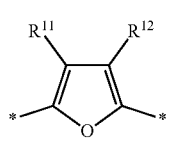
(D7)
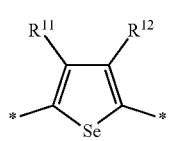
(D8)
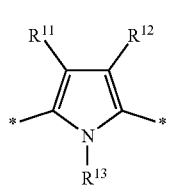
(D9)
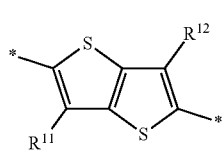
(D10)
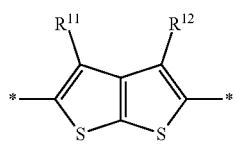
(D11)
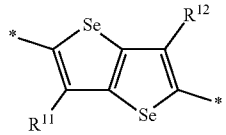
(D12)
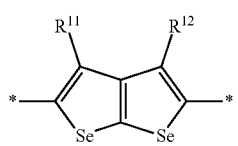
(D13)
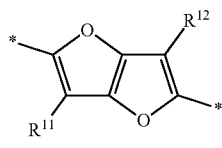
(D14)
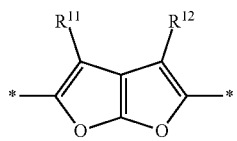
(D15)
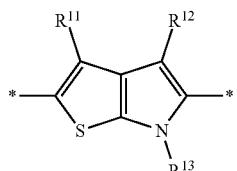
(D16)
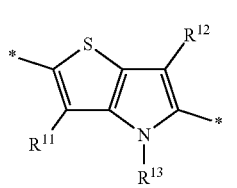
(D17)
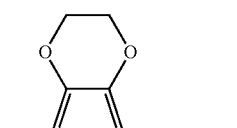
(D18)
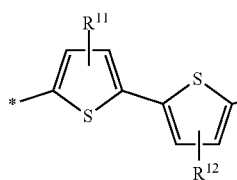
(D19)
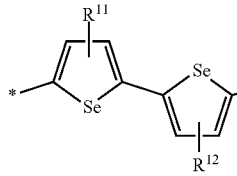
(D20)
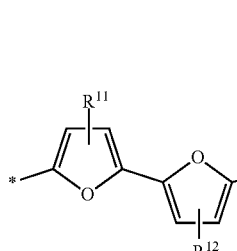
(D21)
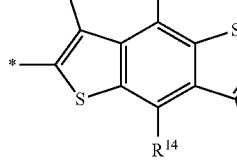
(D22)

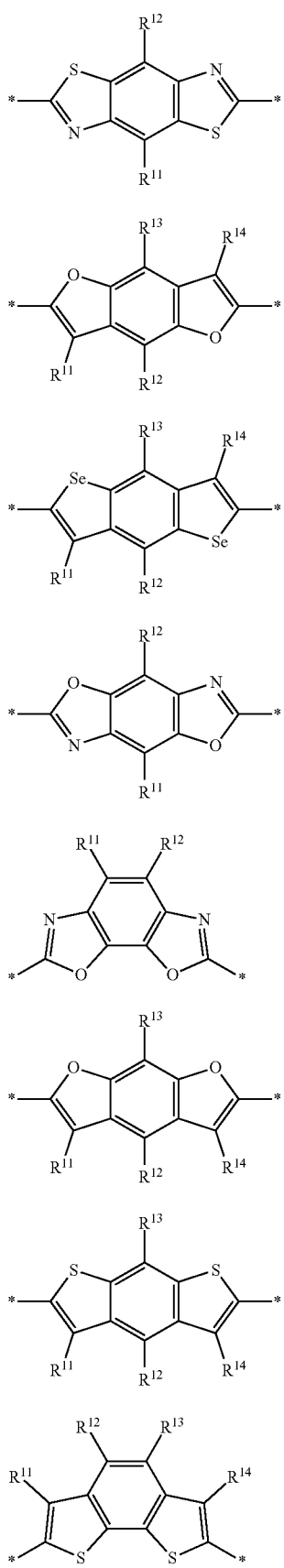
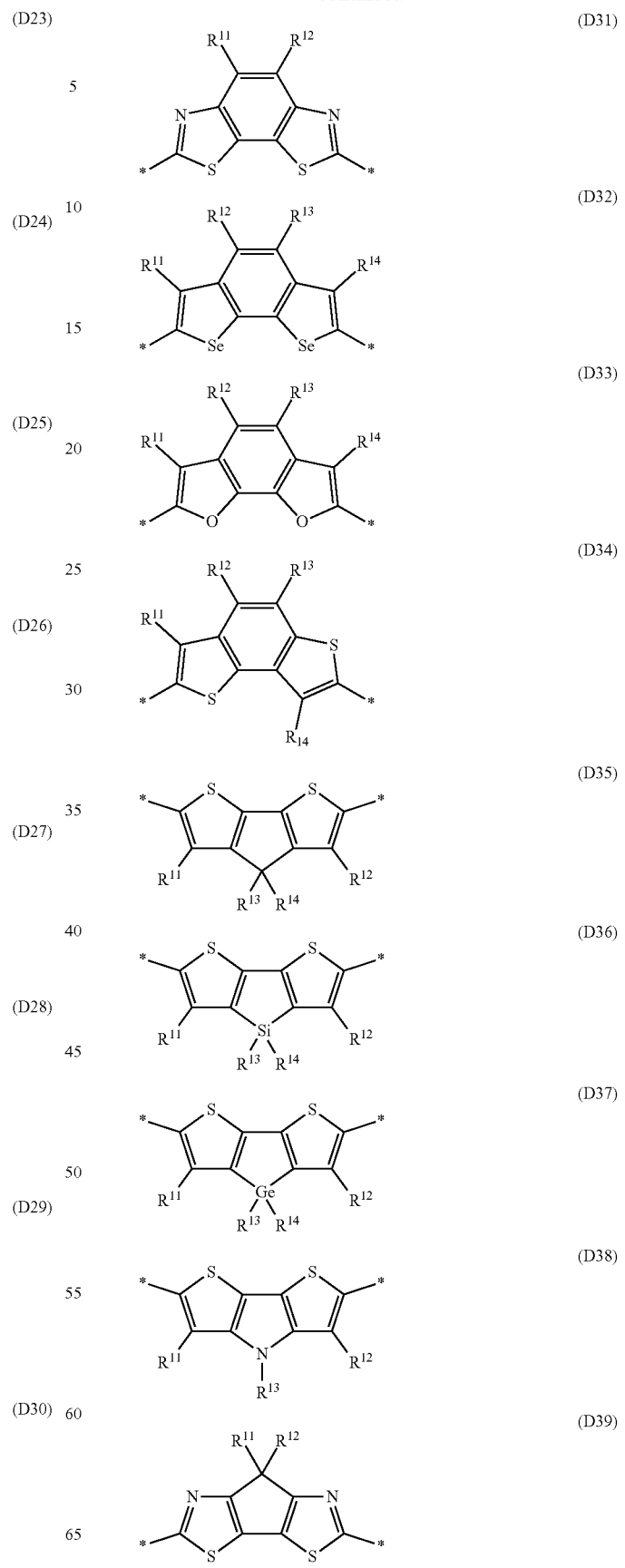

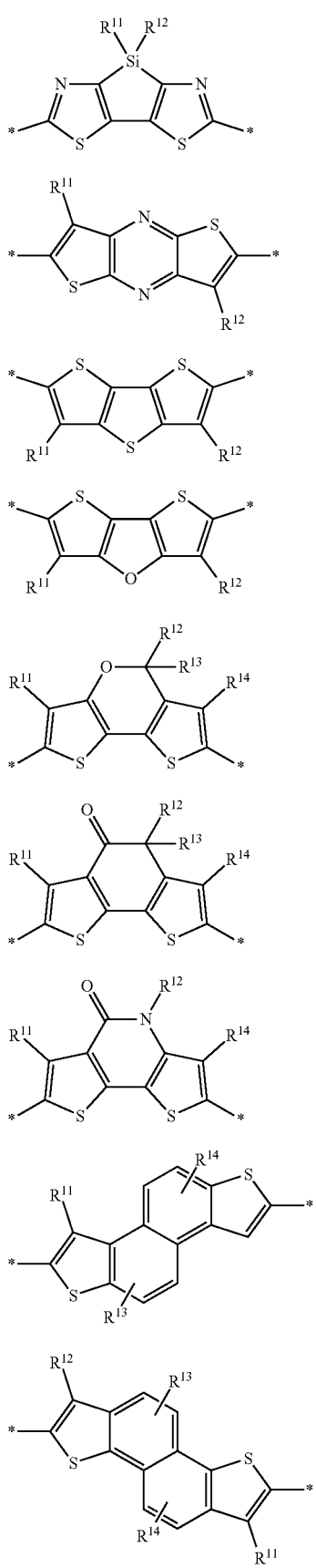
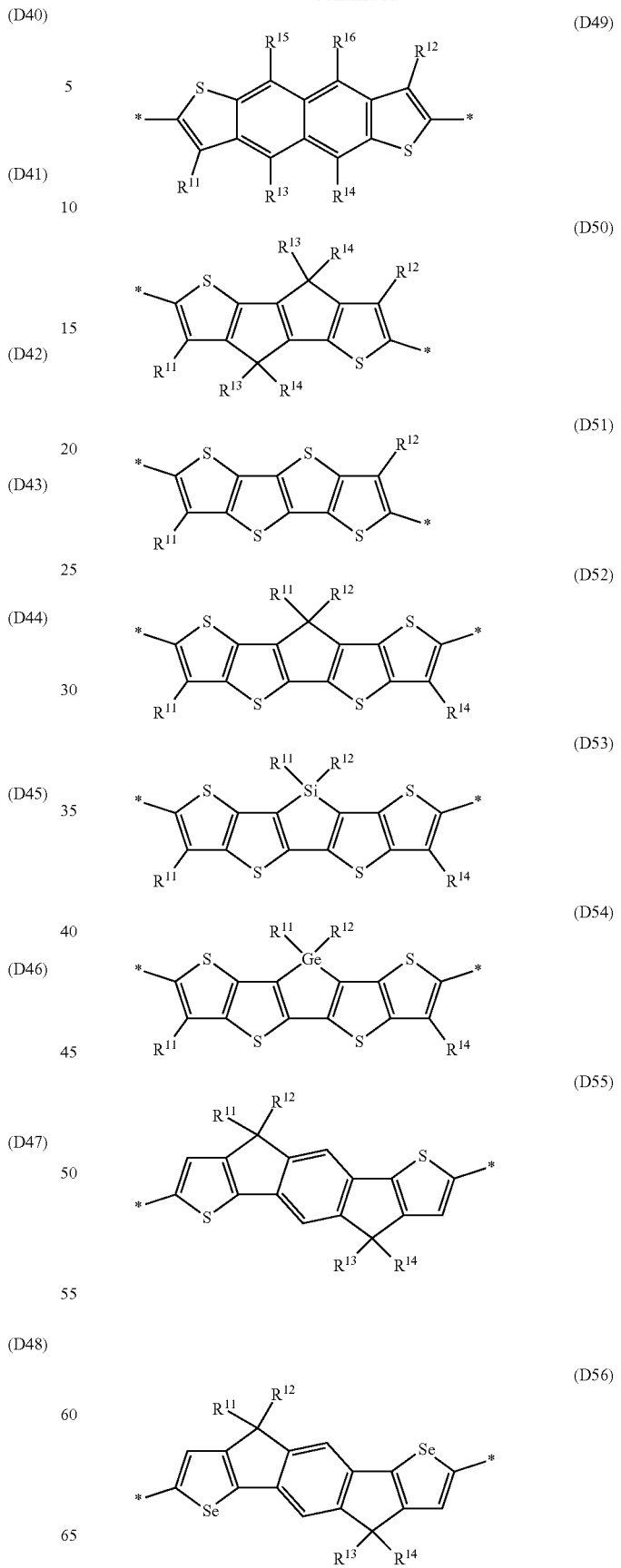

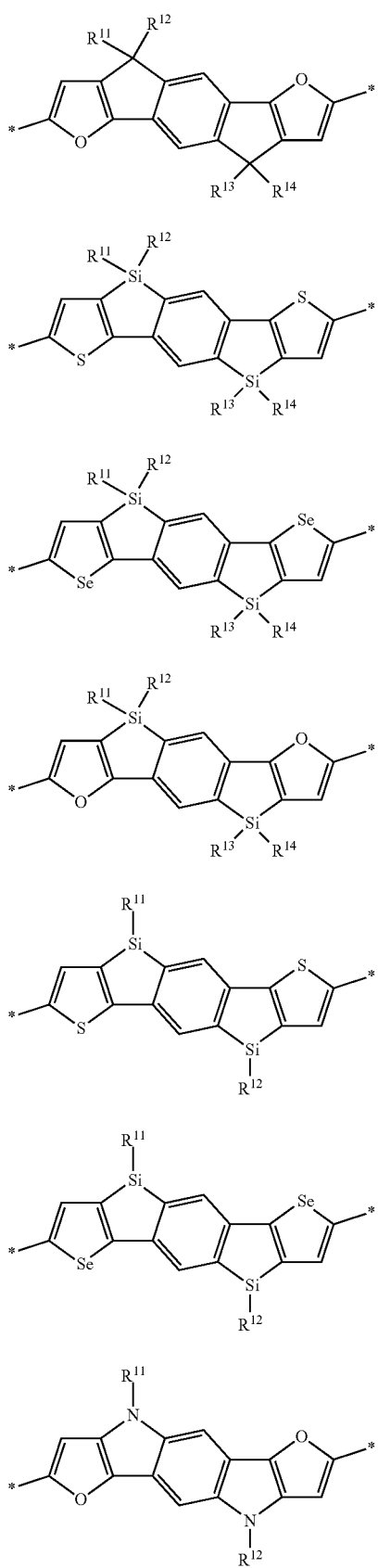

(D71) 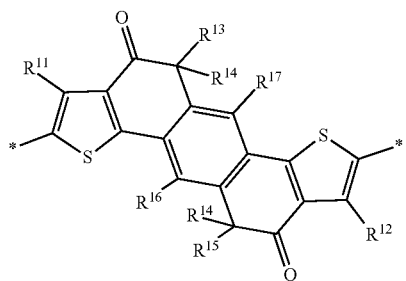
(D72) 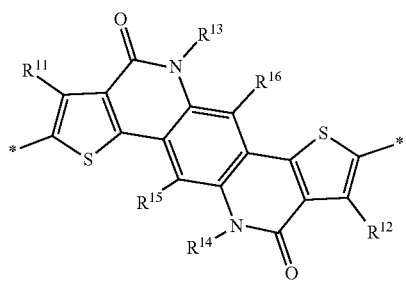
(D73) 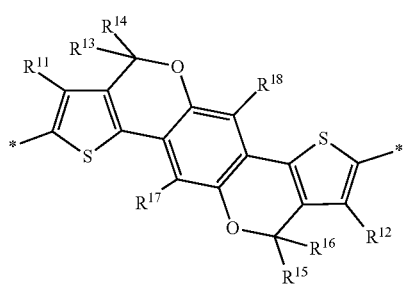
(D74) 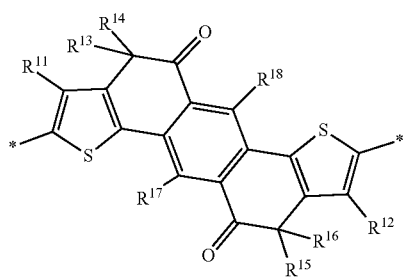
(D75) 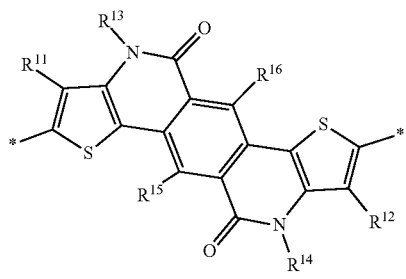
(D76) 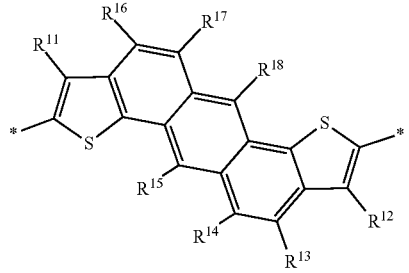
(D77) 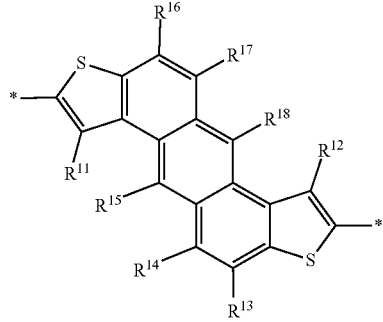
(D78) 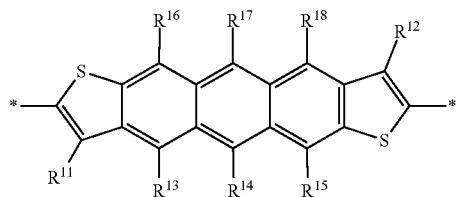
(D79) 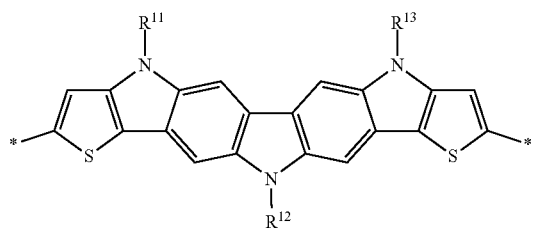
(D80) 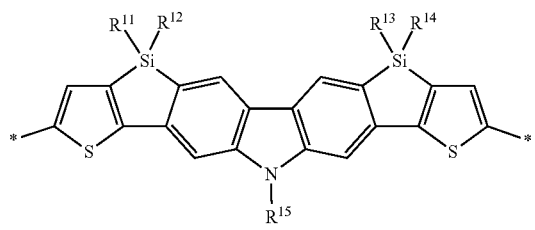
(D81) 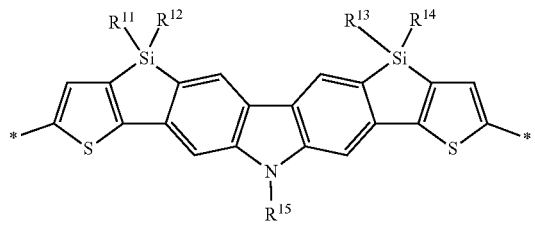

-continued
(D82) 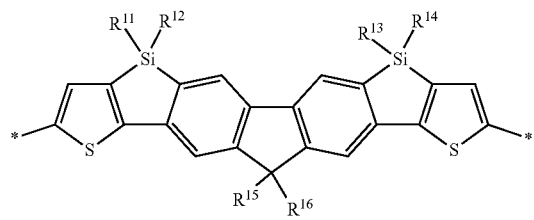
(D83) 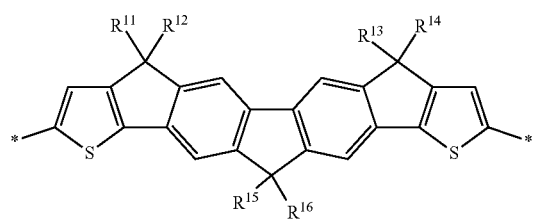
(D84) 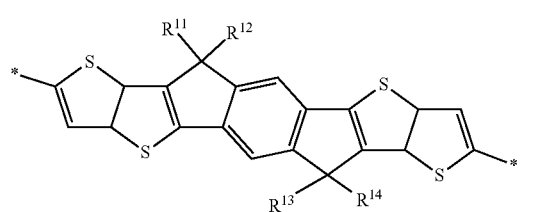
(D85) 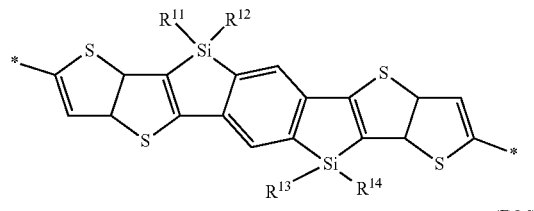
(D86) 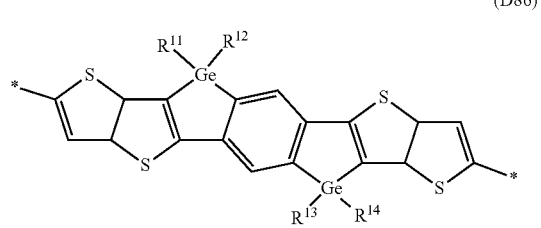
(D87) 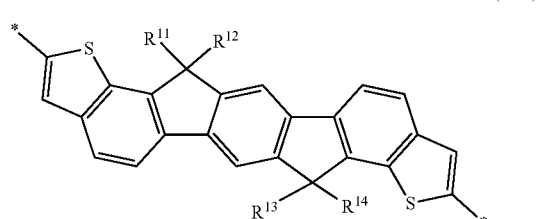
(D88) 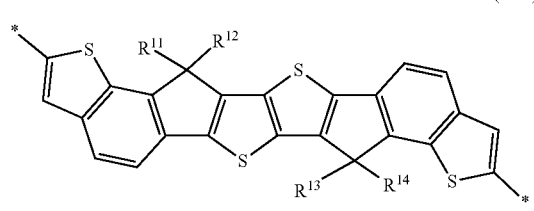
-continued
(D89) 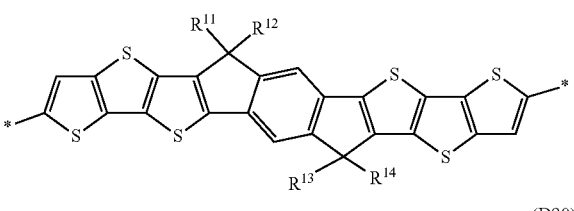
(D90) 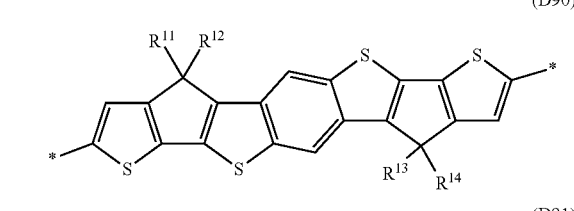
(D91) 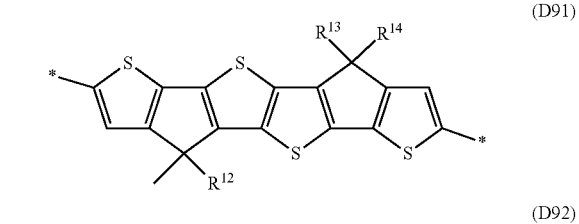
(D92) 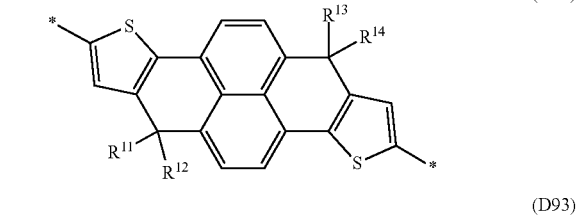
(D93) 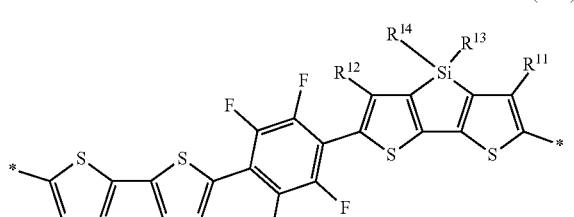
(D94) 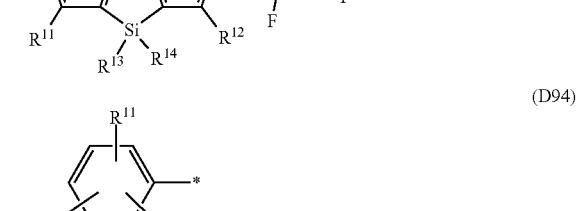
(D95) 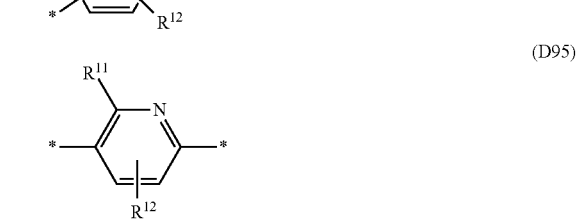
(D96) 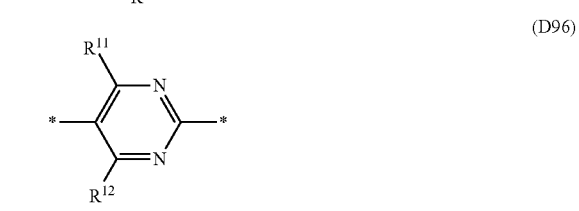

-continued
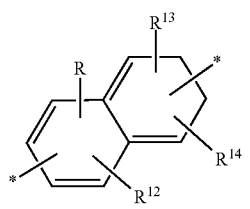
(D97)
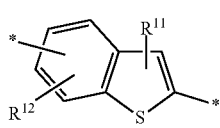
(D98)
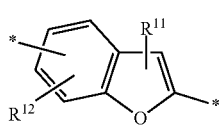
(D99)
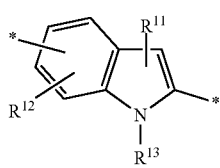
(D100)
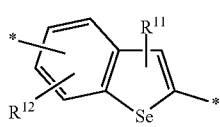
(D101)
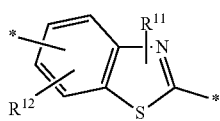
(D102)
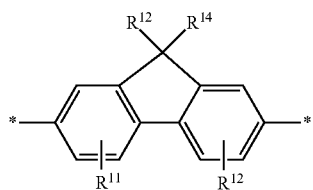
(D103)
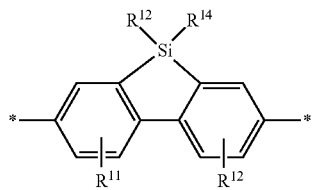
(D104)
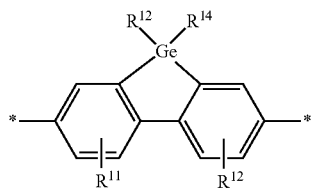
(D105)
-continued
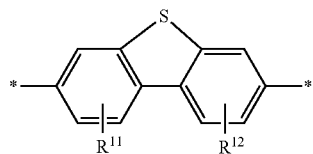
(D106)
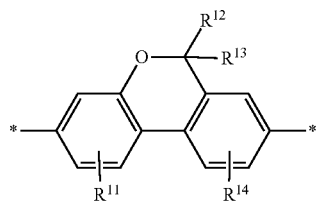
(D107)
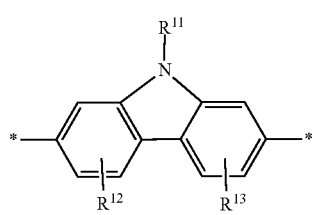
(D108)
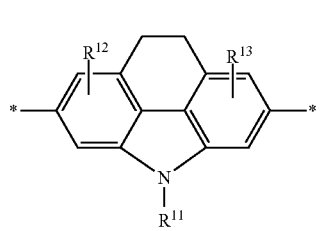
(D109)
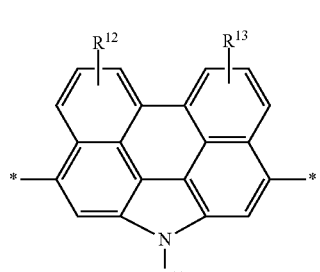
(D110)
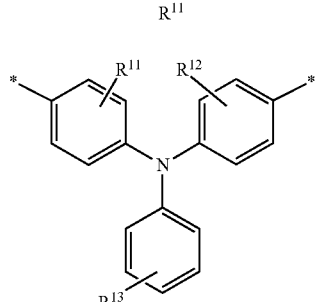
(D111)
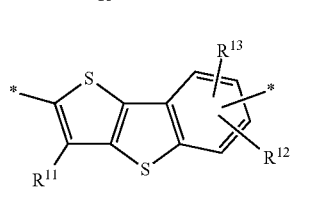
(D112)

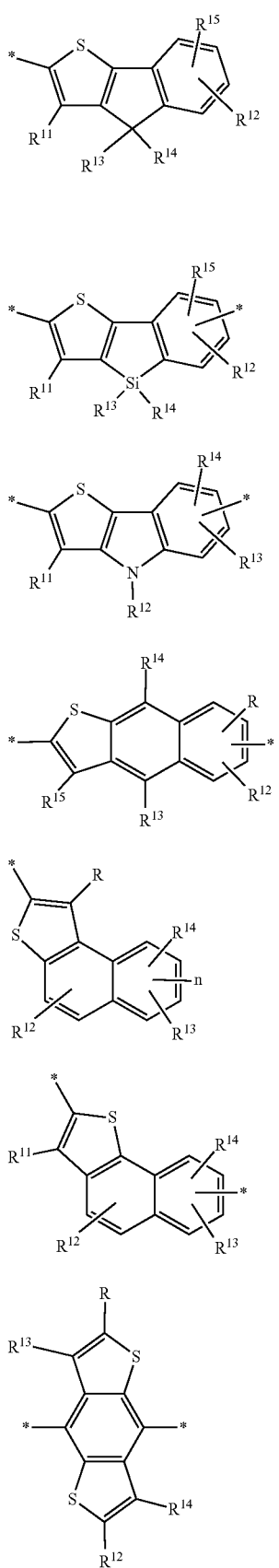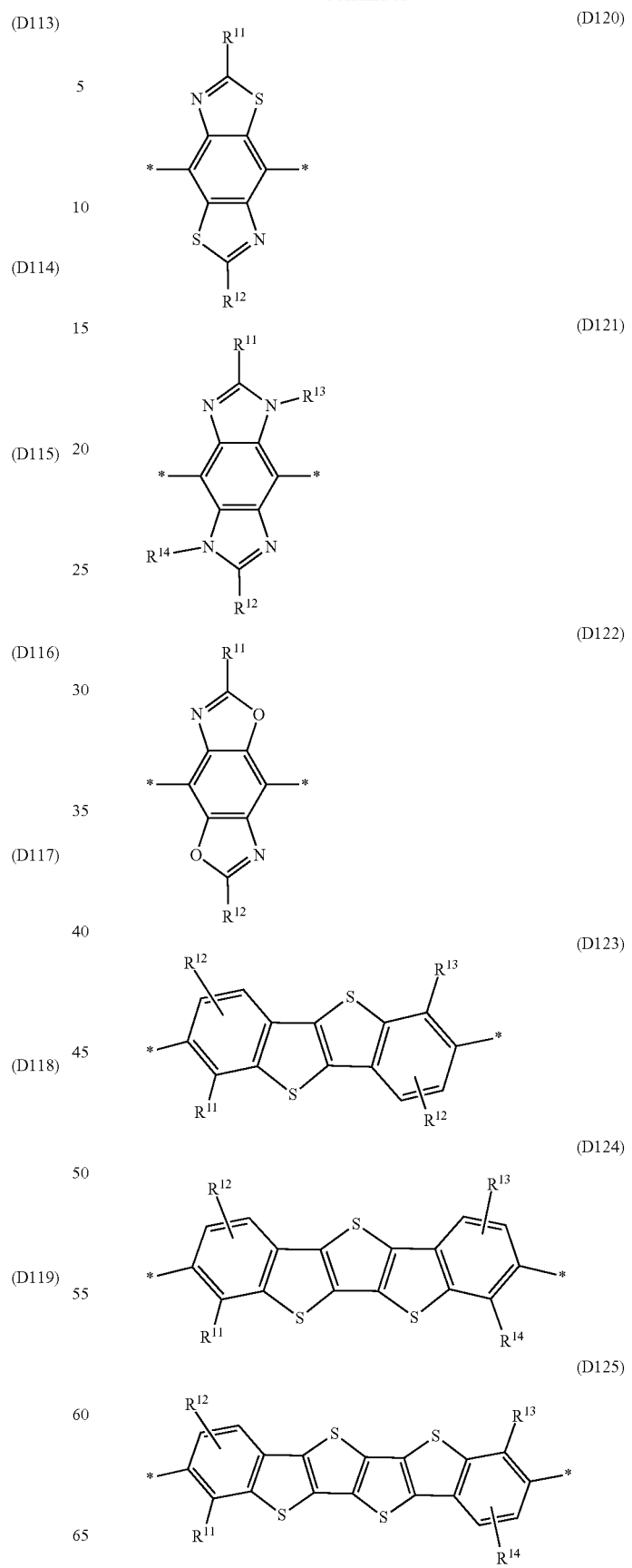

(D126) 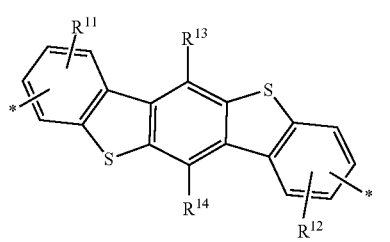
(D127) 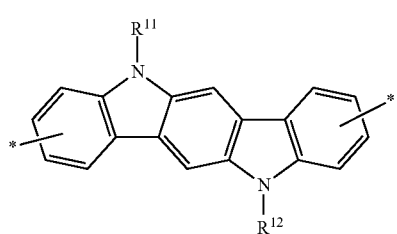
(D128) 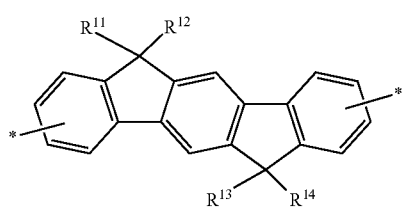
(D129) 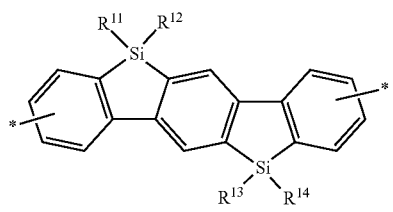
(D130) 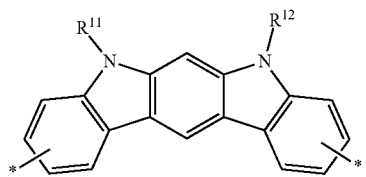
(D131) 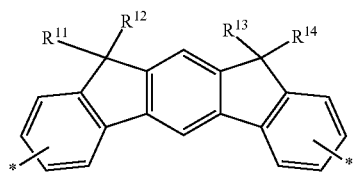
(D132) 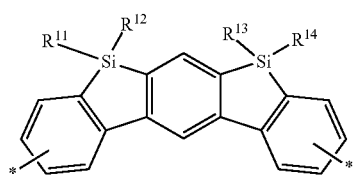
(D133) 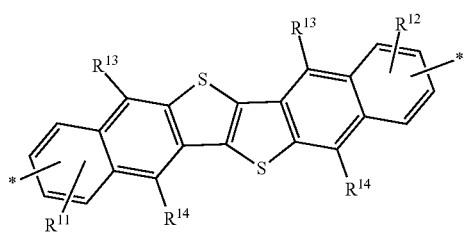
(D134) 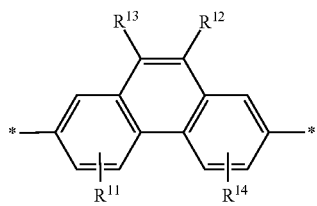
(D135) 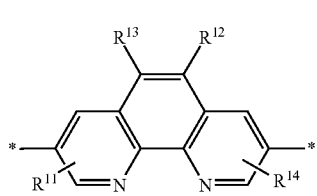
(D136) 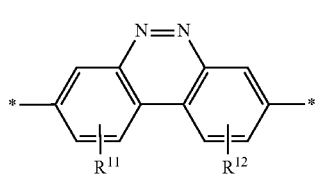
(D137) 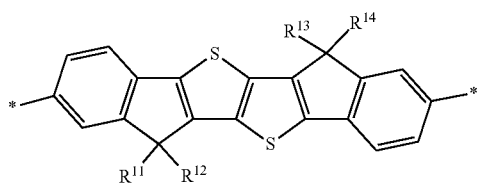
(D138) 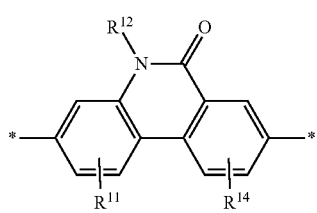
(D139) 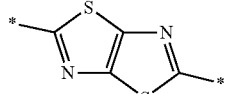
(D140) 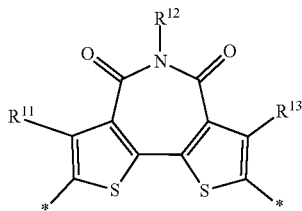

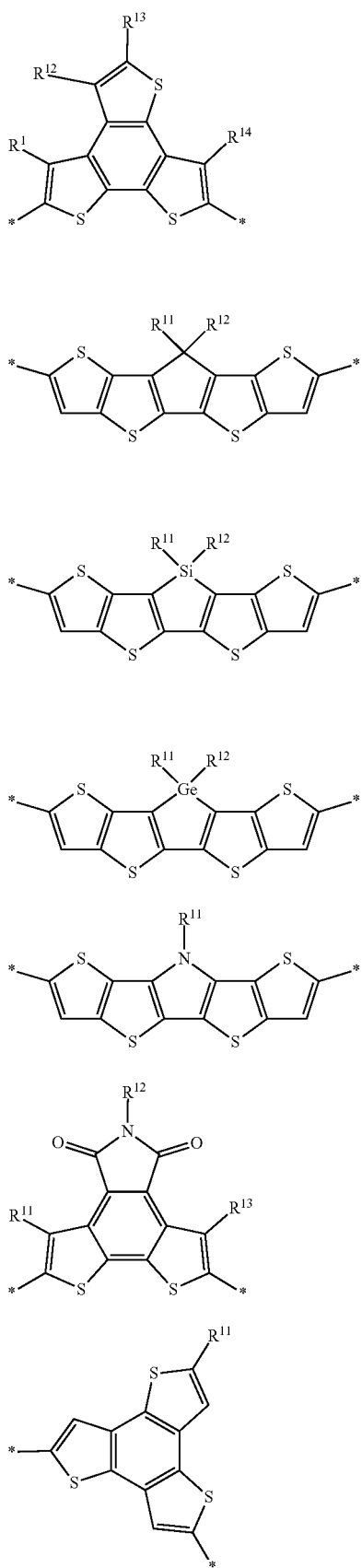
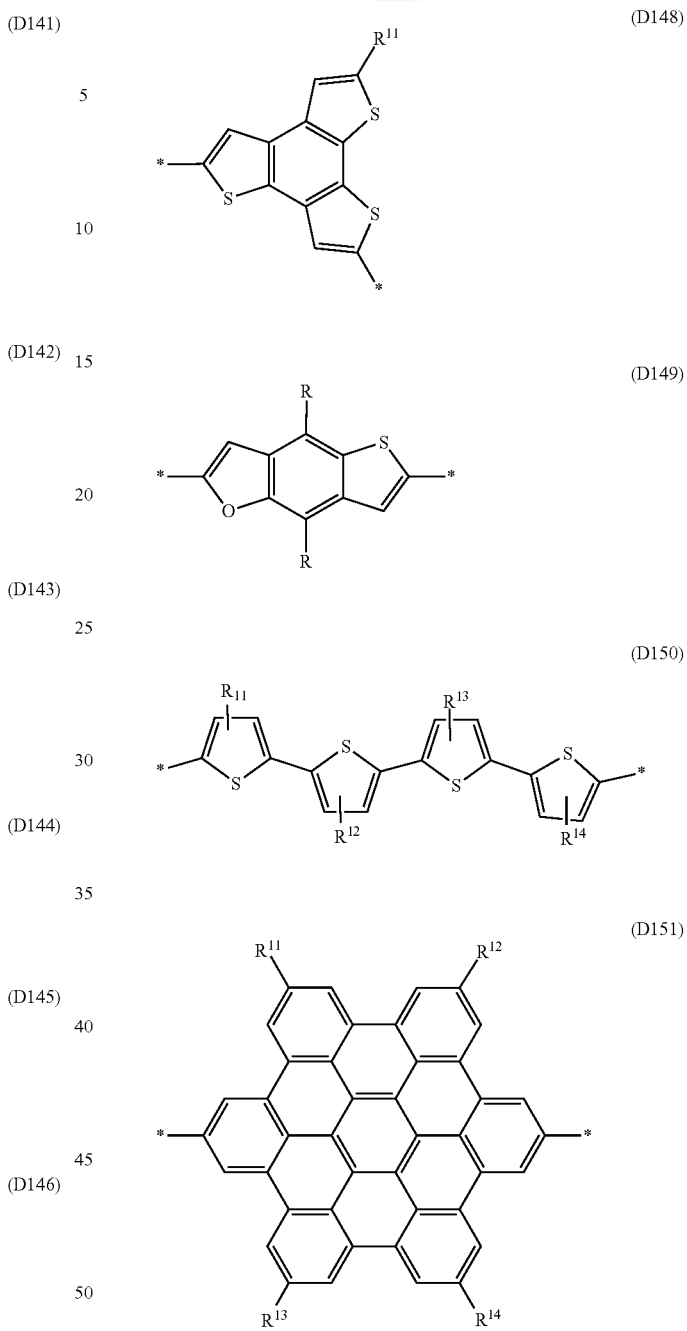

wherein $R^{11}$, $R^{12}$, $R^{13}$, $R^{14}$, $R^{15}$, $R^{16}$, $R^{17}$ and $R^{18}$ independently of each other have one of the meanings of $R^1$ as given in formula I or one of its preferred meanings as given above and below.

Preferred units $Ar^3$ are selected from formulae D1, D7, D10, D11, D19, D22, D29, D30, D35, D36, D37, D44, D55, D84, D87, D88, D89, D93, D94, D106, D111, D139, D140, D141, D146 or D150 wherein preferably at least one of $R^{11}$, $R^{12}$, $R^{13}$ and $R^{14}$ is different from H.

In another preferred embodiment the conjugated polymer comprises one or more additional units $Ar^3$ that have preferably electron acceptor properties and are selected from the group consisting of the following formulae (A1) 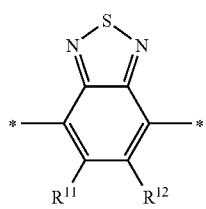
(A2) 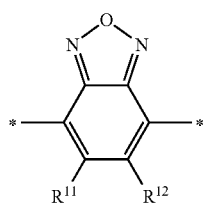
(A3) 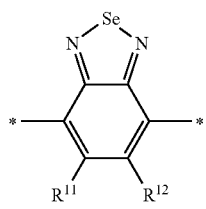
(A4) 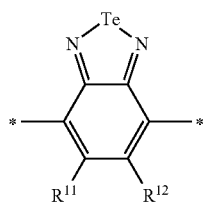
(A5) 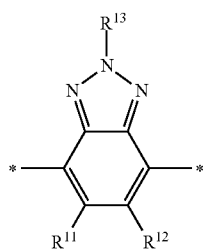
(A6) 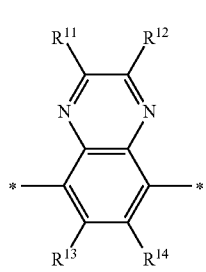
(A7) 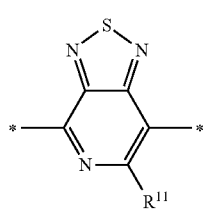
-continued
(A8) 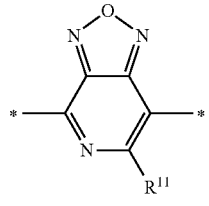
(A9) 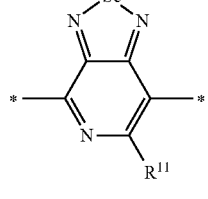
(A10) 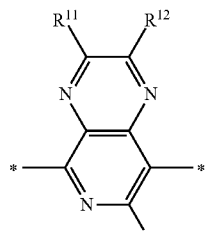
(A11) 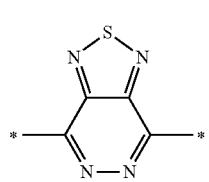
(A12) 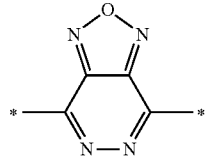
(A13) 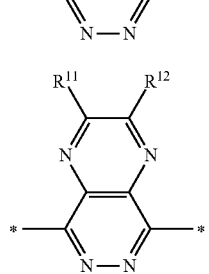
(A14) 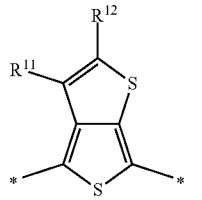
(A15)

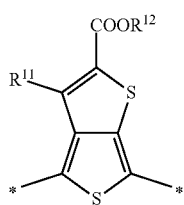
(A16)
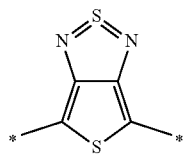
(A17)
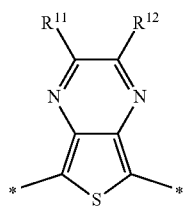
(A18)
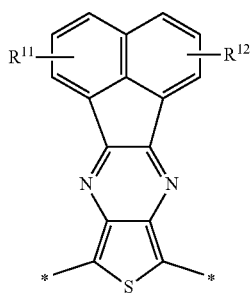
(A19)
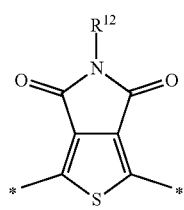
(A20)
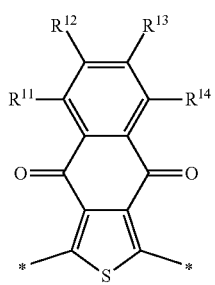
(A21)
(A22)
(A23)
(A24)
(A25)
(A26)

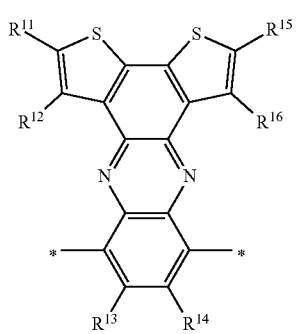
(A27)
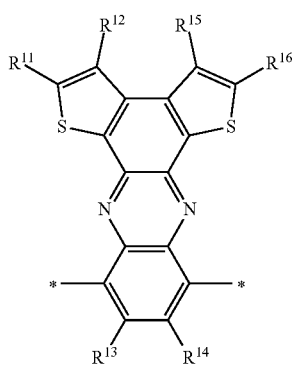
(A28)
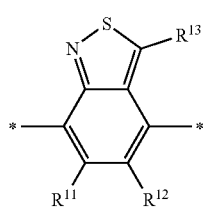
(A29)
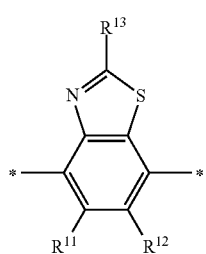
(A30)
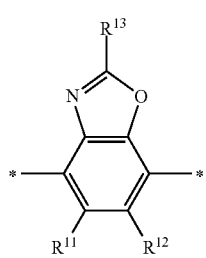
(A31)
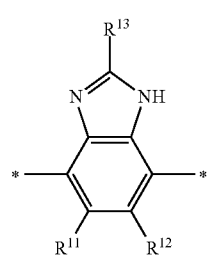
(A32)
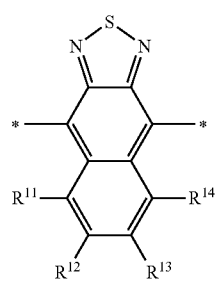
(A33)
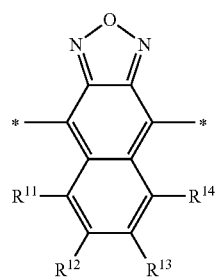
(A34)
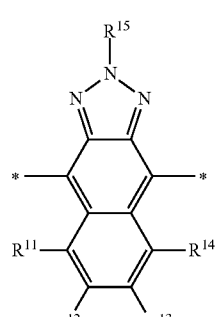
(A35)
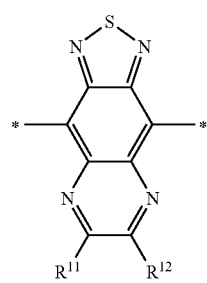
(A36)

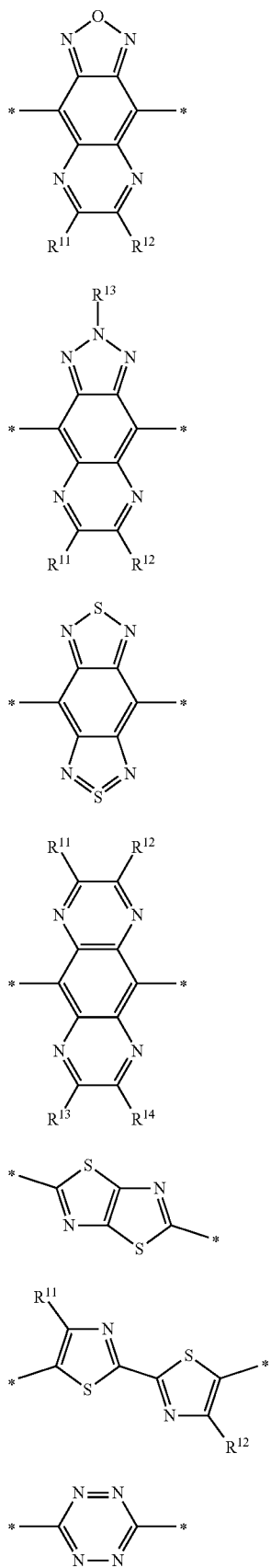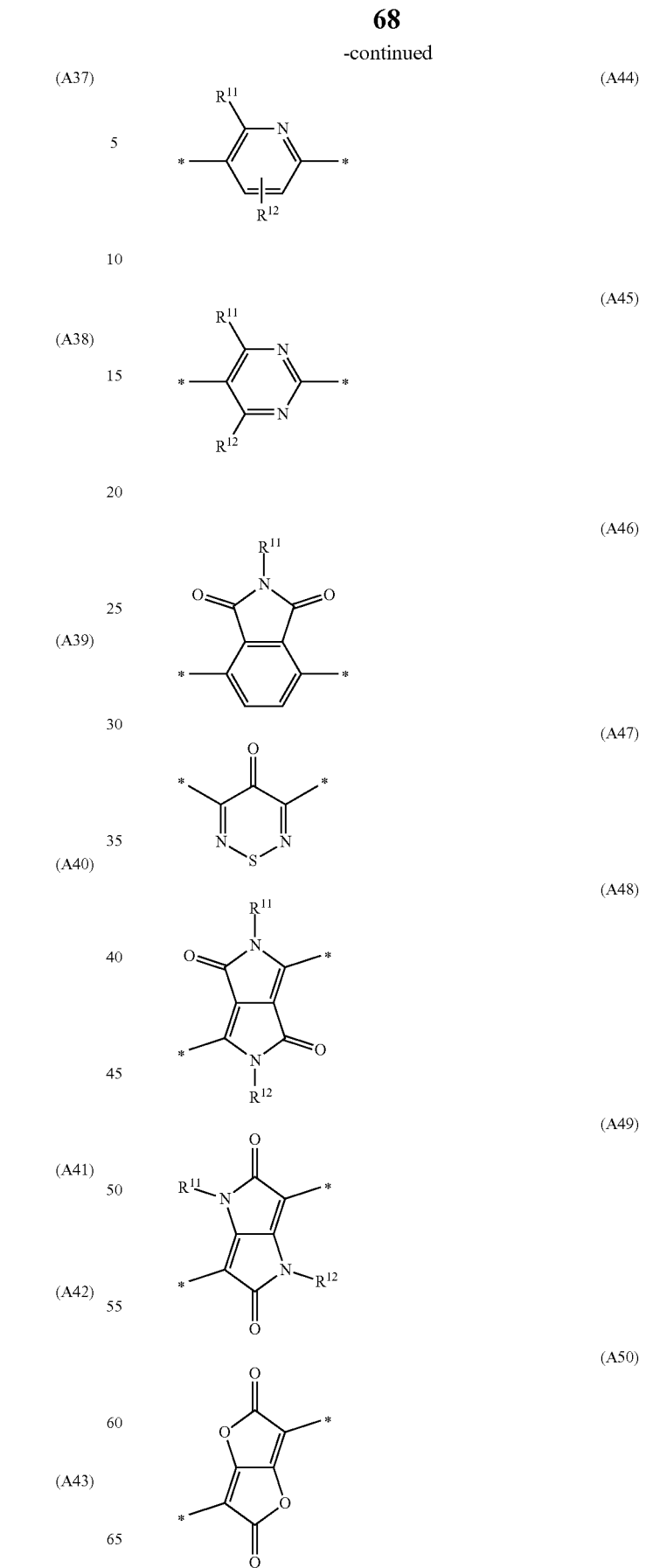

-continued
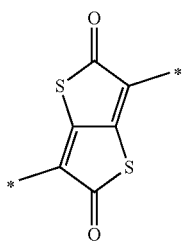
(A51)
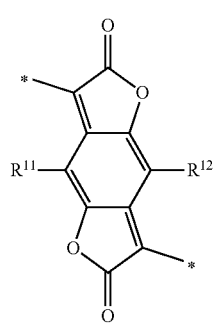
(A52)
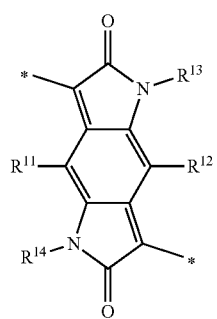
(A53)
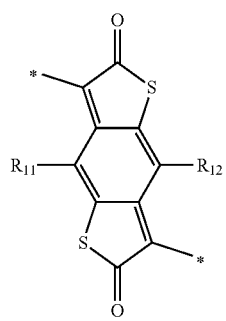
(A54)
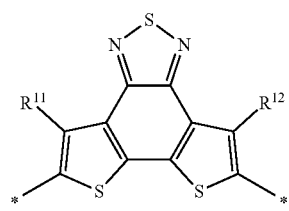
(A55)
-continued
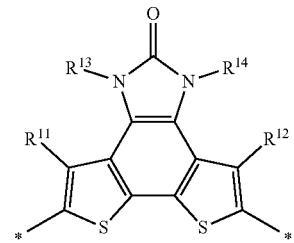
(A56)
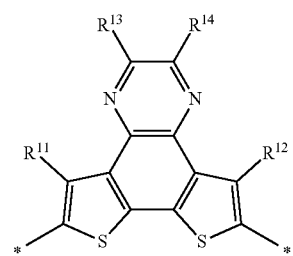
(A57)
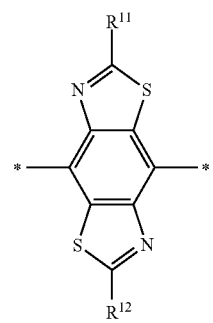
(A58)
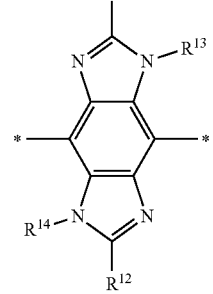
(A59)
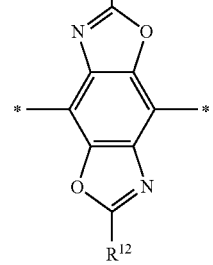
(A60)

-continued
(A61)
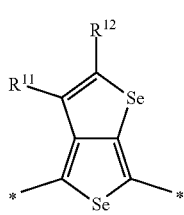
(A62)
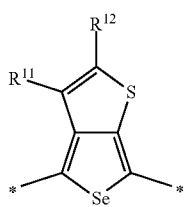
(A63)
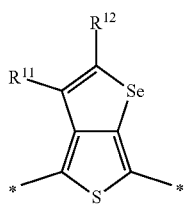
(A64)
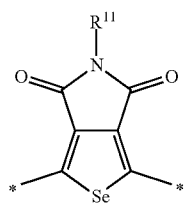
(A65)
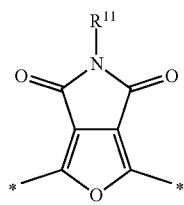
(A66)
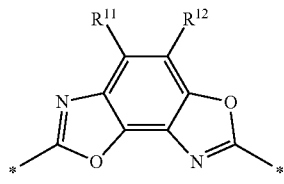
(A67)
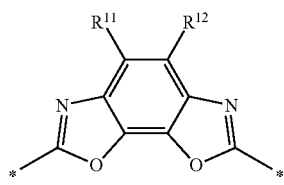
(A68)
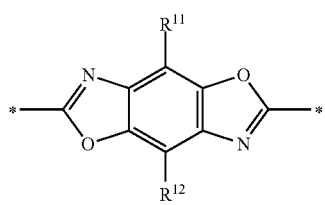
-continued
(A69)
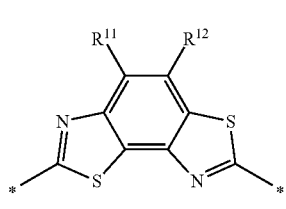
(A70)
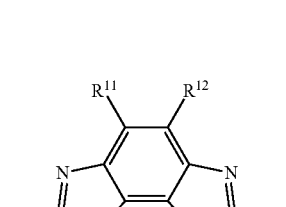
(A71)
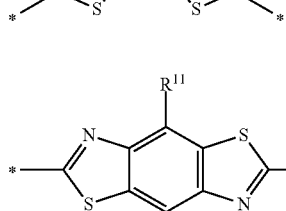
(A72)
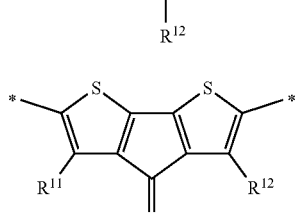
(A73)
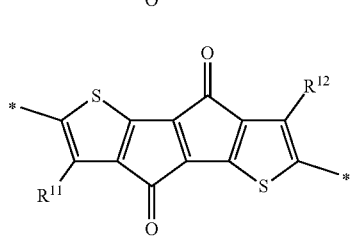
(A74)
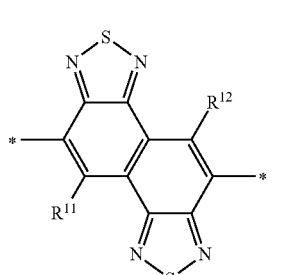
(A75)
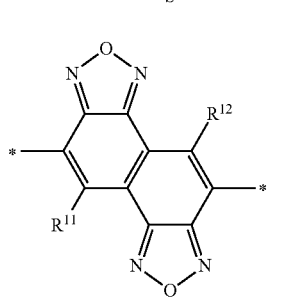

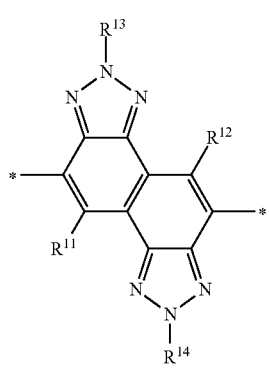
(A76)
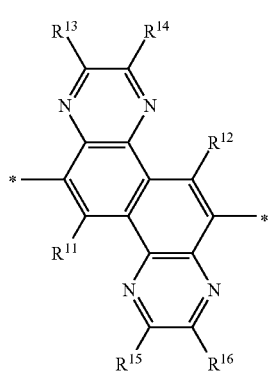
(A77)
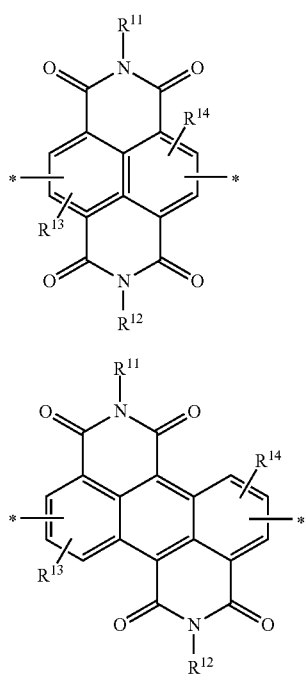
(A78)
(A79)
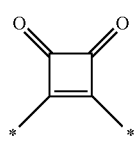
(A80)
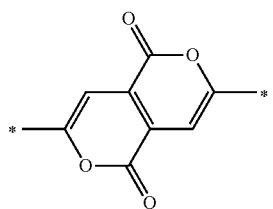
(A81)
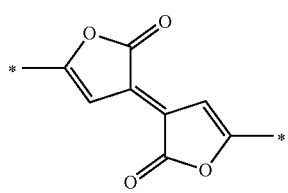
(A82)
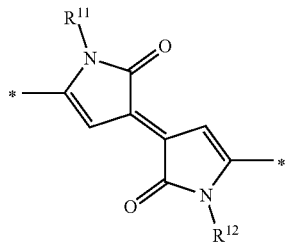
(A83)
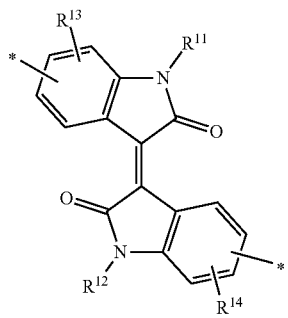
(A84)
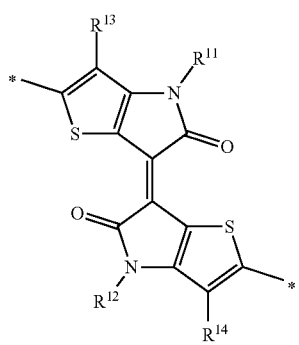
(A85)
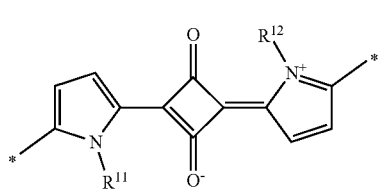
(A86)

-continued
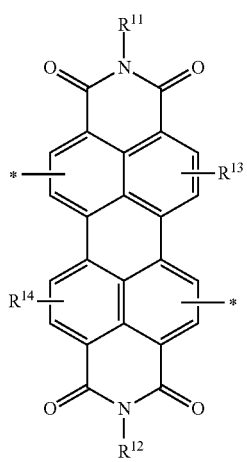
(A87)
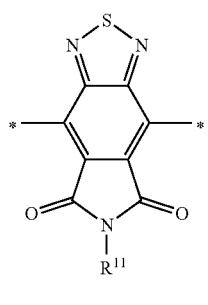
(A88)
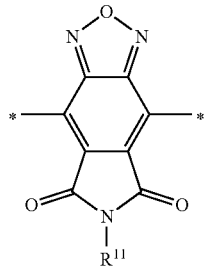
(A89)
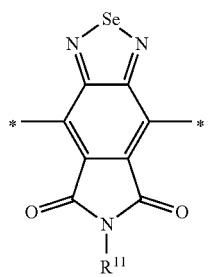
(A90)
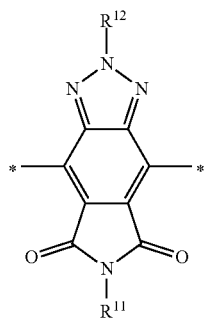
(A91)
-continued
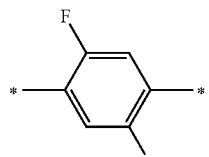
(A92)
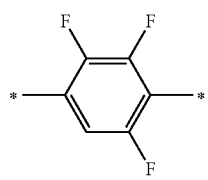
(A93)
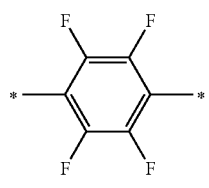
(A94)
(A95)
(A96)
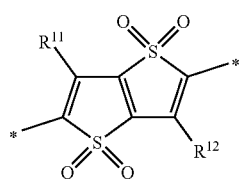
(A97)
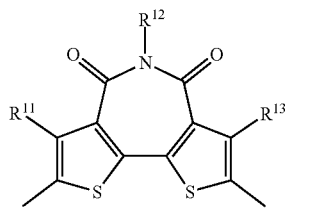
(A98)
(A99)

-continued

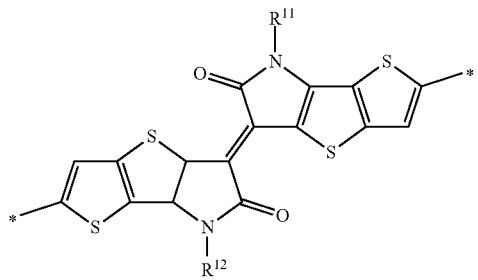
(A100)

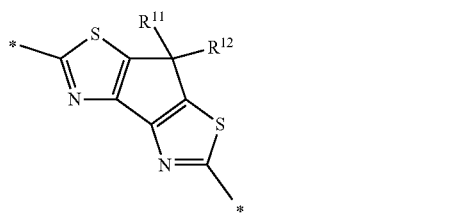
(A101)

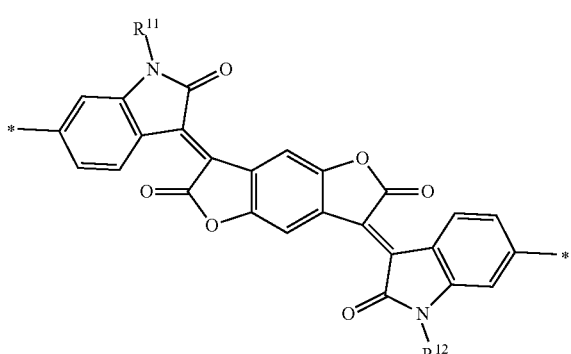
(A102)

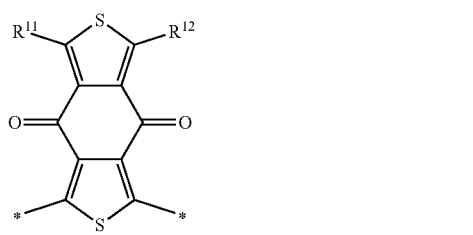
(A104)

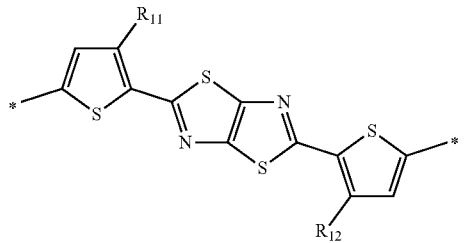
(A103)

wherein $R^{11}$, $R^{12}$, $R^{13}$, $R^{14}$, $R^{15}$ and $R^{16}$ independently of each other have one of the meanings of $R^3$ as given in formula I or one of its preferred meanings as given above and below.

Preferred units $Ar^3$ are selected from formulae A1, A6, A7, A15, A16, A20, A36, A74, A84, A88, A92, A94, A98 or A103 wherein preferably at least one of $R^{11}$, $R^{12}$, $R^{13}$ and $R^{14}$ is different from H.

In another preferred embodiment, the conjugated polymer further comprises one or more units selected from —$CY^1$=$CY^2$— and —C≡C—, wherein $Y^1$ and $Y^2$ are independently of each other H, F, Cl or CN.

Further preferably the conjugated polymer is selected of formula IV $$R^{21}\text{-chain-}R^{22} \qquad \text{IV}$$

wherein "chain" denotes a polymer chain selected of formulae III and III1-III10, and $R^{21}$ and $R^{22}$ have independently of each other one of the meanings of L as defined above, or denote, independently of each other, H, F, Br, Cl, I, —$CH_2Cl$, —CHO, —$CR^a$=$CR^b_2$, —$SiR^aR^bR^c$, —$SiR^aX^aX^b$, —$SiR^aR^bX^a$, —$SnR^aR^bR^c$, —$BR^aR^b$, —$B(OR^a)(OR^b)$, —$B(OH)_2$, —O—$SO_2$—$R^a$, —C≡CH, —C≡C—$SiR^a_3$, —$ZnX^a$ or an endcap group, $X^a$ and $X^b$ denote halogen, $R^a$, $R^b$ and $R^c$ have independently of each other one of the meanings of $R^0$ given in formula I, and preferably denote alkyl with 1 to 12 C atoms, and two of $R^a$, $R^b$ and $R^c$ may also form a cyclosilyl, cyclostannyl, cycloborane or cycloboronate group with 2 to 20 C atoms together with the respective hetero atom to which they are attached.

Preferred endcap groups $R^{21}$ and $R^{22}$ are H, $C_{1-20}$ alkyl, or optionally substituted $C_{6-12}$ aryl or $C_{2-10}$ heteroaryl, very preferably H or phenyl.

In the conjugated polymers of the present invention, including but not limited to those of formula III and III1-III10, the indices x and y denote the mole fraction of the corresponding repeating units, such as A or B, and n denotes the degree of polymerisation or total number of repeating units.

In the conjugated polymers of the present invention, including but not limited to those of formula III and III1-III10, preferably x and y are independently of each other from 0.1 to 0.9, very preferably from 0.3 to 0.7, more preferably from 0.4 to 0.6, most preferably 0.5.

In the conjugated polymers of the present invention, the total number of repeating units n is preferably from 2 to 10,000, very preferably from 5 to 10,000. The total number of repeating units n is preferably 5, very preferably ≥10, most preferably 50, and preferably ≤500, very preferably ≤1,000, most preferably ≤2,000, including any combination of the aforementioned lower and upper limits of n.

The conjugated polymers of the present invention can be prepared from the corresponding monomers of formula V1, V2 and V3:

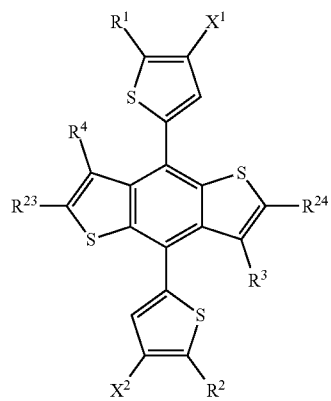
V1

V2

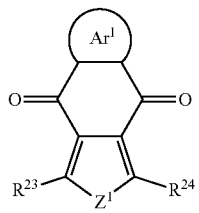

V3

R²³—Ar²—R²⁴ wherein Ar¹, Ar², X¹, Z¹ and R¹⁻⁴ have the meanings of formula I and II, or one of the preferred meanings as described above and below, and R²³ and R²⁴ are independently of each other selected from the group consisting of H, an activated C—H bond, Cl, Br, I, O-tosylate, O-triflate, O-mesylate, O-nonaflate, —SiMe₂F, —SiMeF₂, —O—SO₂Z$^a$, —B(OZ$^b$)₂, —CZ$^c$=C(Z$^c$)₂, —C≡CH, —C≡CSi(Z$^a$)₃, —ZnX⁰ and —Sn(Z$^d$)₃, wherein Me is methyl, X⁰ is halogen, preferably Cl, Br or I, Z$^{a-d}$ are selected from the group consisting of alkyl and aryl, preferably C$_{1-10}$ alkyl and C$_{6-12}$ aryl, each being optionally substituted, and two groups Z$^b$ may also form a cycloboronate group having 2 to 20 C atoms together with the B- and O-atoms, and wherein at least one of R²³ and R²⁴ is different from H, and preferably both of R²³ and R²⁴ are different from H (wherein H does not include an activated C—H bond).

Preferred monomers of formula V1 and V2 are selected from the following subformulae V1a

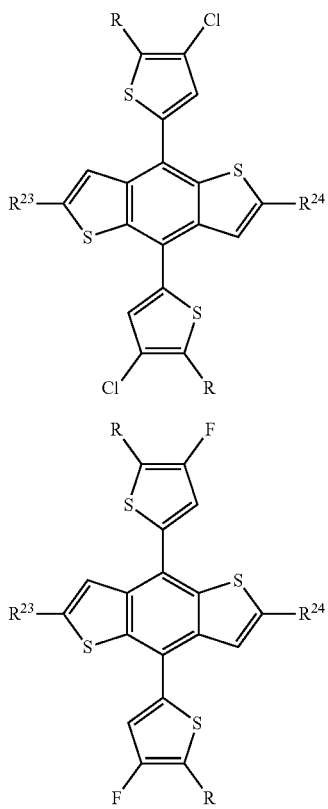

V1b

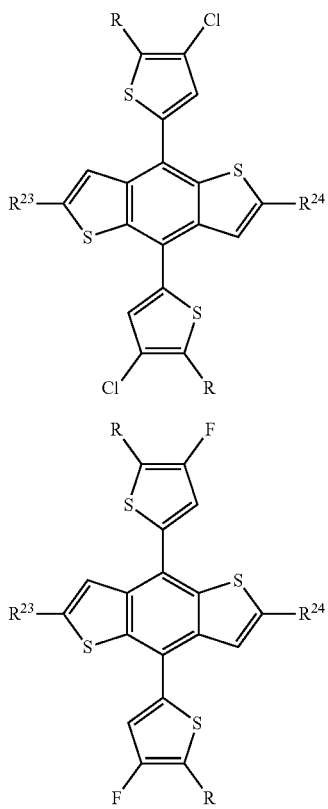

V2a

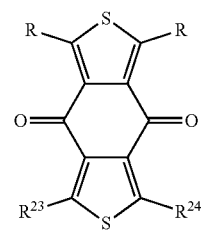

V2b

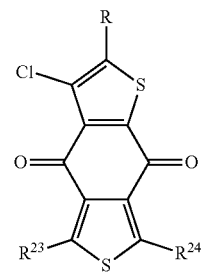

V2c

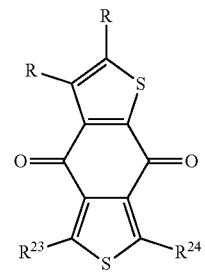

V3a

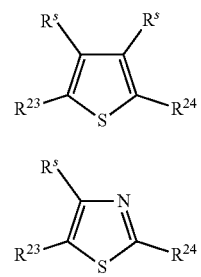

V3b

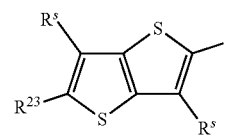

V3c

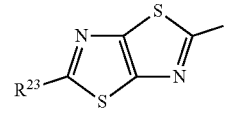

V3d

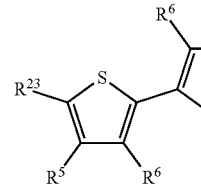

V3e

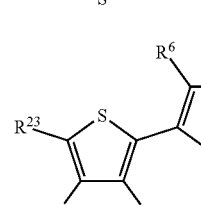

wherein R, R²³ and R²⁴ and R$^s$ have the meanings given above and below.

Further preferred are monomers of formula V1, V2, V3 and their subformulae wherein $R^{23}$ and $R^{24}$ are selected from Br, —B(OZ$^2$)$_2$ and Sn(Z$^4$)$_3$ and an activated H-bond.

Further preferred units, monomers and polymers of formulae I, II, III, V1-V3 and their subformulae are selected from the following embodiments, including any combination thereof:

n≥5, n is from 5 to 2,000, most preferably from 10 to 1,000, $R^1$ and $R^2$ are selected from alkyl that is straight-chain or branched, has 1 to 30, preferably 1 to 20 C atoms, and is optionally fluorinated, $R^1$ and $R^2$ are selected from formulae SUB1-SUB6, $R^{3-10}$ denote H, one or more of $R^{3-10}$ is different from H and is selected from alkyl, alkoxy or thiaalkyl, all of which are straight-chain or branched, have 1 to 30, preferably 1 to 20 C atoms, and are optionally fluorinated, one or more of $R^{3-10}$ is different from H and is selected from F, Cl, CN, —C(=O)—R″, —C(=O)—OR″, —C(=O)—NHR″ and —C(=O)—NR″R‴, wherein R‴ and R″ are independently of each other straight-chain or branched alkyl with 1 to 28, preferably 1 to 18 C atoms that is optionally fluorinated, one or more of $R^{3-10}$ is different from H and is selected from the group consisting of aryl, heteroaryl, aryloxy, heteroaryloxy, arylalkyl and heteroarylalkyl, each of which has 4 to 20 ring atoms and optionally contains fused rings and is unsubstituted or substituted by one or more groups L as defined in formula I, one or more of $R^{11-18}$ is different from H and is selected from alkyl, alkoxy or thiaalkyl, all of which are straight-chain or branched, have 1 to 30, preferably 1 to 20 C atoms, and are optionally fluorinated, one or more of $R^{11-18}$ is different from H and is selected from F, Cl, CN, —C(=O)—R″, —C(=O)—OR″, —C(=O)—NHR″ and —C(=O)—NR″R‴, wherein R‴ and R″ are independently of each other straight-chain or branched alkyl with 1 to 28, preferably 1 to 18 C atoms that is optionally fluorinated, one or more of $R^{11-18}$ is different from H and is selected from the group consisting of aryl, heteroaryl, aryloxy, heteroaryloxy, arylalkyl and heteroarylalkyl, each of which has 4 to 20 ring atoms and optionally contains fused rings and is unsubstituted or substituted by one or more groups L as defined in formula I, R and R$^s$ denote straight-chain or branched alkyl with 1 to 30, preferably 1 to 20 C atoms which is optionally fluorinated, R and R$^s$ denote aryl, heteroaryl, arylalkyl or heteroarylalkyl, each of which has 4 to 20 ring atoms, optionally contains fused rings, and is unsubstituted or substituted by one or more groups L as defined in formula I, R' is straight-chain or branched alkyl with 1 to 30, preferably 1 to 20 C atoms which is optionally fluorinated, R' is F, Cl or CN, preferably Cl, L is selected from alkyl, alkoxy or thiaalkyl, all of which are straight-chain or branched, have 1 to 30, preferably 1 to 20 C atoms, and are optionally fluorinated, L is selected from F, Cl, CN, —C(=O)—R″, —C(=O)—OR″, —C(=O)—NHR″ and —C(=O)—NR″R‴, wherein R‴ and R″ are independently of each other straight-chain or branched alkyl with 1 to 28, preferably 1 to 18 C atoms that is optionally fluorinated, L is halogen, preferably F or Cl, L is CN, F or Cl, $R^{21}$ and $R^{22}$ are selected from H, $C_{1-20}$ alkyl, or optionally substituted $C_{6-12}$ aryl or $C_{2-10}$ heteroaryl, very preferably H or phenyl, $R^{23}$ and $R^{24}$ denote Br, B(OZ$^b$)$_2$ or Sn(Z$^d$)$_3$, wherein $Z^b$ and $Z^d$ are as defined in formula V1.

The conjugated polymers according to the present invention can be synthesized according to or in analogy to methods that are known to the skilled person and are described in the literature. Other methods of preparation can be taken from the examples.

The invention further relates to a process of preparing a conjugated polymer according to the present invention by coupling one or more monomers of formula V1, one or more monomers of formula V2, and optionally one or more monomers of formula V3, or their respective subformulae V1, V1 b, V2a, V2b, V2c, V3a, V3b, V3c, V3d, V3e, with each other in an aryl-aryl coupling reaction.

In a preferred process the monomers of formula V1, V2 and optionally one V3, or their respective subformulae, are coupled with each other and with one or monomers of formula MI in an aryl-aryl coupling reaction $$R^{23}—Ar^3—R^{24} \quad \text{MI}$$

wherein Ar$^3$, $R^{23}$ and $R^{24}$ have the meanings given above and below.

For example, the polymers can be suitably prepared by aryl-aryl coupling reactions, such as Yamamoto coupling, C—H activation coupling, Suzuki coupling, Stille coupling, Sonogashira coupling, Heck coupling or Buchwald coupling. Suzuki coupling, Stille coupling and Yamamoto coupling are especially preferred. The monomers which are polymerised to form the repeat units of the polymers can be prepared according to methods which are known to the person skilled in the art.

Preferably the polymers are prepared from monomers selected from formulae V1, V2, V3, V1a-d and MI as described above.

Another aspect of the invention is a process for preparing a polymer by coupling one or more identical or different monomers selected from formulae V1, V2, V1a-d with each other and/or with one or more co-monomers, preferably of formula MI, in a polymerisation reaction, preferably in an aryl-aryl coupling reaction.

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described in for example in T. Yamamoto et al., *Prog. Polym. Sci.*, 1993, 17, 1153-1205, or WO 2004/022626 A1. Stille coupling is described for example in Z. Bao et al., *J. Am. Chem. Soc.*, 1995, 117, 12426-12435. C—H activation is described for example for example in M. Leclerc et al, *Angew. Chem. Int. Ed.* 2012, 51, 2068-2071. For example, when using Yamamoto coupling, monomers having two reactive halide groups are preferably used. When using Suzuki coupling, monomers having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used. When synthesizing a linear polymer by C—H activation polymerisation, preferably a monomer as described above is used wherein at least one reactive group is an activated hydrogen bond.

Preferred catalysts, especially for Suzuki, Negishi or Stille coupling, are selected from Pd(0) complexes or Pd(II) salts. Preferred Pd(0) complexes are those bearing at least one phosphine ligand such as $Pd(Ph_3P)_4$. Another preferred phosphine ligand is tris(ortho-tolyl)phosphine, i.e. Pd(o-Tol$_3$P)$_4$. Preferred Pd(II) salts include palladium acetate, i.e. $Pd(Oac)_2$ or trans-di(μ-acetato)-bis[o-(di-o-tolylphosphino)benzyl]dipalladium(II). Alternatively the Pd(0) complex can be prepared by mixing a Pd(0) dibenzylideneacetone complex, for example tris(dibenzyl-ideneacetone)dipalladium(0), bis(dibenzylideneacetone)palladium(0), or Pd(II) salts e.g. palladium acetate, with a phosphine ligand, for example triphenylphosphine, tris(ortho-tolyl)phosphine, tris(o-methoxyphenyl)phosphine or tri(tert-butyl)phosphine. Suzuki polymerisation is performed in the presence of a base, for example sodium carbonate, potassium carbonate, cesium carbonated, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl) nickel(0).

Suzuki, Stille or C—H activation coupling polymerisation may be used to prepare homopolymers as well as statistical, alternating and block random copolymers. Statistical, random block copolymers or block copolymers can be prepared for example from the above monomers, wherein one of the reactive groups is halogen and the other reactive group is a C—H activated bond, boronic acid, boronic acid derivative group or and alkylstannane. The synthesis of statistical, alternating and block copolymers is described in detail for example in WO 03/048225 A2 or WO 2005/014688 A2.

As alternatives to halogen as described above, leaving groups of formula —O—SO$_2$Z$^a$ can be used wherein Z$^a$ is as defined above. Particular examples of such leaving groups are tosylate, mesylate and triflate.

Preferred polymerisation conditions lead to alternating polymers which are particularly preferred for OTFT application, whereas statistical block copolymers are prepared preferably for OPV and OPD application. Preferred polycondensation are Suzuki coupling, Stille coupling, Sonogashira coupling, Heck coupling or Buchwald coupling, Negishi coupling or C—H activation coupling where the first set of reactive groups is composed of —Cl, —Br, —I, O-tosylate, O-triflate, O-mesylate and O-nonaflate and the second set of reactive groups is composed of —H, —SiMe$_2$F, —SiMeF$_2$, —B(OZ$^b$)$_2$, —CZ$^c$═CHZ$^c$, —C≡CH, —ZnX$^c$, —MgX$^0$ and —Sn(Z$^d$), wherein Z$^b$, Z$^c$, Z$^d$ and X$^0$ are as defined above. If a Yamamoto coupling reaction is used to prepare the polymer, the reactive monomer ends are both composed independently of —Cl, —Br, —I, O-tosylate, O-triflate, O-mesylate and O-nonaflate.

Suitable and preferred methods for preparing monomers and polymers according to the present invention are illustrated in the reaction schemes below, wherein the individual radicals are as defined above.

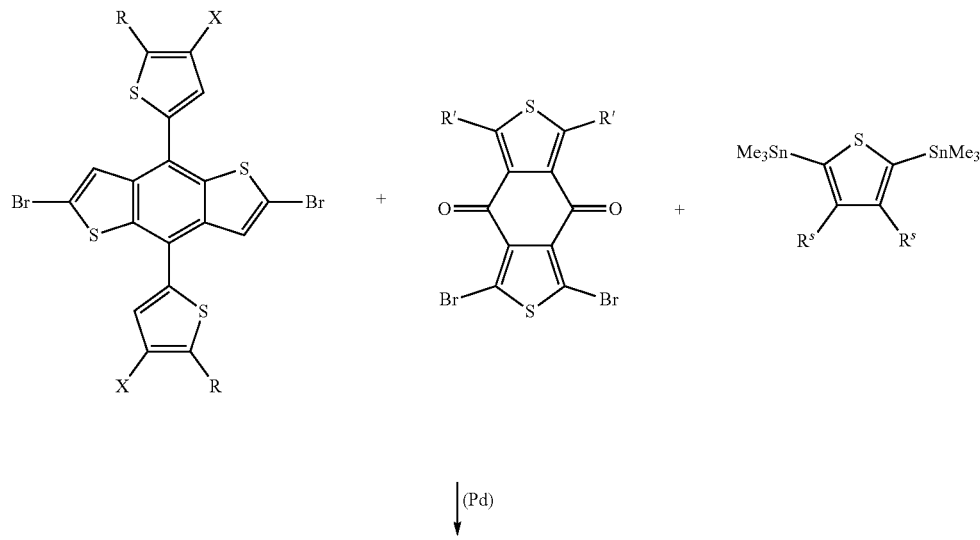

Scheme 1

-continued

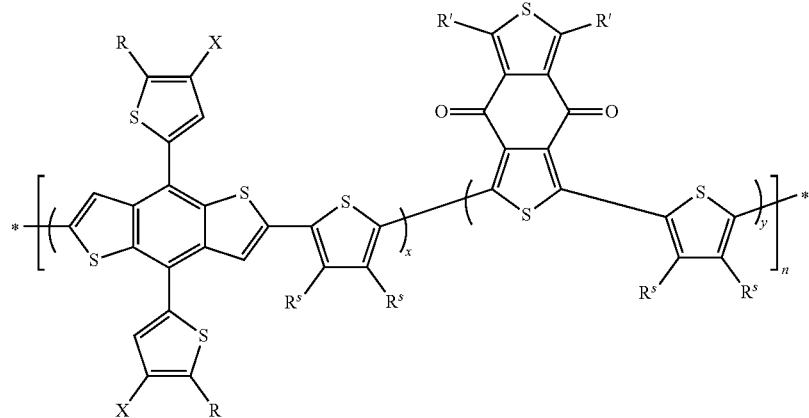

Scheme 2

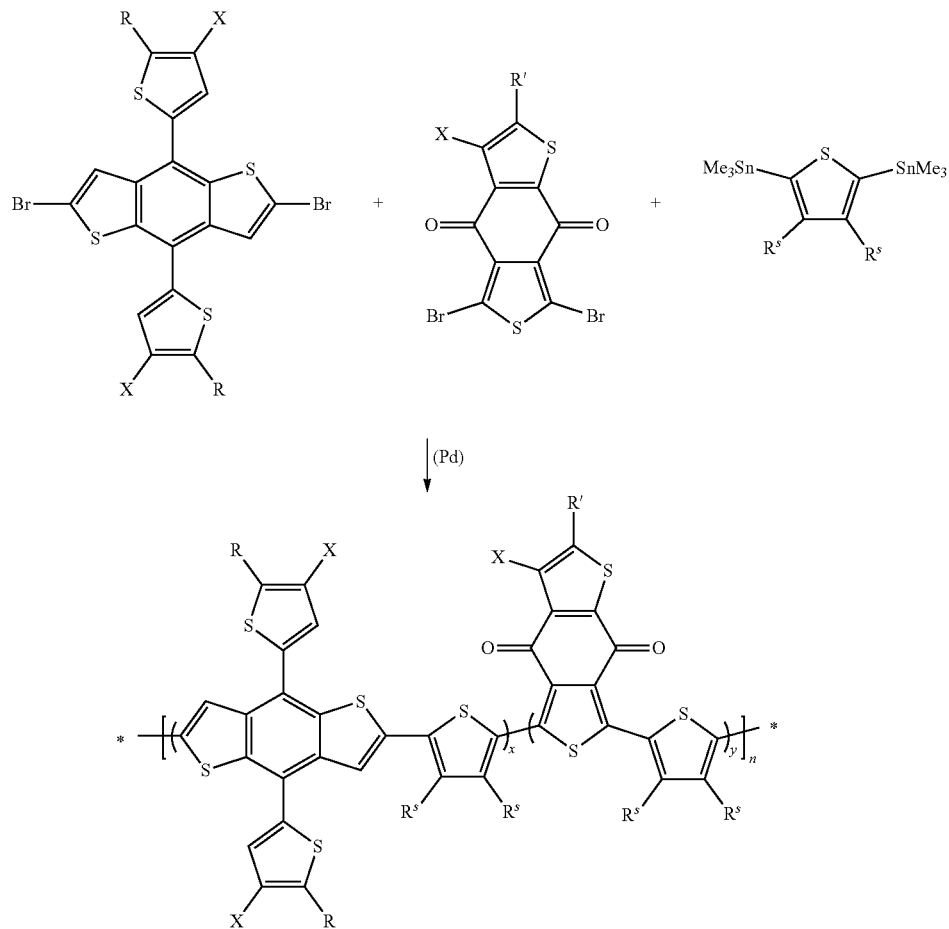

wherein R, R¹, R⁵ and R⁶ gave the meanings given above and below and X denotes F or Cl.

The polymers can be synthesized from these monomers by, or in analogy to, the aryl-aryl coupling reactions as described above. Particularly, conjugated polymers can be made by Pd catalysed direct arylation polymerisation with a dibromo counterpart (M. Wakioka, et al., *Macromol.*, 2015, 48, 8382) or Pd catalysed polycondensations methods such as Yamamoto reaction (Yamamoto et al., *Bull., Chem. Soc. Jpn.*, 1978, 51(7), 2091; Yamamo to et al., *Macromolecules*, 1992, 25(4), 1214), Suzuki-Miyaura reaction (Miyaura et al., *Chem. Rev.*, 1995, 95, 2457) and Stille reaction (Bao et al., *J. Am., Chem., Soc.*, 1995, 117(50), 12426) using the terminally brominated derivatives.

The novel methods of preparing a monomer or polymer as described above and below, and the novel monomers and intermediates used therein, are further aspects of the invention.

The polymers according to the present invention can also be used in compositions or polymer blends, for example together with small molecules or other polymers having charge-transport, semiconducting, electrically conducting, photoconducting and/or light-emitting semiconducting properties, or for example with polymers having hole blocking, electron blocking properties for use as interlayers, charge blocking layers, charge transporting layer in OLED devices, OPV devices or perovskite based solar cells.

Another aspect of the invention relates to a composition, which may also be a polymer blend, comprising one or more polymers according to the present invention and one or more small molecule compounds and/or polymers having one or more of a charge-transport, semiconducting, electrically conducting, photoconducting, hole blocking and electron blocking property.

These compositions can be prepared by conventional methods that are described in prior art and known to the skilled person. Typically the individual components are mixed with each other or dissolved in suitable solvents and the solutions combined.

Another aspect of the invention relates to a formulation comprising one or more polymers, polymer blends or compositions as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluoro-toluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, 2,4-dimethylanisole, 1-methylnaphthalene, 1,2,4-trimethylbenzene, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, 1,5-dimethyltetraline, propiophenone, acetophenone, tetraline, 2-methylthiophene, 3-methylthiophene, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., *Journal of Paint Technology*, 1966, 38 (496), 296". Solvent blends may also be used and can be identified as described in "Solvents, W. H. Ellis, Federation of Societies for Coatings Technology, p 9-10, 1986".

Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, compositions or formulations according to the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points>100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a compound according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point>100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers, compositions and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The polymers and compositions according to the present invention are useful as charge transport, semiconducting, electrically conducting, photoconducting or light emitting material in optical, electrooptical, electronic, electroluminescent or photoluminescent components or devices. In these devices, a compound or composition of the present invention is typically applied as a thin layer or film.

Thus, the present invention also provides the use of the compound, composition or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a polymer, composition or polymer blend according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a polymer, polymer blend, composition or organic semiconducting layer according to the present invention. Especially preferred devices are OFETs, TFTs, ICs, logic circuits, capacitors, RFID tags, OLEDs, OLETs, OPEDs, OPVs, OPDs, solar cells, dye-sensitized solar cells (DSSC), perovskite-based solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs, OPV and OPD devices, in particular OPD and bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a composition that comprises or contains, preferably consists of, one or more p-type semiconductors and one or more n-type semiconductors.

In a preferred embodiment at least one of the p-type semiconductors in the composition is a compound according to the present invention which is preferably a conjugated polymer. In this preferred embodiment the n-type semiconductor is preferably a fullerene or substituted fullerene.

In another preferred embodiment at least one of the n-type semiconductors in the composition is a compound according to the present invention which is preferably a small molecule, very preferably a compound of formula VI. In this preferred embodiment the p-type semiconductor is preferably a conjugated polymer.

In another preferred embodiment the OPV or OPD device comprises a composition comprising a compound according to the present invention as first n-type semiconductor, and further comprising an p-type semiconductor like a conjugated polymer, and a second n-type semiconductor, which is preferably a fullerene or substituted fullerene.

The n-type semiconductor or second n-type semiconductor in the composition of the aforementioned embodiments is for example an inorganic material such as zinc oxide ($ZnO_x$), zinc tin oxide (ZTO), titanium oxide ($TiO_x$), molybdenum oxide ($MoO_x$), nickel oxide ($NiO_x$), or cadmium selenide (CdSe), or an organic material such as graphene or a fullerene, a conjugated polymer or a fullerene or substituted fullerene.

The fullerene is for example an indene-$C_{60}$-fullerene bisadduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

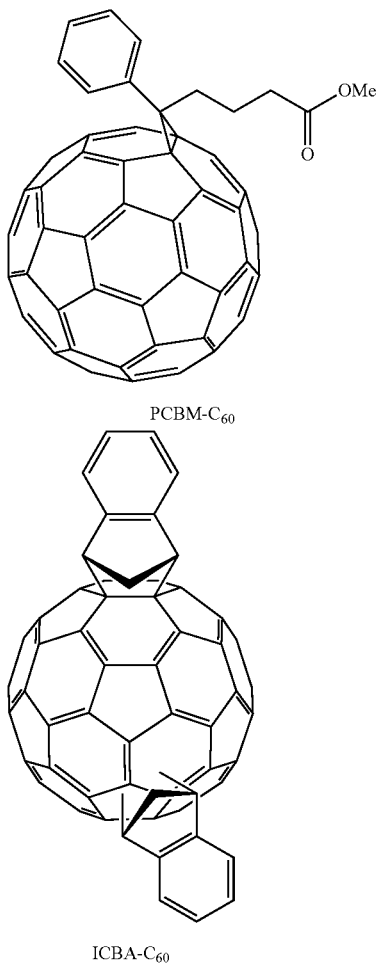

PCBM-C60

ICBA-C60

Preferably the fullerene is PCBM-C60, PCBM-C70, bis-PCBM-C60, bis-PCBM-C70, ICMA-c60 (1',4'-dihydro-naphtho[2',3':1,2][5,6]fullerene-C60), ICBA, oQDM-C60 (1',4'-dihydro-naphtho[2',3':1,9][5,6]fullerene-C60-lh), or bis-oQDM-C60.

Further preferably the n-type semiconductor or second n-type semiconductor in the composition of the aforementioned embodiments is a fullerene or substituted fullerene of formula XII,

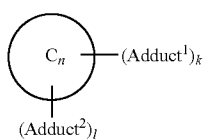

XII $C_n$ denotes a fullerene composed of n carbon atoms, optionally with one or more atoms trapped inside, Adduct$^1$ is a primary adduct appended to the fullerene $C_n$ with any connectivity, Adduct$^2$ is a secondary adduct, or a combination of secondary adducts, appended to the fullerene $C_n$ with any connectivity, k is an integer≥1, and l is 0, an integer≥1, or a non-integer≥0.

In the formula XII and its subformulae, k preferably denotes 1, 2, 3 or, 4, very preferably 1 or 2.

The fullerene $C_n$ in formula XII and its subformulae may be composed of any number n of carbon atoms Preferably, in the compounds of formula XII and its subformulae the number of carbon atoms n of which the fullerene $C_n$ is composed is 60, 70, 76, 78, 82, 84, 90, 94 or 96, very preferably 60 or 70.

The fullerene $C_n$ in formula XII and its subformulae is preferably selected from carbon based fullerenes, endohedral fullerenes, or mixtures thereof, very preferably from carbon based fullerenes.

Suitable and preferred carbon based fullerenes include, without limitation, $(C_{60\text{-}Ih})$[5,6]fullerene, $(C_{70\text{-}D5h})$[5,6]fullerene, $(C_{76\text{-}D2^*})$[5,6]fullerene, $(C_{84\text{-}D2^*})$[5,6]fullerene, $(C_{4\text{-}D2d})$[5,6]fullerene, or a mixture of two or more of the aforementioned carbon based fullerenes.

The endohedral fullerenes are preferably metallofullerenes. Suitable and preferred metallofullerenes include, without limitation, La@$C_{60}$, La@$C_2$, Y@$C_2$, Sc$_3$N@$C_{80}$, Y$_3$N@$C_{80}$, Sc$_3$C$_2$@$C_{80}$ or a mixture of two or more of the aforementioned metallofullerenes.

Preferably the fullerene $C_n$ is substituted at a [6,6] and/or [5,6] bond, preferably substituted on at least one [6,6] bond.

Primary and secondary adduct, named "Adduct" in formula XII and its subformulae, is preferably selected from the following formulae

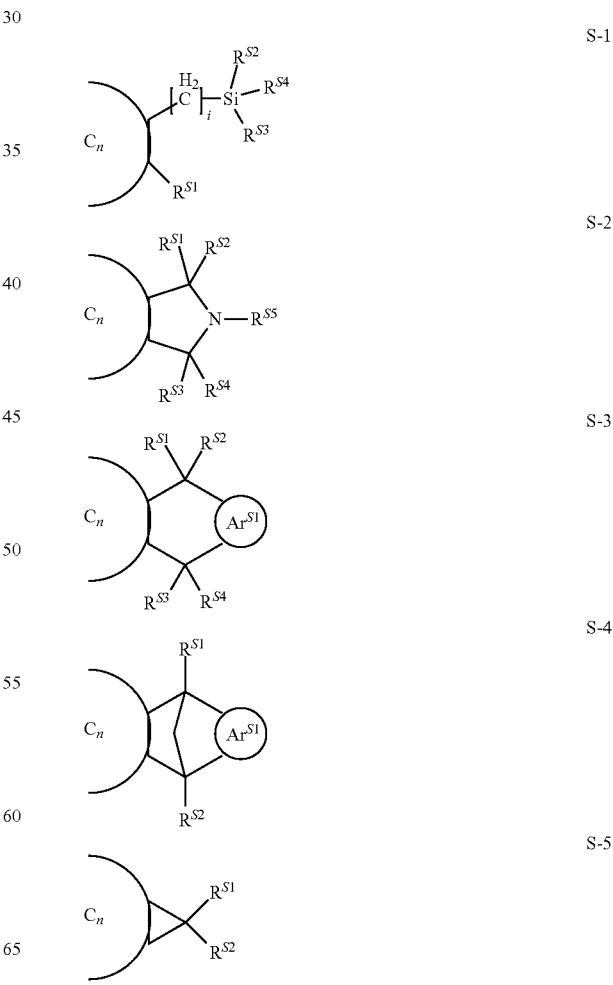

-continued
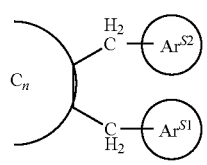 S-6
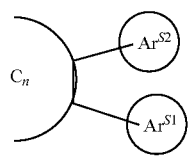 S-7
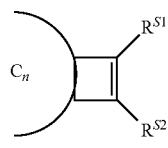 S-8
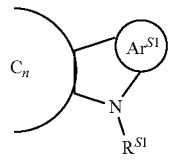 S-9
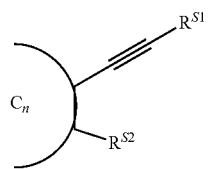 S-10
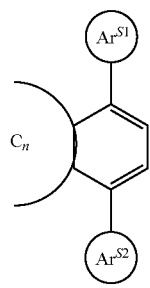 S-11
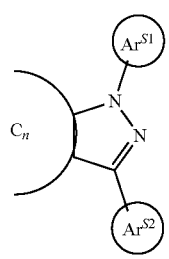 S-12
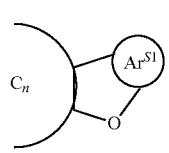 S-13
-continued
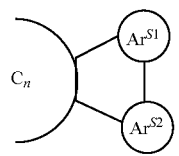 S-14
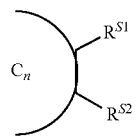 S-15
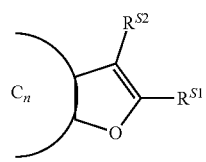 S-16
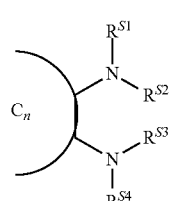 S-17
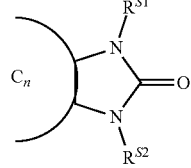 S-18
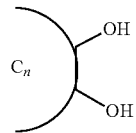 S-19
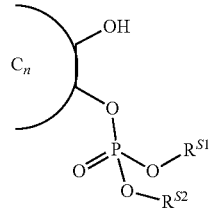 S-20
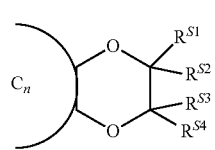 S-21
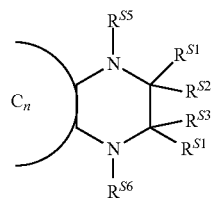 S-22 wherein $C_n$ is as defined in formula XII, $Ar^{S1}$, $Ar^{S2}$ denote, independently of each other, an arylene or heteroarylene group with 5 to 20, preferably 5 to 15, ring atoms, which is mono- or polycyclic, and which is optionally substituted by one or more identical or different substituents having one of the meanings of L as defined above and below, and $R^{S1}$, $R^{S2}$, $R^{S3}$, $R^{S4}$, $R^{S5}$ and $R^{S6}$ independently of each other denote H, CN or have one of the meanings of L as defined above and below, and i is an integer from 1 to 20, preferably from 1 to 12.

Preferred compounds of formula XII are selected from the following subformulae:

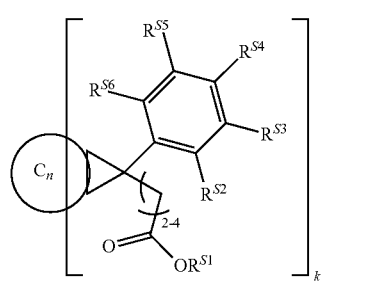

XIIa

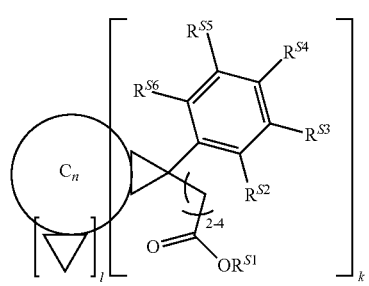

XIIb

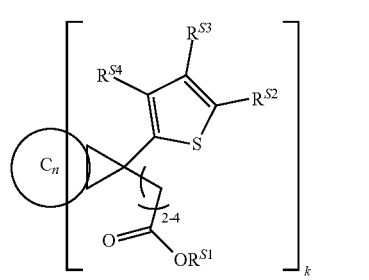

XIIc

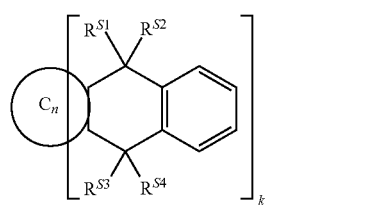

XIId

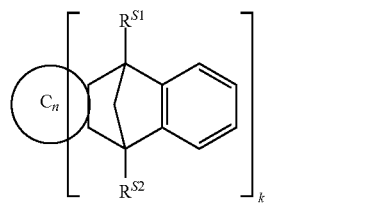

XIIe

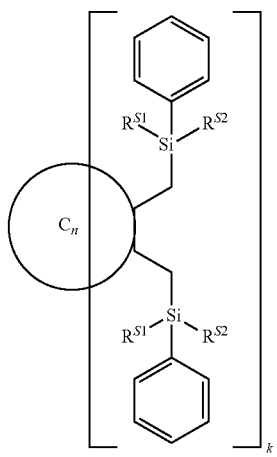

XIIf

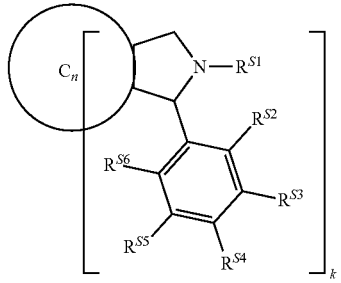

XIIg

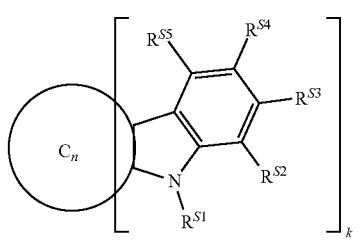

XIIh wherein $C_n$, k and l are as defined in formula XII, and $R^{S1}$, $R^{S2}$, $R^{S3}$, $R^{S4}$, $R^{S5}$ and $R^{S6}$ independently of each other denote H or have one of the meanings of L as defined above and below.

In another preferred embodiment, the composition according to the present invention contains a polymer of formula I as p-type semiconductor and an organic n-type semiconductor which is selected from small molecules that do not contain a fullerene moiety, hereinafter also referred to as "non-fullerene acceptors" or NFAs.

Preferably the NFAs comprise a polycyclic core and attached thereto two terminal groups which are electron withdrawing relative to the polycyclic core, and optionally further comprise one or more aromatic or heteroaromatic spacer groups, which are located between the polycyclic core and the terminal groups and which can be electron withdrawing or electron donating relative to the polycyclic core. As a result these preferred NFAs have an acceptor-donor-acceptor (A-D-A) structure, wherein the polycyclic core acts as donor and the terminal groups, optionally together with the spacer groups, act as acceptor.

Examples for suitable and preferred NFAs are the compound ITIC shown below, as disclosed by Y. Lin, J. Wang, Z.-G. Zhang, H. Bai, Y. Li, D. Zhu and X. Zhan, *Adv. Mater.* 2015, 27, 1170-1174, and the compound IEIC shown below, as disclosed by H. Lin, S. Chen, Z. Li, J. Y. L. Lai, G. Yang, T. McAfee, K. Jiang, Y. Li, Y. Liu, H. Hu, J. Zhao, W. Ma, H. Ade and H. Yan, Zhan, *Adv. Mater.*, 2015, 27, 7299.

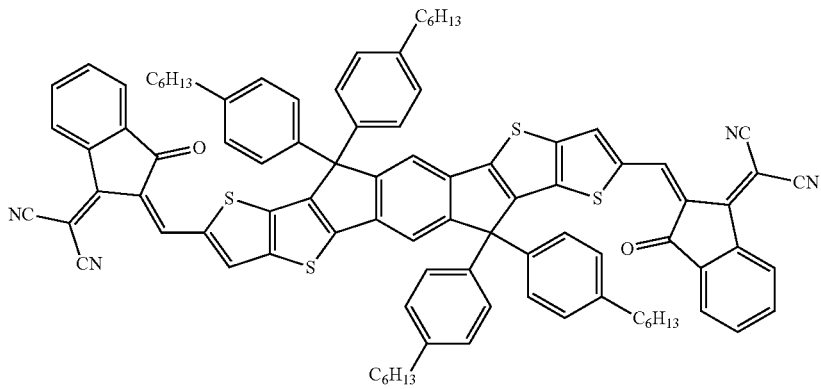

ITIC

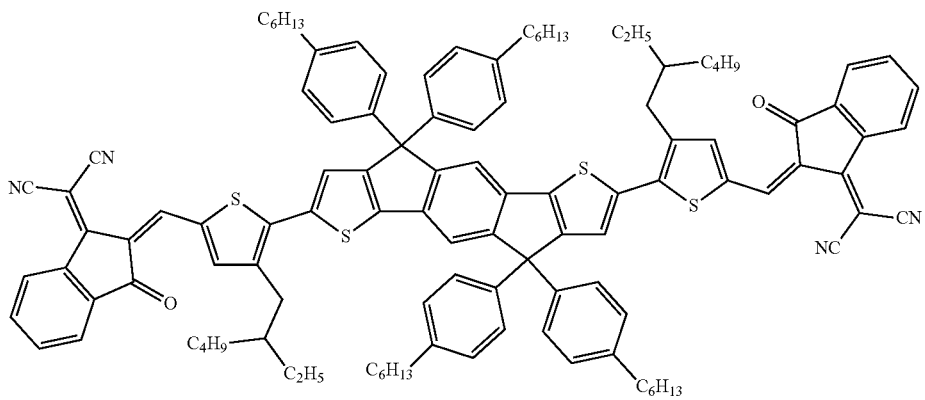

IEIC

Further examples for suitable and preferred NFAs are disclosed in WO 2018/007479 A1, WO 2018/036914 A1, WO 2018/065350 A1, WO 2018/065352 A1, WO 2018/065356 A1 and EP 3306690 A1.

Preferred NFAs are selected from formula N $$R^{T1}-(Ar^{11})_{n11}\text{-core-}(Ar^{12})_{n12}-R^{T2} \qquad \text{N}$$

wherein the individual radicals, independently of each other and on each occurrence identically or differently, have the following meanings $Ar^{11}$, $Ar^{12}$ arylene or heteroarylene that has from 5 to 20 ring atoms, is mono- or polycyclic, optionally contains fused rings, and is unsubstituted or substituted by one or more identical or different groups $R^{N1}$, or $-CY^1=CY^2-$ or $-C\equiv C-$, core polycyclic, fused arylene or heteroarylene that has from 8 to 30 ring atoms, and is unsubstituted or substituted by one or more identical or different groups $R^{N1}$, $R^{N1}$ one of the meanings given for $R^1$ as given in formula I or one of its preferred meanings as given above, $Y^0$, $Y^2$ H, F, Cl or CN, $R^{T1}$, $R^{T2}$ an electron withdrawing group, n11, n12 0, 1, 2 or 3.

Preferably the groups $R^{T1}$ and $R^{T2}$ in formula N are each independently selected from the group consisting of the following formulae

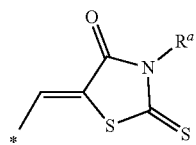

T1

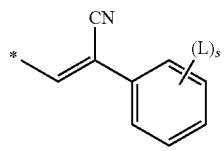

T2

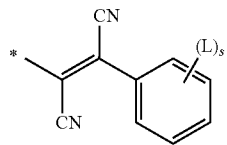

T3

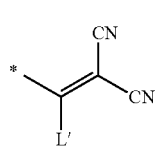

T4

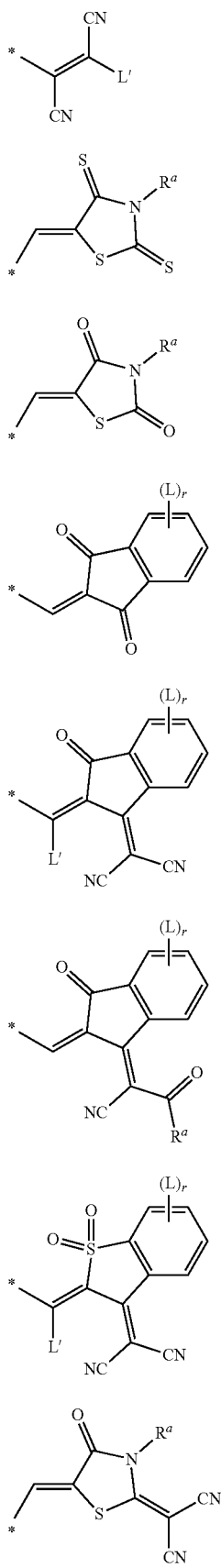
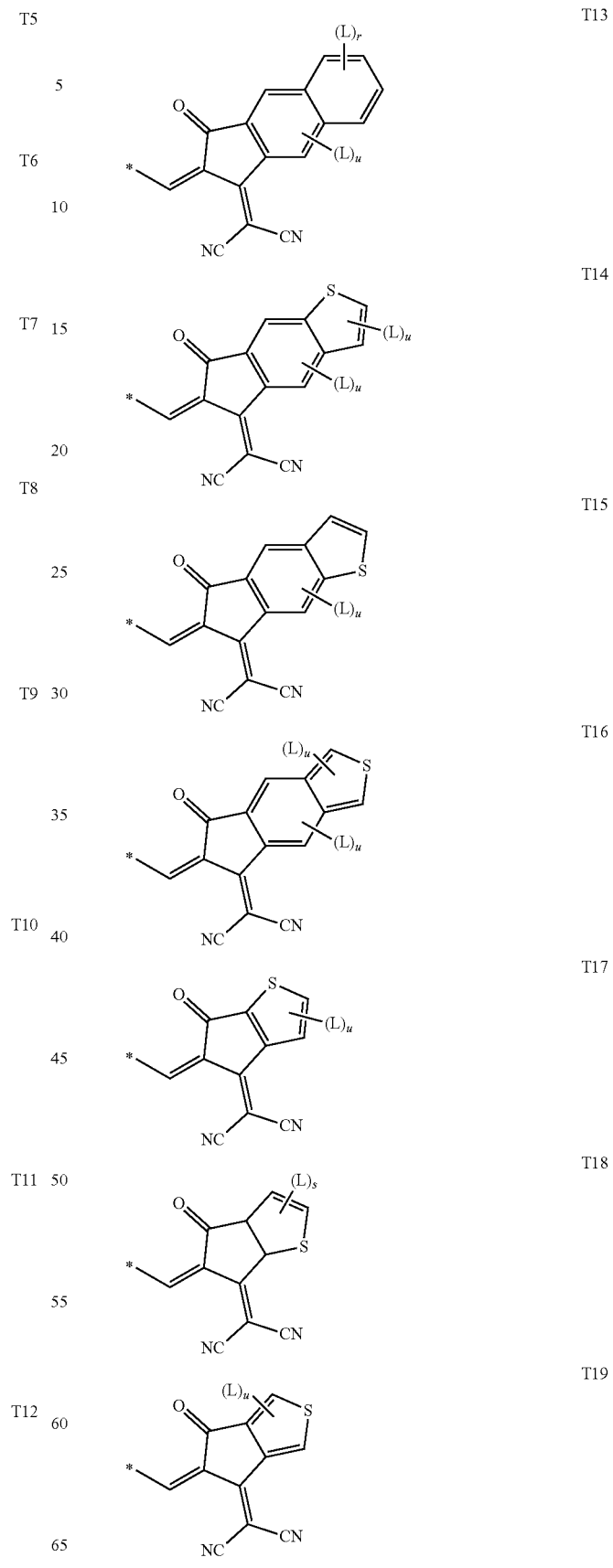

wherein the individual radicals, independently of each other and on each occurrence identically or differently, have the following meanings $R^a$ aryl or heteroaryl, each having from 4 to 30, preferably from 5 to 20, ring atoms, optionally containing fused rings and being unsubstituted or substituted with one or more groups L, or one of the meanings given for L, L F, C, —NO$_2$, —CN, —NC, —NCO, —NCS, —OCN, —SCN, $R^o$, $OR^o$, $SR^o$, —C(=O)X$^o$, —C(=O)R$^o$, —C(=O)—OR$^o$, —O—C(=O)—R$^o$, —NH$_2$, —NHR$^o$, —NR$^o$R$^{oo}$, —C(=O)NHR$^o$, —C(=O)NR$^o$R$^{oo}$, —SO$_3$R$^o$, —SO$_2$R$^o$, —OH, —NO$_2$, —CF$_3$, —SF$_5$, or optionally substituted silyl, or carbyl or hydrocarbyl with 1 to 30, preferably 1 to 20 C atoms that is optionally substituted and optionally comprises one or more hetero atoms, preferably F, —CN, $R^o$, —OR$^o$, —SR$^o$, —C(=O)—R$^o$, —C(=O)—OR$^o$, —O—C(=O)—R$^o$, —O—C(=O)—OR$^o$, —C(=O)—NHR$^o$, —C(=O)—NR$^o$R$^{oo}$, L' H or one of the meanings of L, $R^o$, $R^{oo}$ H or straight-chain or branched alkyl with 1 to 20, preferably 1 to 12 C atoms that is optionally fluorinated, r 0, 1, 2, 3 or 4, s 0, 1, 2, 3, 4 or 5, u 0, 1 or 2.

Very preferred groups $R^{T1}$ and $R^{T2}$ are each independently selected from the following formulae wherein L, L', $R^a$, r, s and u have the meanings given above and below, and L' is H or has one of the meanings given for L. Preferably in these formulae L' is H. Further preferably in these formulae r is 0.

Preferably $Ar^{11}$ and $Ar^{12}$ in formula N have one of the meanings gien for $Ar^3$ above. Very preferably $Ar^{11}$ and $Ar^{12}$ in formula N are selected from the following groups a) the group consisting of the formulae D1-D151, very preferably of the formulae D1, D7, D10, D11, D19, D22, D29, D30, D35, D36, D37, D44, D55, D84, D87, D88, D89, D93, D94, D106, D111, D139, D140, D141, D146 and D150, b) the group consisting of the formulae A1-A103, very preferably of the formulae A1, A6, A7, A15, A16, A20, A36, A74, A84, A88, A92, A94, A98 and A103, c) the group consisting of the formulae Sp1-Sp18, very preferably of the formulae Sp1, Sp2, Sp6, Sp10, Sp11, Sp12, Sp13 and Sp14.

Further preferred compounds of formula S2 are those wherein Ar$^{N1}$ and Ar$^{N2}$ are each independently and on each occurrence identically or differently selected from the following formulae and their mirror images:

AR1
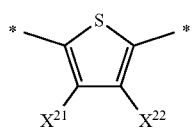

AR2
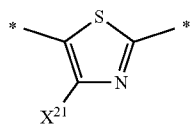

AR3
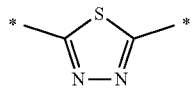

AR4
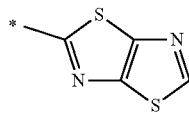

AR5
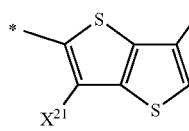

AR6
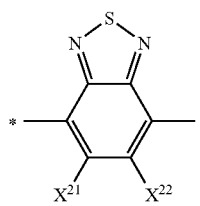

AR7
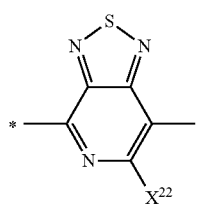

AR8
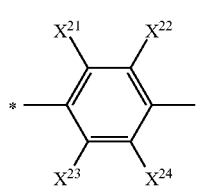

AR9
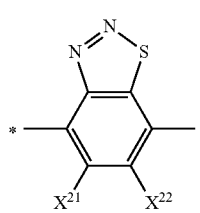

AR10
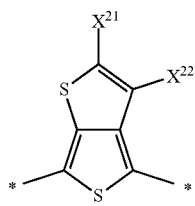

AR11
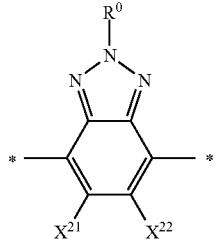

wherein $X^{21}$, $X^{22}$, $X^{23}$ and $X^{24}$ denote H, F, Cl, —CN, $R^0$, $OR^0$ or $C(=O)OR^0$, and $R^0$ is as defined above and below.

The group "core" in formula N is preferably selected from the following formulae C1
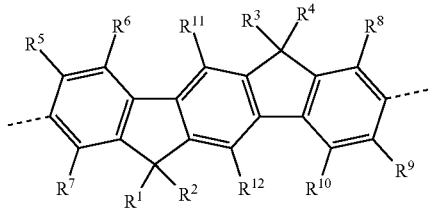

C2
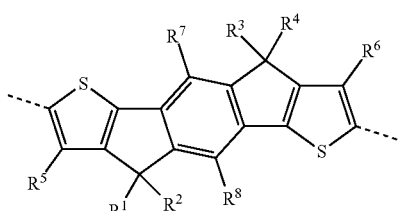

C3
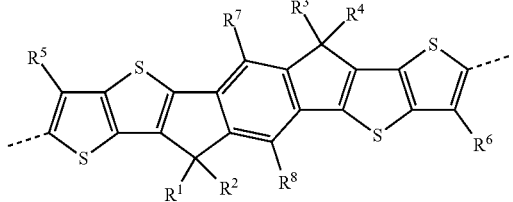

C4
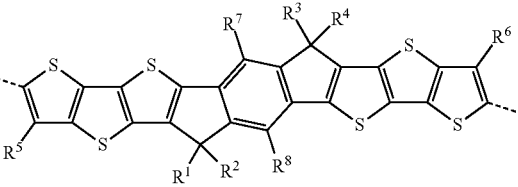

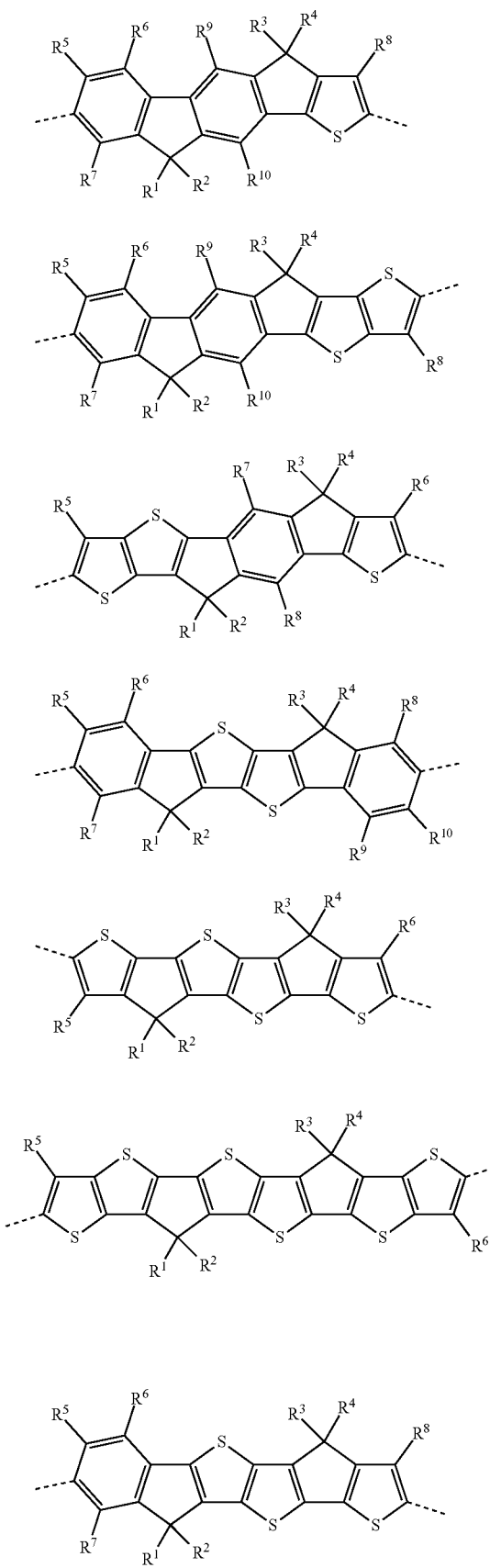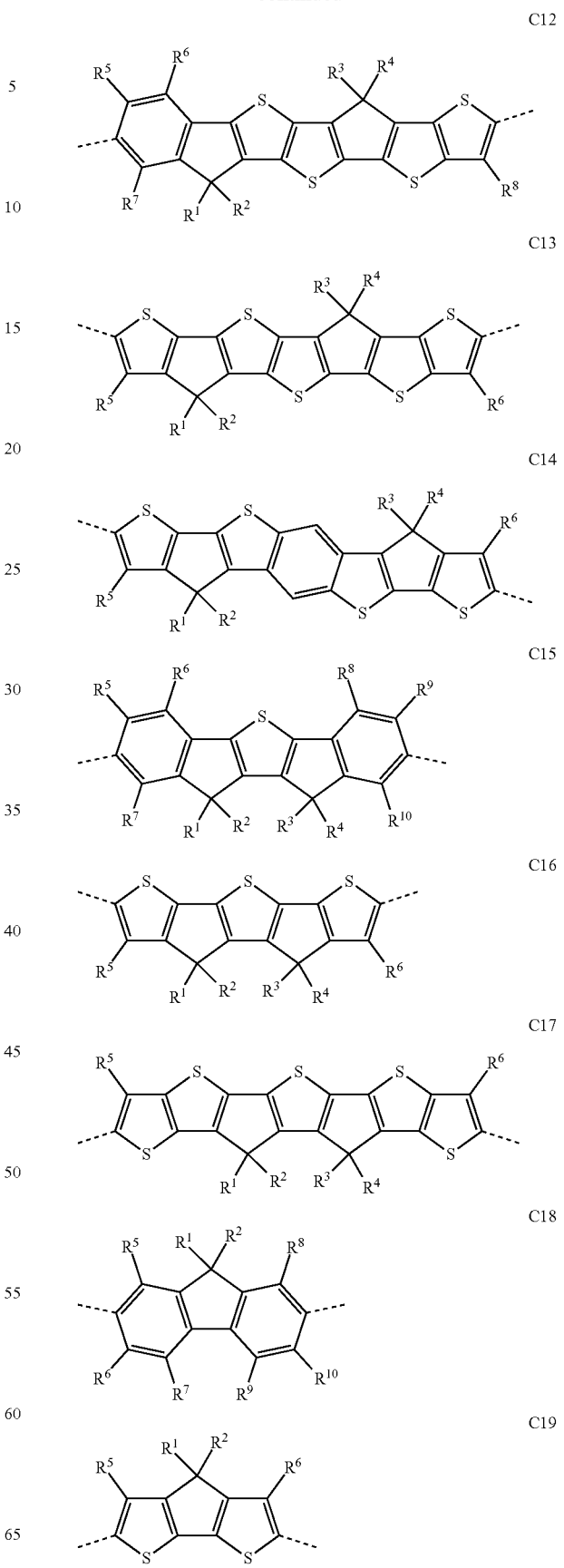

-continued

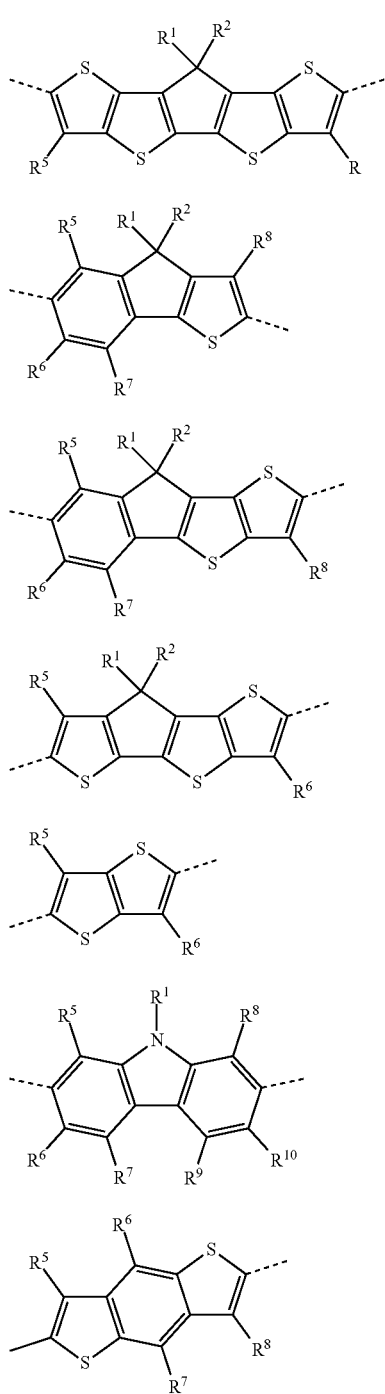

wherein R$^{1-10}$ have the meanings given in formula I or one of the preferred meanings given above and below, and the pair of R$^1$ and R$^2$, and/or the pair of R$^3$ and R$^4$, together with the C atom to which they are attached, may also form a spiro group with 5 to 20 ring atoms which is mono- or polycyclic, optionally contains fused rings, and is unsubstituted or substituted by one or more identical or different groups L.

Preferred core groups are selected from formulae C2, C3, C9 and C10, most preferably from formulae C2, C3 wherein R$^7$ and R$^8$ denote H, C3 wherein R$^7$ and R$^8$ denote F, and C10.

Further preferred compounds of formula N are selected from the following preferred embodiments, including any combination thereof:

R$^{T1}$ and R$^{T2}$ are selected from formulae T1, T9a, T9b, T9c, T13 and T19, "core" is selected from formulae C2, C3 wherein R$^7$ and R$^8$ denote H, C3 wherein R$^7$ and R$^8$ denote F, and C10, n11, n12 are 0 or 1, preferably 0, Ar$^{11}$ and Ar$^{12}$ are selected from formulae Sp1, Sp2, Sp6, Sp10, Sp11, Sp12, Sp13 and Sp14, Ar$^{11}$ and Ar$^{12}$ are selected from thiophene, thiazole, thieno[3,2-b]thiophene, thiazolo[5,4-d]thiazole, benzene, 1,2,3-benzothiadiazole, thieno[3,4-b]thiophene, benzotriazole or thiadiazole[3,4-c]pyridine, which are substituted by X$^1$, X$^2$, X$^3$ and X$^4$ as defined above, one or both of R$^1$ and R$^2$ and one or both of R$^3$ and R$^4$ are different from H, R$^1$, R$^2$, R$^3$ and R$^4$, when being different from H, are each independently selected from H, F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms, without being perfluorinated, or alkyl or alkoxy having 1 to 12 C atoms that is optionally fluorinated, R$^1$, R$^2$, R$^3$ and R$^4$, when being different from H, are each independently selected from aryl or heteroaryl, each of which is optionally substituted with one or more groups L as defined in formula I and has 4 to 30 ring atoms, preferably from phenyl that is optionally substituted, preferably in 4-position, or in 2,4-positions, or in 2,4,6-positions or in 3,5-positions, with alkyl or alkoxy having 1 to 20 C atoms, preferably 1 to 16 C atoms, very preferably from 4-alkylphenyl wherein alkyl is C1-16 alkyl, most preferably 4-methylphenyl, 4-hexylphenyl, 4-octylphenyl or 4-dodecylphenyl, or from 4-alkoxyphenyl wherein alkoxy is C1-16 alkoxy, most preferably 4-hexyloxyphenyl, 4-octyloxyphenyl or 4-dodecyloxyphenyl, or from 2,4-dialkylphenyl wherein alkyl is C1-16 alkyl, most preferably 2,4-dihexylphenyl or 2,4-dioctylphenyl, or from 2,4-dialkoxyphenyl wherein alkoxy is C1-16 alkoxy, most preferably 2,4-dihexyloxyphenyl or 2,4-dioctyloxyphenyl, or from 3,5-dialkylphenyl wherein alkyl is C1-16 alkyl, most preferably 3,5-dihexylphenyl or 3,5-dioctylphenyl, or from 3,5-dialkoxyphenyl wherein alkoxy is C1-16 alkoxy, most preferably 3,5-dihexyloxyphenyl or 3,5-dioctyloxyphenyl, or from 2,4,6-trialkylphenyl wherein alkyl is C1-16 alkyl, most preferably 2,4,6-trihexylphenyl or 2,4,6-trioctylphenyl, or from 2,4,6-trialkoxyphenyl wherein alkoxy is C1-16 alkoxy, most preferably 2,4,6-trihexyloxyphenyl or 2,4,6-trioctyloxyphenyl, or from 4-thioalkylphenyl wherein thioalkyl is C1-16 thioalkyl, most preferably 4-thiohexylphenyl, 4-thiooctylphenyl or 4-thiododecylphenyl, or from 2,4-dithioalkylphenyl wherein thioalkyl is C1-16 thioalkyl, most preferably 2,4-dithiohexylphenyl or 2,4-dithiooctylphenyl, or from 3,5-dithioalkylphenyl wherein thioalkyl is C1-16 thioalkyl, most preferably 3,5-dithiohexylphenyl or 3,5-dithiooctylphenyl, or from 2,4,6-trithioalkylphenyl wherein thioalkyl is C1-16 thioalkyl, most preferably 2,4,6-trithiohexylphenyl or 2,4,6-trithiooctylphenyl, L' is H, R[5-10], when being different from H, are each independently selected from F, Cl or straight-chain or branched alkyl, alkoxy, sulfanylalkyl, sulfonylalkyl, alkylcarbonyl, alkoxycarbonyl and alkylcarbonyloxy, each having up to 20 C atoms and being unsubstituted or substituted by one or more F atoms, without being perfluorinated, preferably from F, or alkyl or alkoxy having up to 16 C atoms that is optionally fluorinated.

Very preferred compounds of formula N are selected from the following subformulae

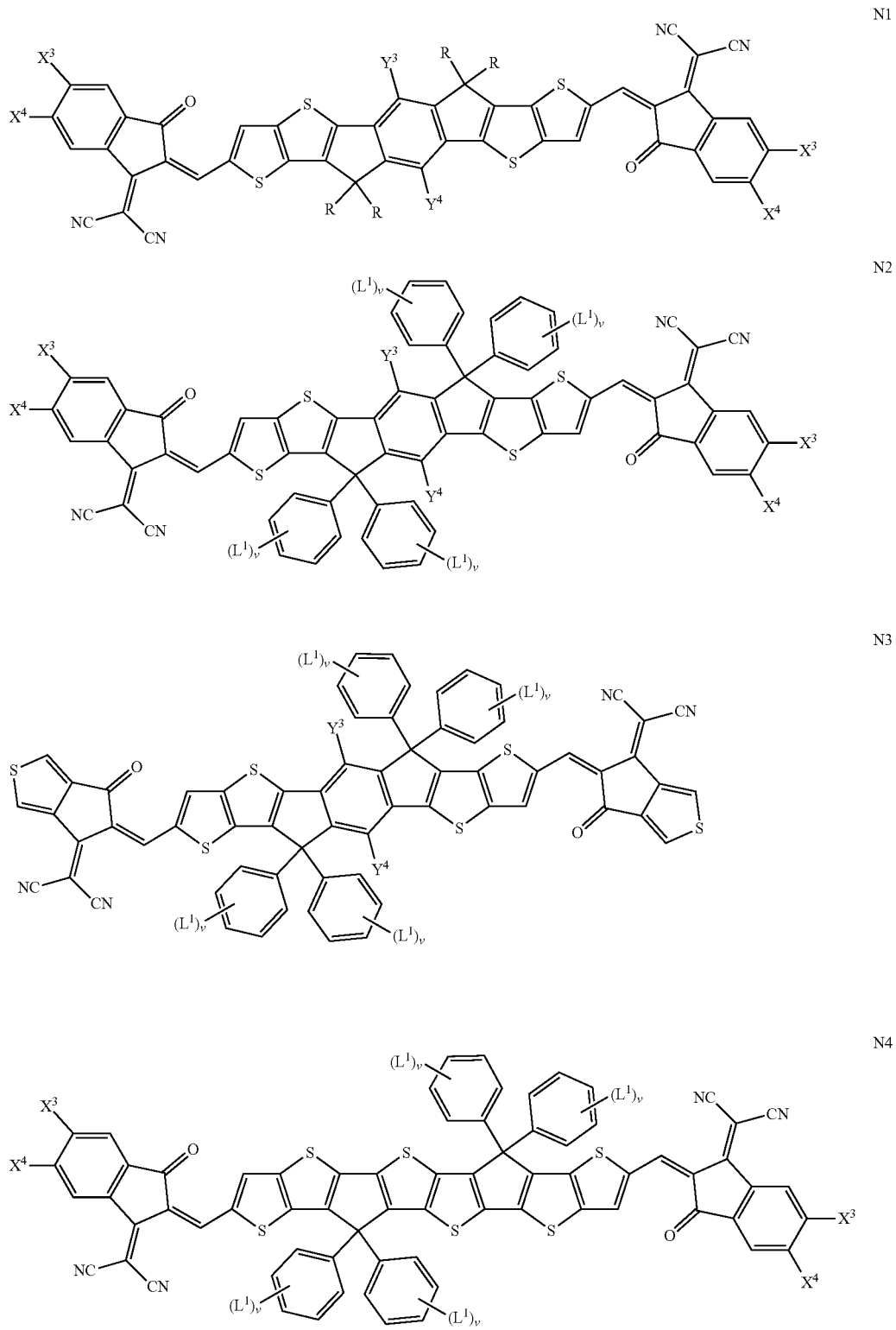

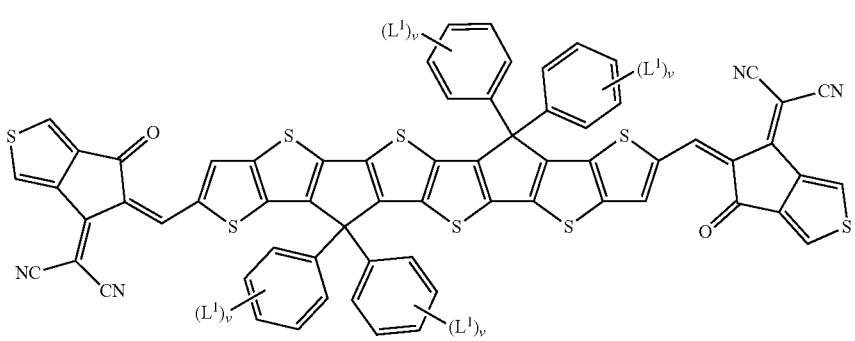

N5 wherein $X^3$ and $X^4$ denote H, F or Cl, $Y^3$ and $Y^4$ denote H or F, Ln is straight-chain or branched alkyl or alkoxy with 1 to 16 C atoms that is optionally fluorinated, R has one of the meanings of L, v is 1 or 2, and the benzene rings attached to the cyclopentadiene rings are preferably substituted with L in 4-position (if v is 1) or in 3- and 5-positions (if v is 2).

Further preferred NFAs are selected from naphthalene or perylene derivatives. Suitable and preferred naphthalene or perylene derivatives for use as n-type compounds are described for example in *Adv. Sci.* 2016, 3, 1600117, *Adv. Mater.* 2016, 28, 8546-8551, *J. Am. Chem. Soc.*, 2016, 138, 7248-7251 and *J. Mater. Chem. A*, 2016, 4, 17604.

Further preferably the n-type semiconductor or second n-type semiconductor in the composition of the aforementioned embodiments is selected from graphene, metal oxides, like for example, ZnOx, TiOx, ZTO, MoOx, NiOx, quantum dots, like for example, CdSe or CdS, or conjugated polymers, like for example a polynaphthalenediimide or polyperylenediimide as described, for example, in WO2013142841 A1.

The OPV or OPD device according to the present invention preferably comprises a first transparent or semi-transparent electrode on a transparent or semi-transparent substrate on one side of the active layer, and a second metallic or semi-transparent electrode on the other side of the active layer.

Preferably, the photoactive layer in an OPV or OPD device according to the present invention is further blended with additional organic and inorganic compounds to enhance the device properties. For example, metal particles such as Au or Ag nanoparticles or Au or Ag nanoprisms for enhancements in light harvesting due to near-field effects (i.e. plasmonic effect) as described, for example in *Adv. Mater.* 2013, 25 (17), 2385-2396 and Adv. Ener. Mater. 10.1002/aenm.201400206, a molecular dopant such as 2,3,5,6-tetrafluoro-7,7,8,8-tetracyanoquinodimethane for enhancement in photoconductivity as described, for example in *Adv. Mater.* 2013, 25(48), 7038-7044, or a stabilising agent consisting of a UV absorption agent and/or anti-radical agent and/or antioxidant agent such as 2-hydroxybenzophenone, 2-hydroxyphenylbenzotriazole, oxalic acid anilides, hydroxyphenyl triazines, merocyanines, hindered phenol, N-aryl-thiomorpholine, N-aryl-thiomorpholine-1-oxide, N-aryl-thiomorpholine-1,1-dioxide, N-aryl-thiazolidine, N-aryl-thiazolidine-1-oxide, N-aryl-thiazolidine-1,1-dioxide and 1,4-diazabicyclo[2.2.2]octane as described, for example, in WO2012095796 A1 and in WO2013021971 A1.

The device preferably may further comprise a UV to visible photo-conversion layer such as described, for example, in *J. Mater. Chem.* 2011, 21, 12331 or a NIR to visible or IR to NIR photo-conversion layer such as described, for example, in *J. Appl. Phys.* 2013, 113, 124509.

Further preferably the OPV or OPD device comprises, between the active layer and the first or second electrode, one or more additional buffer layers acting as hole transporting layer and/or electron blocking layer, which comprise a material such as metal oxides, like for example, ZTO, $MoO_x$, $NiO_x$, a doped conjugated polymer, like for example PEDOT:PSS and polypyrrole-polystyrene sulfonate (PPy:PSS), a conjugated polymer, like for example polytriarylamine (PTAA), an organic compound, like for example substituted triaryl amine derivatives such as N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), graphene based materials, like for example, graphene oxide and graphene quantum dots or alternatively as hole blocking layer and/or electron transporting layer, which comprise a material such as metal oxide, like for example, $ZnO_x$, $TiO_x$, AZO (aluminium doped zinc oxide), a salt, like for example LiF, NaF, CsF, a conjugated polymer electrolyte, like for example poly[3-(6-trimethylammoniumhexyl) thiophene], poly(9,9-bis(2-ethylhexyl)-fluorene]-b-poly[3-(6-trimethylammoniumhexyl)thiophene], or poly[(9,9-bis (3'-(N,N-dimethylamino)propyl)-2,7-fluorene)-alt-2,7-(9,9-dioctylfluorene)], a polymer, like for example poly (ethyleneimine) or crosslinked N-containing compound derivatives or an organic compound, like for example tris (8-quinolinolato)-aluminium(II) ($Alq_3$), phenanthroline derivative or $C_{60}$ or $C_{70}$ based fullerenes, like for example, as described in *Adv. Energy Mater.* 2012, 2, 82-86.

In a composition comprising a small molecule compound according to the present invention and further comprising a polymer, the ratio polymer:small molecule compound is preferably from 5:1 to 1:5 by weight, more preferably from 1:1 to 1:3 by weight, most preferably 1:1 to 1:2 by weight.

In a composition comprising a polymer compound according to the present invention and further comprising a fullerene or modified fullerene, the ratio polymer:fullerene is preferably from 5:1 to 1:5 by weight, more preferably from 2:1 to 1:3 by weight, most preferably 1:1 to 1:2 by weight.

The composition according to the present invention may also comprise polymeric binder, preferably from 5 to 95% by weight. Examples of binder include polystyrene (PS), polypropylene (PP), polydimethylsilane (PDMS), and polymethylmethacrylate (PMMA).

To produce thin layers in BHJ OPV devices the compounds, compositions and formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letterpress printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

In the preparation of a formulation according to the present invention, suitable solvents are preferably selected to ensure full dissolution of both the p-type and n-type component, and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to chlorobenzene, 1,2-dichlorobenzene, chloroform, 1,2-dichloroethane, dichloromethane, carbon tetrachloride, toluene, cyclohexanone, ethylacetate, tetrahydrofuran, anisole, 2,4-dimethylanisole, 1-methylnaphthalene, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, 1,5-dimethyltetraline, propiophenone, acetophenone, tetraline, 2-methylthiophene, 3-methylthiophene, decaline, indane, methyl benzoate, ethyl benzoate, mesitylene and combinations thereof.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
optionally a substrate,
a high work function electrode, preferably comprising a metal oxide, like for example ITO and FTO, serving as anode,
an optional conducting polymer layer or hole transport layer, preferably comprising an organic polymer or polymer blend, for example PEDOT:PSS (poly(3,4-ethylenedioxythiophene): poly(styrene-sulfonate), substituted triaryl amine derivatives, for example, TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine),
a layer, also referred to as "photoactive layer", comprising a p-type and an n-type organic semiconductor, which can exist for example as a p-type/n-type bilayer or as distinct p-type and n-type layers, or as blend or p-type and n-type semiconductor, forming a BHJ,
optionally a layer having electron transport properties, for example comprising LiF, $TiO_x$, $ZnO_x$, PFN, a poly (ethyleneimine) or crosslinked nitrogen containing compound derivatives or a phenanthroline derivatives
a low work function electrode, preferably comprising a metal like for example aluminum, serving as cathode,
wherein at least one of the electrodes, preferably the anode, is transparent to visible and/or NIR light, and
wherein the p-type or n-type semiconductor is a compound according to the present invention.

A second preferred OPV device according to the invention is an inverted OPV device and comprises the following layers (in the sequence from bottom to top):
optionally a substrate,
a high work function metal or metal oxide electrode, comprising for example ITO and FTO, serving as cathode, a layer having hole blocking properties, preferably comprising a metal oxide like $TiO_x$ or $ZnO_x$, or comprising an organic compound such as polymer like poly(ethyleneimine) or crosslinked nitrogen containing compound derivatives or phenanthroline derivatives,
a photoactive layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ,
an optional conducting polymer layer or hole transport layer, preferably comprising an organic polymer or polymer blend, for example of PEDOT:PSS, nafion or substituted triaryl amine derivatives, for example TBD or NBD,
an electrode comprising a high work function metal like for example silver, serving as anode,
wherein at least one of the electrodes, preferably the cathode, is transparent to visible and/or NIR light, and
wherein the p-type or n-type semiconductor is a compound according to the present invention.

In the OPV devices of the present invention the p-type and n-type semiconductor materials are preferably selected from the materials, like the compound/polymer or compound/polymer/fullerene systems as described above.

When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater,* 2004, 14(10), 1005. An optional annealing step may be then necessary to optimize blend morphology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, 1-chloronaphthalene, N,N-dimethylformamide, dimethylacetamide, dimethylsulfoxide and other additives have been used to obtain high-efficiency solar cells. Examples are disclosed in J. Peet, et al, *Nat. Mater.,* 2007, 6, 497 or Frechet et al. *J. Am. Chem. Soc.,* 2010, 132, 7595-7597.

Another preferred embodiment of the present invention relates to the use of a compound or composition according to the present invention as dye, hole transport layer, hole blocking layer, electron transport layer and/or electron blocking layer in a DSSC or a perovskite-based solar cells, and to a DSSC or perovskite-based solar cells comprising a compound composition or polymer blend according to the present invention.

DSSCs and perovskite-based DSSCs can be manufactured as described in the literature, for example in Chem. Rev. 2010, 110, 6595-6663, Angew. Chem. Int. Ed. 2014, 53, 2-15 or in WO2013171520A1 The polymers and compositions of the present invention are also suitable for use in the semiconducting channel of an OFET. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound or composition according to the present invention. Other features of the OFET are well known to those skilled in the art.

OFETs where an OSC material is arranged as a thin film between a gate dielectric and a drain and a source electrode, are generally known, and are described for example in U.S. Pat. Nos. 5,892,244, 5,998,804, 6,723,394 and in the references cited in the background section. Due to the advantages, like low cost production using the solubility properties of the polymers according to the invention and thus the processability of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
  a source electrode,
  a drain electrode,
  a gate electrode,
  a semiconducting layer,
  one or more gate insulator layers,
  optionally a substrate.
  wherein the semiconductor layer comprises a compound or composition according to the present invention.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the polymers and compositions according to the invention can be used in OLEDs, e.g. as the active display material in a flat panel display applications, or as backlight of a flat panel display like e.g. a liquid crystal display. Common OLEDs are realized using multilayer structures.

An emission layer is generally sandwiched between one or more electron-transport and/or hole-transport layers. By applying an electric voltage electrons and holes as charge carriers move towards the emissive layer where their recombination leads to the excitation and hence luminescence of the lumophor units contained in the emission layer.

The polymers and compositions according to the invention can be employed in one or more of a buffer layer, electron or hole transport layer, electron or hole blocking layer and emissive layer, corresponding to their electrical and/or optical properties. Furthermore their use within the emissive layer is especially advantageous, if the polymers according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the polymers and compositions according to the present invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of a compound according to the present invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2+}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, ($NO_2^+$) ($SbF_6^-$), ($NO_2^+$) ($SbCl_6^-$), ($NO_2^+$) ($BF_4^-$), $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of a compound according to the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The polymers and compositions according to the present invention may also be suitable for use in organic plasmon-emitting diodes (OPEDs), as described for example in Koller et al., *Nat. Photonics,* 2008, 2, 684.

According to another use, the polymers according to the present invention can be used alone or together with other materials in or as alignment layers in LCD or OLED devices, as described for example in US 2003/0021913. The use of polymers according to the present invention as charge transport material can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The polymers according to the present invention may also be combined with photoisomerisable compounds and/or chromophores for use in or as photoalignment layers, as described in US 2003/0021913 A1.

According to another use the polymers and compositions according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. Sci. U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention.

Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. Values of the dielectric constant ε ("permittivity") refer to values taken at 20° C. and 1,000 Hz.

The invention will now be described in more detail by reference to the following examples, which are illustrative only and do not limit the scope of the invention.

Example 1

Polymer 1 was prepared as follows:

Polymer 1

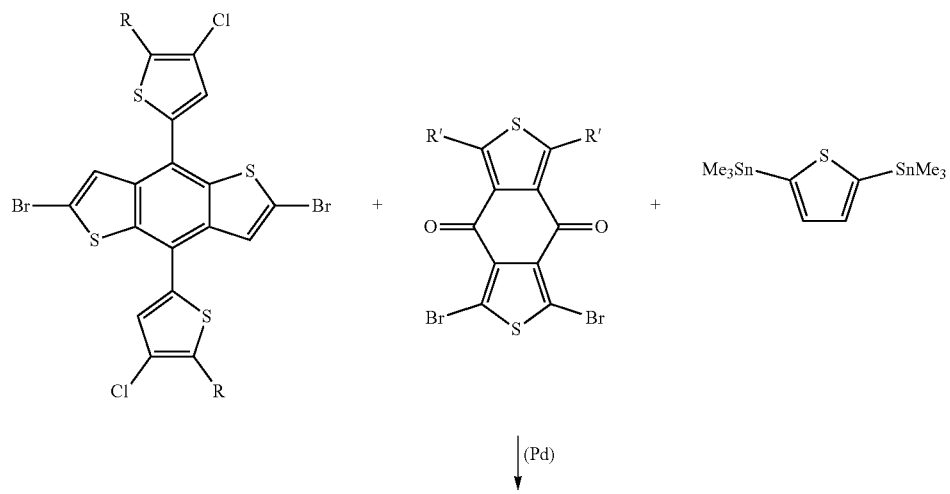

-continued

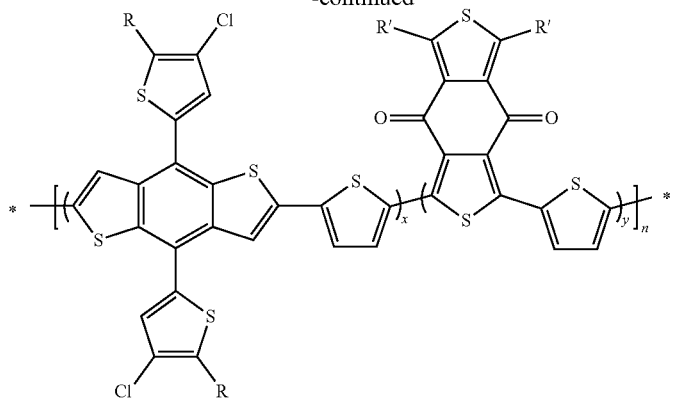

R, R' = 2-Ethylhexyl, x=y=0.5

5,11-dibromo-2,8-bis[4-chloro-5-(2-ethylhexyl)thiophen-2-yl]-4,10-dithiatricyclo[7.3.0.0³,⁷]dodeca-1,3(7), 5,8,11-pentaene (216.28 mg; 0.27 mmol), 4,6-dibromo-10,12-bis(2-butyloctyl)-5,11-dithiatricyclo[7.3.0.0³,⁷]dodeca-1(12),3,6,9-tetraene-2,8-dione (191.86 mg; 0.27 mmol), trimethyl[5-(trimethylstannyl)thiophen-2-yl]stannane (220.00 mg; 0.54 mmol), tris(dibenzylideneacetone)dipalladium(0) (4.92 mg; 0.01 mmol) and tri(o-tolyl)phosphine (13.07 mg; 0.04 mmol). The reaction mixture is degassed for 10 minutes and heated at 110° C. for 40 minutes before reaction is quenched by addition of bromo-benzene (1.1 cm³). Mixture is heated at 110° C. for additional 1 hour. Mixture is cooled to 60° C., poured into methanol (200 cm³) and filtered off. Crude product is purified by Soxhlet extraction using acetone, petroleum ether (40-60), cyclohexane and chloroform. The chloroform fraction is concentrated in vacuo and precipitated into methanol (300 cm³). Black solid (305 mg, 91% yield) is collected by filtration. GPC (50° C., chlorobenzene): Mn=103.6 kDa; Mw=394.1 kDa; PDI=3.80

Examples 2-6

The following polymers were prepared in analogy to Example 1:

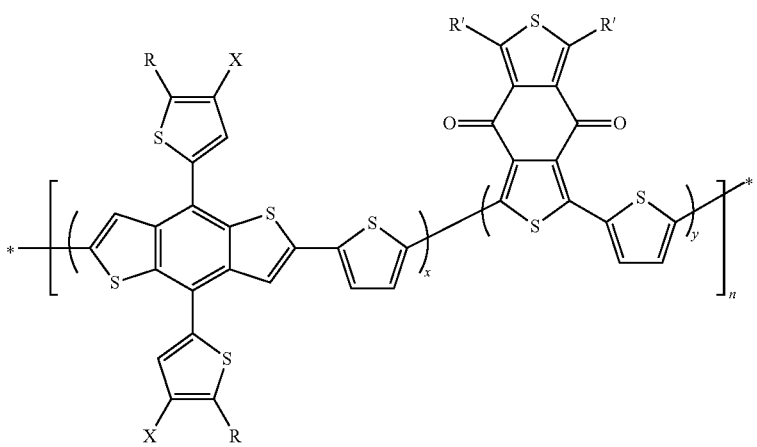

| Polymer | X | R | R' | x | y |
| --- | --- | --- | --- | --- | --- |
| 2 | Cl | 2-Ethylhexyl | 2-Ethylhexyl | 0.4 | 0.6 |
| 3 | Cl | 2-Ethylhexyl | 2-Ethylhexyl | 0.6 | 0.4 |
| 4 | F | 2-Ethylhexyl | 2-Ethylhexyl | 0.5 | 0.5 |
| 5 | Cl | 2-Ethylhexyl | 2-Butyloctyl | 0.5 | 0.5 |
| 6 | H | 2-Ethylhexyl | 2-Ethylhexyl | 0.5 | 0.5 |

Reaction conditions for preparation of polymers 2-6 are shown below

| Polymer | Rection temp [° C.] | Reation time [minutes] | Mn [kDa] | Mw [kDa] | PDI | Yield [%] |
|---|---|---|---|---|---|---|
| 2 | 120 | 30 | 68.9 | 380.0 | 5.51 | 95 |
| 3 | 120 | 30 | 96.3 | 421.5 | 4.37 | 99 |
| 4 | 110 | 30 | 45.2 | 457.7 | 10 | 43 |
| 5 | 110 | 180 | 53.5 | 212.0 | 3.96 | 91 |
| 6 | 110 | 120 | 54.8 | 287.5 | 5.25 | 85 |

Example 7

Preparation of Compound 1

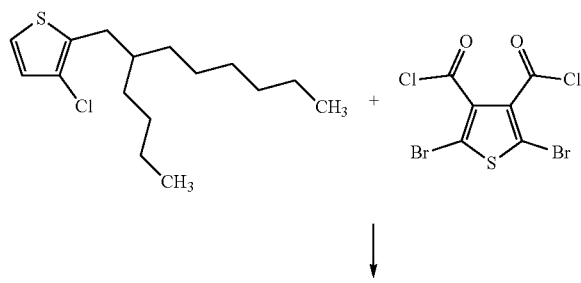

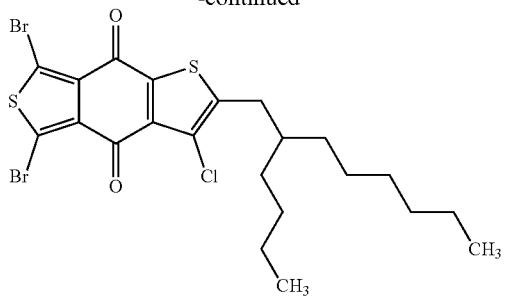

Trichloro aluminium (1.16 g; 8.72 mmol) is added as a single portion to a solution of dibromothiophene-3,4-dicarbonyl dichloride (0.8 g; 2.18 mmol) in dichloromethane (8 cm$^3$) cooled in an ice bath to 0° C. A solution of 2-(2-butyloctyl)-3-chlorothiophene (0.63 g; 2.18 mmol) dissolved in dichloromethane (5 cm$^3$) is added portion wise. The solution is stirred for 3 hours and then poured onto ice. The aqueous phase is extracted with dichloromethane (10 cm$^3$) and the combined organic phases are washed with water, dried over magnesium sulphate and concentrated. The residue is purified by column chromatography eluting with a gradient of 40-60% dichloromethane in 40:60 petroleum ether to yield the title compound as a yellow waxy solid (60 mg, 5%). $^1$H NMR (400 MHz, CDCl$_3$) 2.79 (2H, d, J 7.0), 1.76-1.66 (1H, m), 1.28-1.17 (16H, m), 0.85-0.72 (6H, m).

Preparation of Polymer 7

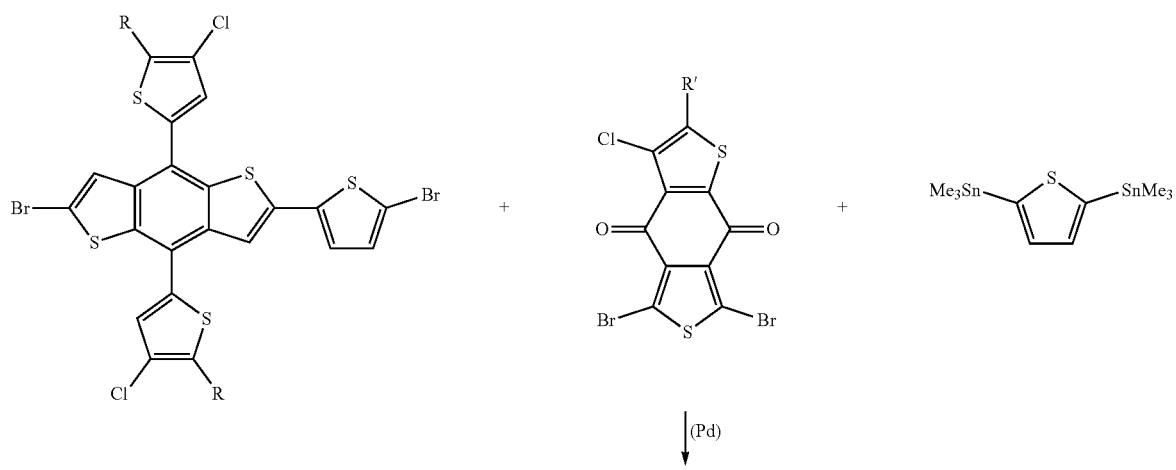

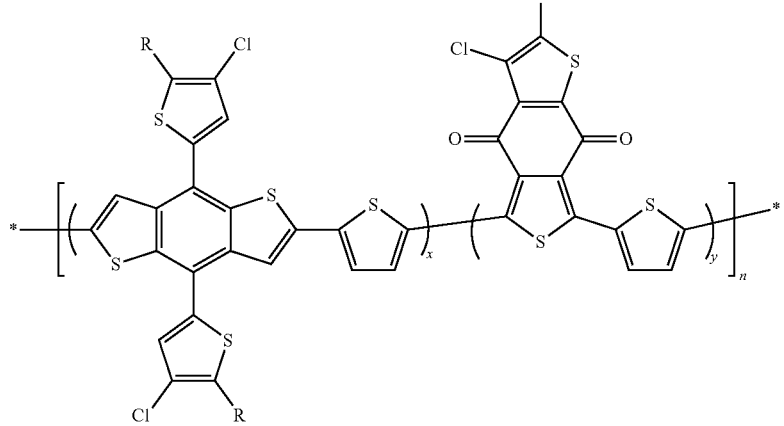

Polymer 7

R = 2-Ethylhexyl, R' = 2-butyloctyl, x = y = 0.5

5,11-dibromo-2,8-bis[4-chloro-5-(2-ethylhexyl)thiophen-2-yl]-4,10-dithiatricyclo[7.3.0.0$^3$,$^7$]dodeca-1,3(7), 5,8,11-pentaene (88.36 mg; 0.11 mmol), 10,12-dibromo-5-(2-butyloctyl)-6-chloro-4,11-dithiatricyclo[7.3.0.0$^3$,$^7$]dodeca-1(12), 3(7), 5,9-tetraene-2,8-dione (63.70 mg; 0.11 mmol), trimethyl[5-(trimethylstannyl)thiophen-2-yl]stannane (89.88 mg; 0.22 mmol) tris(dibenzylideneacetone)dipalladium(0) (1.00 mg; 0.00 mmol) and tri(o-tolyl)phosphine (2.67 mg; 0.01 mmol) are dissolved in toluene (7 cm$^3$). The reaction mixture is degassed for 10 minutes and heated to 110° C. for 25 minutes. Toluene (5 cm$^3$) is added followed by addition of bromobenzene (0.7 cm$^3$). Mixture is stirred for 60 minutes. Upon cooling to 40° C., crude polymer is precipitated into methanol (150 cm$^3$). Crude polymer was extracted with acetone, petroleum ether (40-60), cyclohexane, chloroform and chlorobenzene. Chlorobenzene fraction is concentrated in vacuo, precipitated into methanol (150 cm$^3$) and collected by filtration. Polymer is achieved as black solid (15 mg; 22% yield). Polymer was not sufficiently soluble to perform GPC analyses at 50° C.

Comparison Example 1+2

Alternating polymers C1 and C2 were prepared in analogy to Example 1 (R, R'=2-Ethylhexyl)

Polymer C1

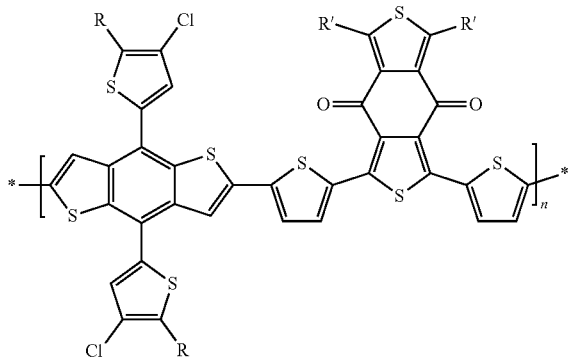

Polymer C2

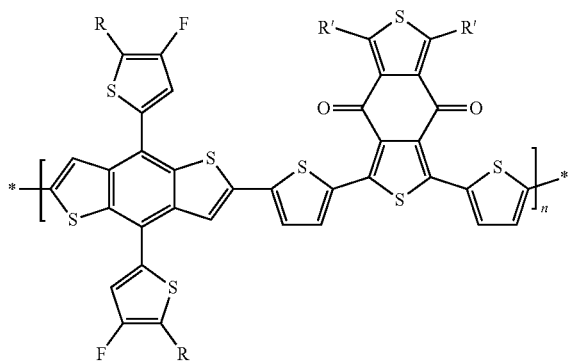

Use Example A

Current-voltage characteristics are measured using a Keithley 2400 SMU while the solar cells are illuminated by a Newport Solar Simulator at 100 mW·cm$^{-2}$ white light. The solar simulator is equipped with AM1.5G filters. The illumination intensity is calibrated using a Si photodiode. All the device preparation and characterization is done in a dry-nitrogen atmosphere.

Power conversion efficiency is calculated using the following expression $$\eta = \frac{V_{oc} \times J_{sc} \times FF}{P_{in}}$$

where FF is defined as $$FF = \frac{V_{max} \times J_{max}}{V_{oc} \times J_{sc}}$$

A1: Inverted Bulk Heterojunction Organic Photovoltaic Devices

Organic photovoltaic (OPV) devices are fabricated on pre-patterned ITO-glass substrates (13 Ω/sq.) purchased from LUMTEC Corporation. Substrates are cleaned using common solvents (acetone, iso-propanol, deionized-water) in an ultrasonic bath. A layer of commercially available aluminium zinc oxide (AlZnO, Nanograde) was applied as a uniform coating by doctor blade at 40° C. The AlZnO Films are then annealed at 100° C. for 10 minutes in air. Active material solutions (i.e. polymer+acceptor) are prepared to fully dissolve the solutes at a 25 mg·cm$^{-3}$ solution concentration. Thin films are blade-coated in air atmosphere to achieve active layer thicknesses between 50 and 800 nm as measured using a profilometer. A short drying period follows to ensure removal of any residual solvent.

Typically, blade-coated films are dried at 60° C. for 2 minutes on a hotplate. Next the devices are transferred into an air atmosphere. On top of the active layer 0.1 mL of a conducting polymer poly(ethylene dioxythiophene) doped with poly(styrene sulfonic acid) [PEDOT:PSS HTL 4083 (Heraeus)] was spread and uniformly coated by doctor blade at 70° C. Afterwards Ag (100 nm) cathodes are thermally evaporated through a shadow mask to define the cells.

Table 1 shows the formulation characteristics of the individual photoactive material solutions, comprising a polymer according to the invention as electron donor component and a non-fullerene acceptor (NFA) as electron acceptor component. The solvent is either o-xylene, or a mixture of o-xylene with 2,4-dimethylanisole in 80:20 ratio (v/v).

Structures of NFA compounds used in formulations are shown below

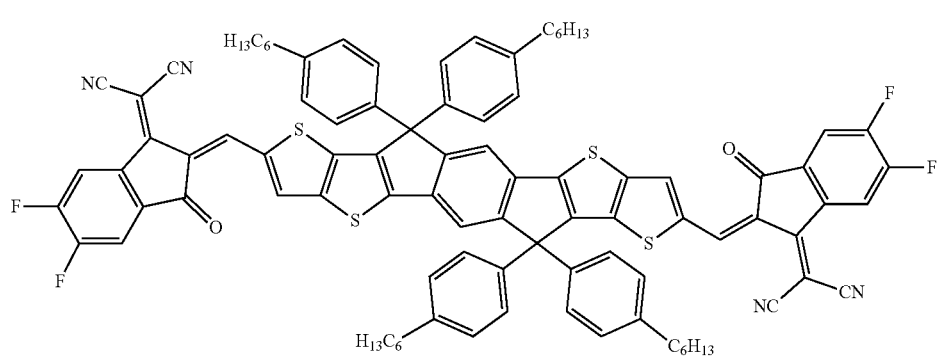

1

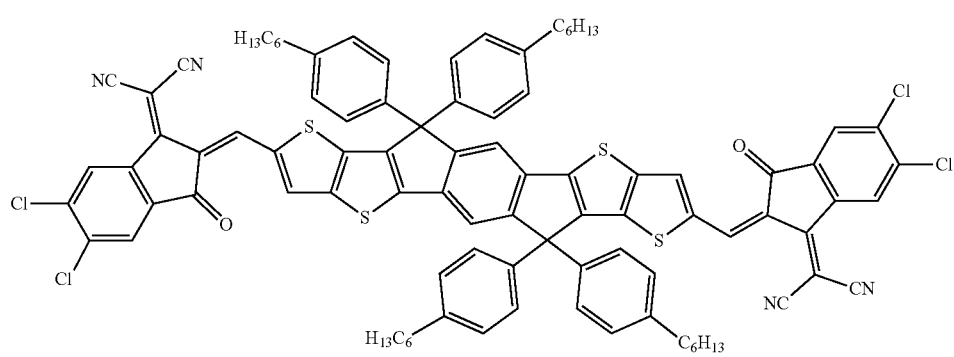

2

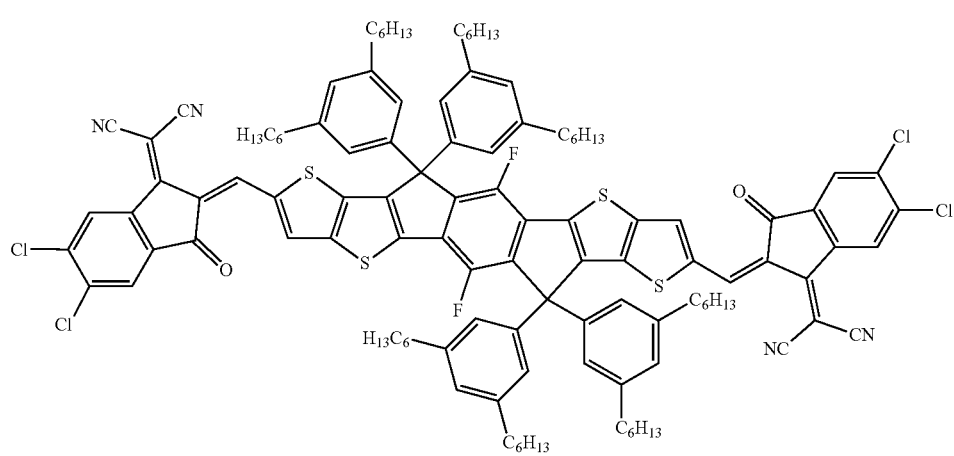

3

-continued
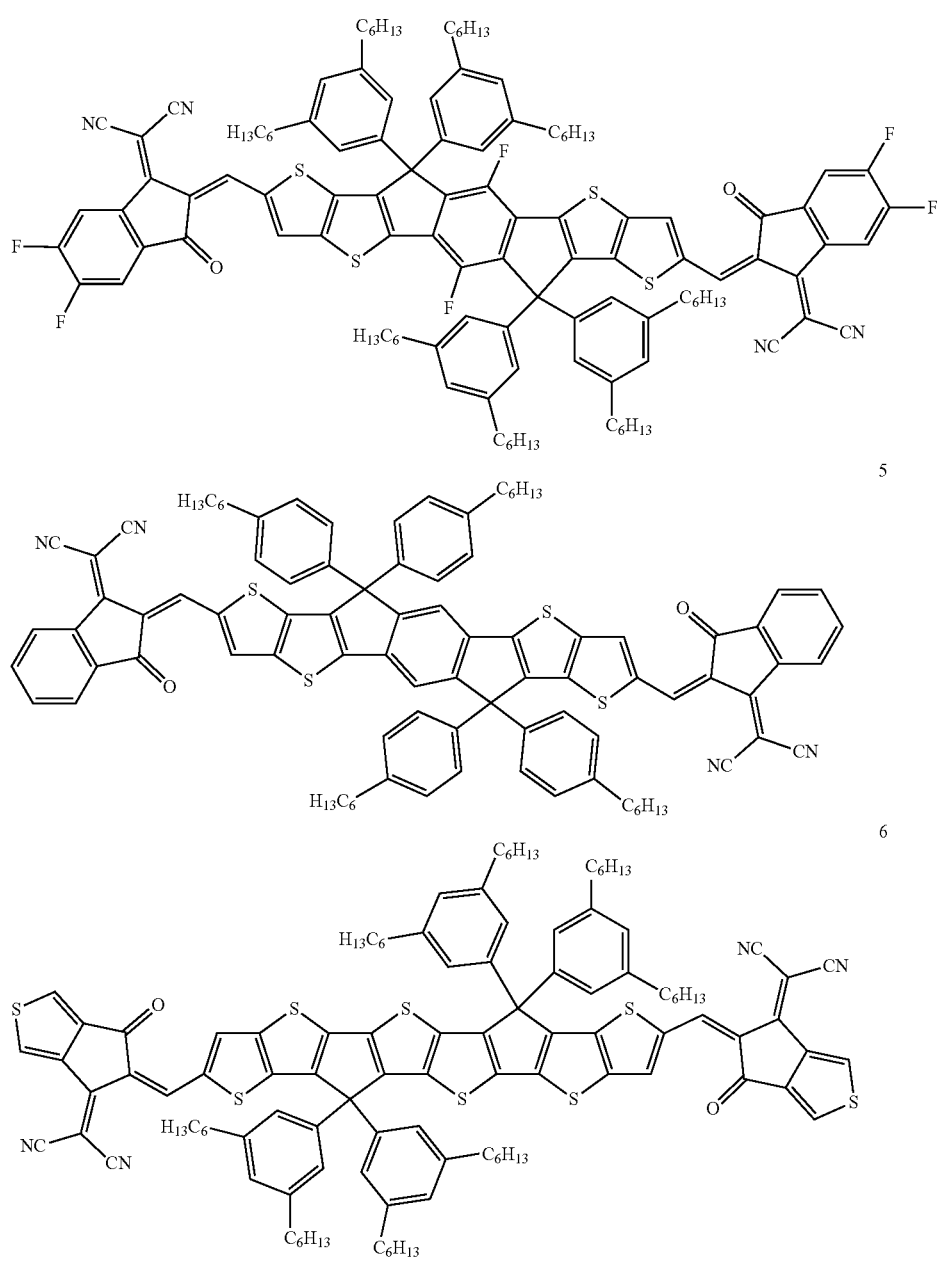
TABLE 1
Formulation characteristics (* indicates a comparison example)
| No. | Polymer | Acceptor | Ratio Polymer:Acceptor | Concen-tration g/L | Solvent |
|---|---|---|---|---|---|
| 1 | 1 | 2 | 1:1.3 | 23 | o-xylene |
| 2* | C1 | 2 | 1:1.3 | 23 | o-xylene |
| 3 | 1 | 4 | 1:1.3 | 23 | o-xylene |
| 4* | C1 | 4 | 1:1.3 | 23 | o-xylene |
| 5 | 1 | 3 | 1:1.3 | 23 | o-xylene |
| 6* | C1 | 3 | 1:1.3 | 23 | o-xylene |
| 7 | 4 | 1 | 1:1.3 | 23 | o-xylene |
| 8* | C2 | 1 | 1:1.3 | 23 | o-xylene |
| 9 | 2 | 1 | 1:1.3 | 23 | o-xylene |
| 10 | 2 | 4 | 1:1.3 | 23 | o-xylene |
| 11 | 3 | 1 | 1:1.3 | 23 | o-xylene |
| 12 | 3 | 2 | 1:1.3 | 23 | o-xylene |
| 13 | 3 | 4 | 1:1.3 | 23 | o-xylene |
| 14 | 4 | 2 | 1:1.3 | 23 | o-xylene |
| 15 | 4 | 3 | 1:1.3 | 23 | o-xylene |
| 16 | 5 | 2 | 1:1.3 | 23 | o-xylene |

TABLE 1-continued

Formulation characteristics (* indicates a comparison example)

| No. | Polymer | Acceptor | Ratio Polymer: Acceptor | Concen-tration g/L | Solvent |
| --- | --- | --- | --- | --- | --- |
| 17 | 5 | 3 | 1:1.3 | 23 | o-xylene |
| 18 | 6 | 5 | 1:1.3 | 23 | o-xylene |
| 19 | 6 | 6 | 1:1.3 | 18 | o-xylene |
| 20 | 7 | 4 | 1:1.3 | 18 | o-xylene |

A2: Inverted Device Properties

Table 2 shows the device characteristics for the individual OPV devices comprising a photoactive layer with a BHJ formed from the active material (acceptor/polymer) solutions of Table 1.

TABLE 2

Photovoltaic cell characteristics under simulated solar irradiation at 1 sun (AM1.5G) (* indicates a comparison example)
Average Performance

| No. | Voc mV | Jsc mA·cm$^{-2}$ | FF % | PCE % |
| --- | --- | --- | --- | --- |
| 1 | 800.0 | 19.4 | 67.3 | 9.2 |
| 2* | 785.0 | 16.6 | 67.2 | 8.5 |
| 3 | 860.0 | 16.8 | 68.3 | 8.7 |
| 4* | 875.0 | 15.5 | 64.3 | 8.5 |
| 5 | 810.0 | 17.9 | 58.7 | 8.4 |
| 6* | 805.0 | 17.2 | 56.4 | 7.5 |
| 7 | 800.0 | 16.2 | 58.8 | 7.4 |
| 8* | 805.0 | 15.0 | 54.4 | 6.4 |
| 9 | 875.0 | 12.6 | 47.2 | 5.1 |
| 10 | 890.0 | 15.9 | 56.0 | 7.7 |
| 11 | 850.0 | 15.0 | 49.9 | 6.1 |
| 12 | 785.0 | 18.5 | 57.0 | 7.2 |
| 13 | 850.0 | 16.0 | 50.4 | 6.7 |
| 14 | 710.0 | 17.9 | 60.3 | 7.3 |
| 15 | 785.0 | 15.9 | 59.4 | 7.2 |
| 16 | 875.0 | 15.7 | 51.7 | 6.7 |
| 17 | 850.0 | 16.4 | 55.7 | 7.6 |
| 18 | 780.0 | 15.1 | 47.0 | 5.5 |
| 19 | 685.0 | 14.4 | 33.9 | 3.3 |
| 20 | 785.0 | 16.0 | 44.3 | 5.5 |

From Table 2 it can be seen that all devices containing regio-random donor polymers 1 to 7 show good performance. It can also be seen that devices 1, 3, 5 and 7 containing regio-random donor polymers 1 or 4 show superior performance compared to devices 2, 4, 6 and 8 containing their regio-regular analogues C1 and C2, mainly due to higher short circuit current.

The invention claimed is:

1. A conjugated copolymer comprising one or more units of formula I and one or more units of formula II that are distributed in random sequence along the polymer backbone

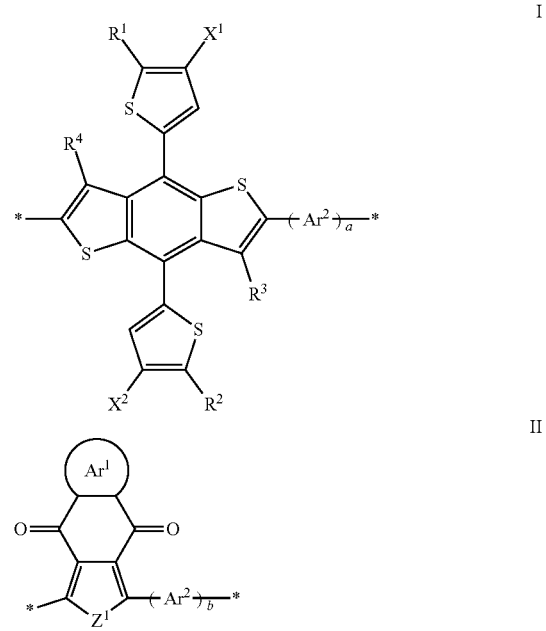

I

II wherein the individual radicals, independently of each other and on each occurrence identically or differently, have the following meanings $Ar^1$ is a group selected from the following formulae and their mirror images

A1a

A1b

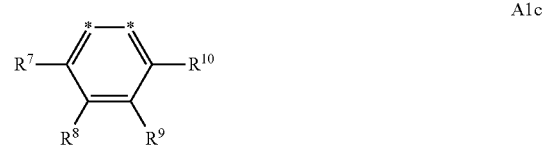

A1c $Ar^2$ is a group selected from the following formulae and their mirror images

A2a

A2b

-continued

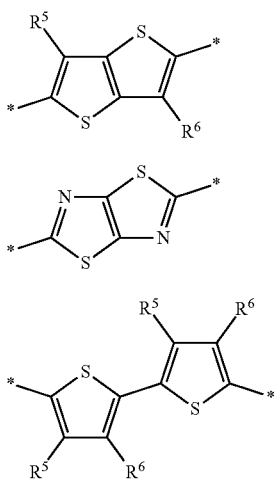
A2c
A2d
A2e

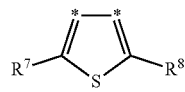
A1a1

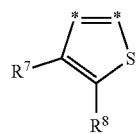
A1b1

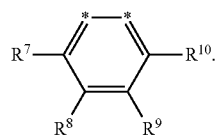
A1c $X^1$, $X^2$ are H, F, Cl or straight-chain or branched alkyl with 1 to 20 C atoms that is optionally fluorinated, W is S, O, Se, $CR^1R^2$ or $NR^1$, $R^{1-10}$ is H, F, Cl, straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^0$—, —$SiR^0R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl or heteroarylalkyl, wherein each of the aforementioned cyclic groups has 5 to 20 ring atoms, is mono- or polycyclic, does optionally contain fused rings, and is unsubstituted or substituted by one or more identical or different groups L, L is F, Cl, —CN, —NC, —NCO, —NCS, —OCN, —SCN, $R^0$, $OR^0$, $SR^0$, —C(=O)$X^0$, —C(=O)$R^0$, —C(=O)—$OR^0$, —O—C(=O)—$R^0$, —$NH_2$, —$NHR^0$, —$NR^0R^{00}$, —C(=O)$NHR^0$, —C(=O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with with 1 to 30 C atoms that is optionally substituted and optionally comprises one or more hetero atoms, $Y^1$, $Y^2$ are H, F, Cl or CN, $X^0$ halogen, $Z^1$ S, $R^0$, $R^{00}$ are H or straight-chain or branched alkyl with 1 to 20 C atoms that is optionally fluorinated, a, b are 1 or 2.

2. The conjugated polymer according to claim 1, characterized in that in the units of formula I $R^1$ and $R^2$ are selected from the group consisting of straight-chain or branched alkyl, alkoxy or thioalkyl having 1 to 30 C atoms and being optionally fluorinated.

3. The conjugated polymer according to claim 1, characterized in that in the units of formula II and its subformulae $Ar^1$ is selected from the following formulae and their mirror images 4. The conjugated polymer according to claim 1, characterized in the units of formula I and II are selected from the following subformulae:

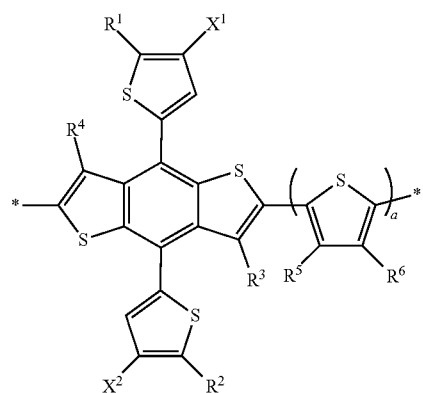
I1

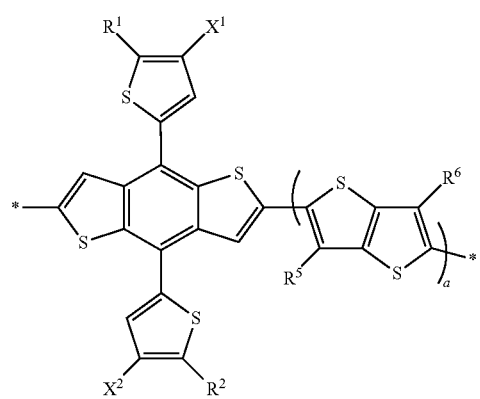
I2

-continued
I3
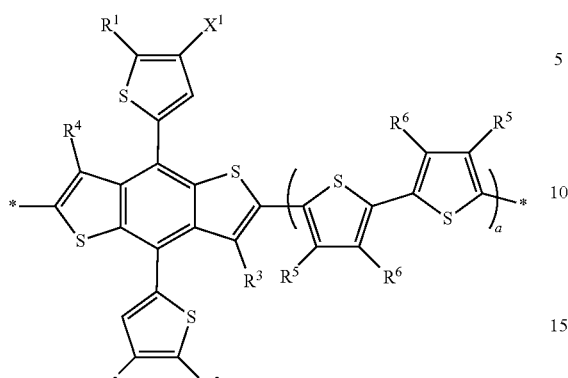
II1
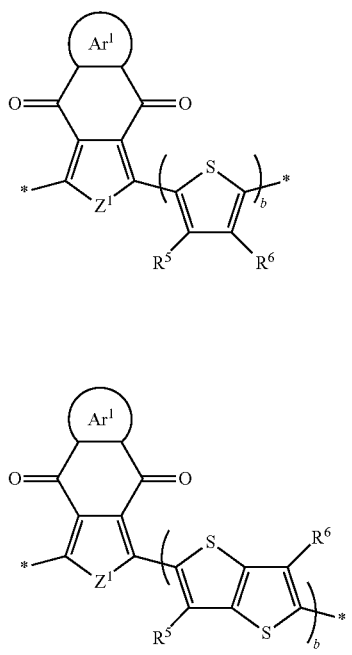
II2
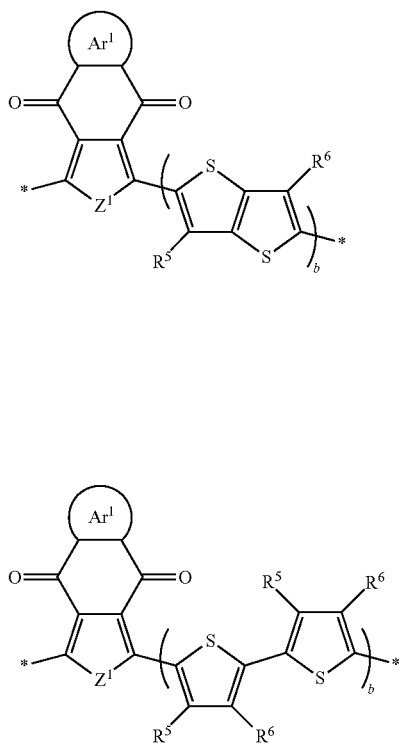
II3
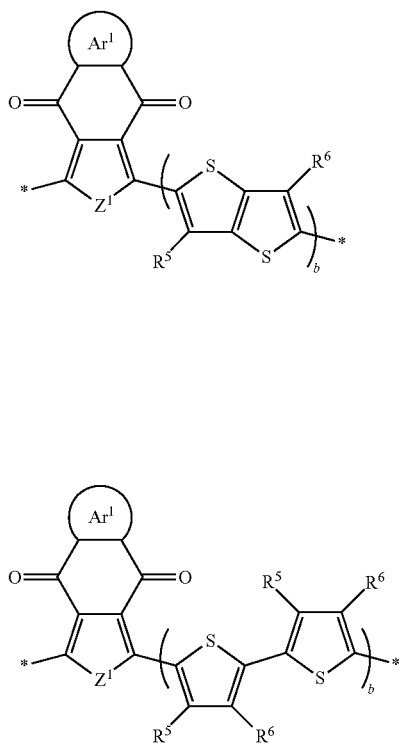
5. The conjugated polymer according to claim 1, characterized in that the units of formula I and II are selected from the following subformulae:
I1-1
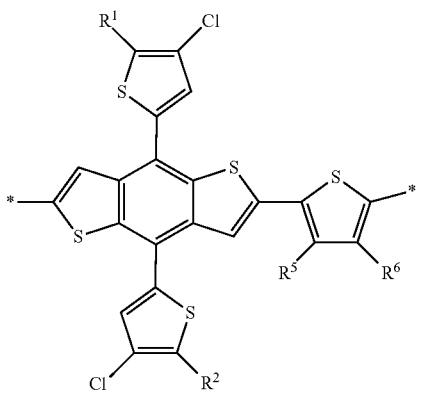
I2-1
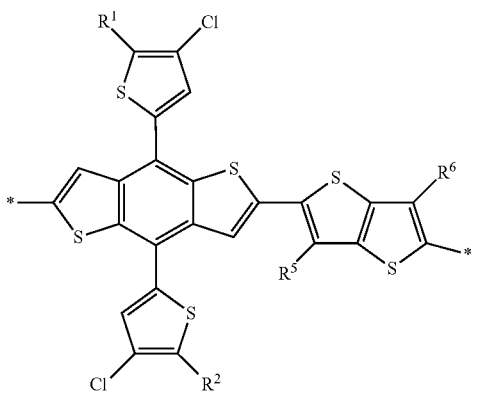
I3-1
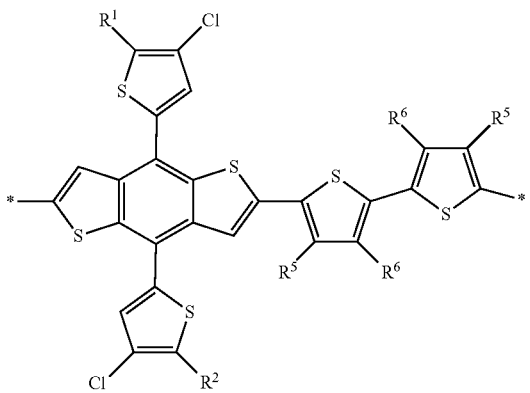
II1-1
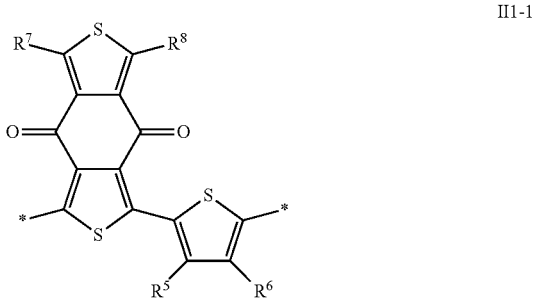

-continued
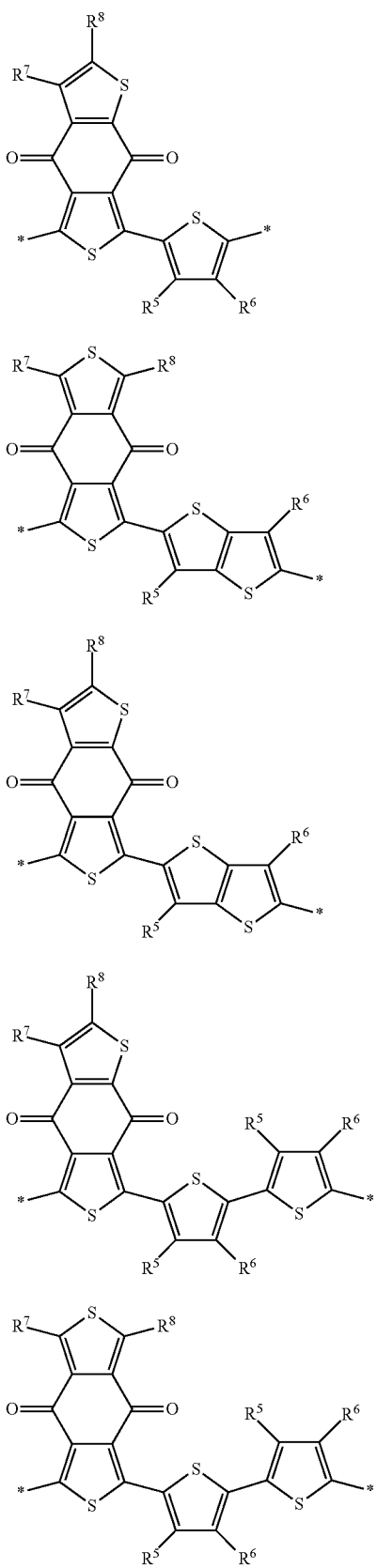
6. The conjugated polymer according to claim 1, characterized in that it is a random copolymer of formula III:
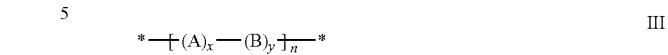
wherein the individual radicals, independently of each other and on each occurrence identically or differently, have the following meanings
A is a unit of the following formulae
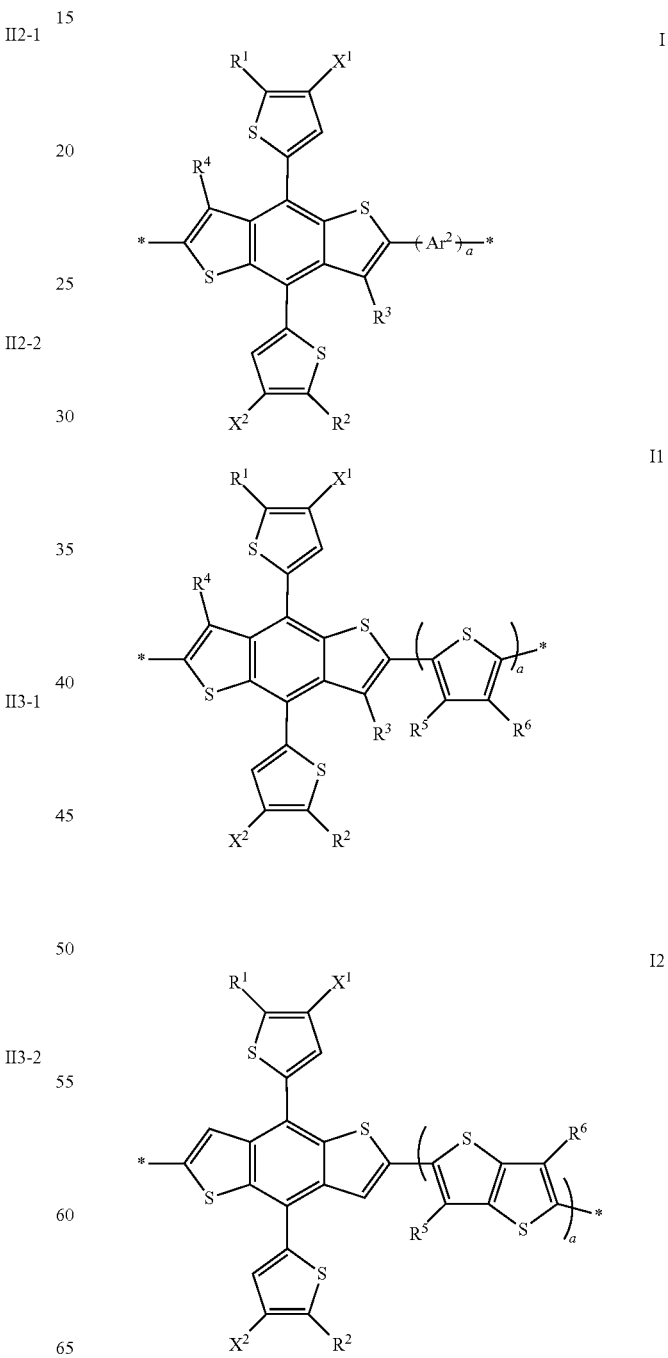

-continued
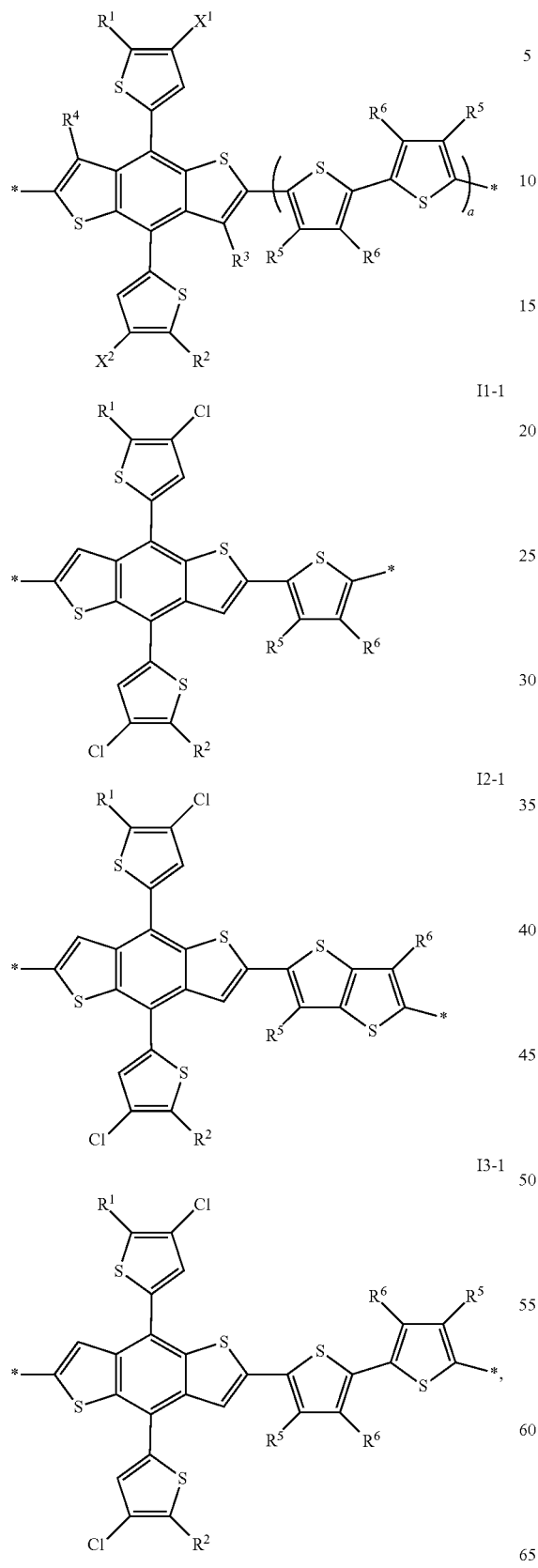
I3
I1-1
I2-1
I3-1
B is a unit of the following formulae
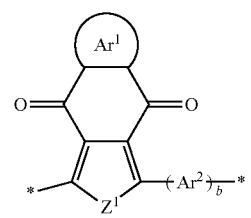
II
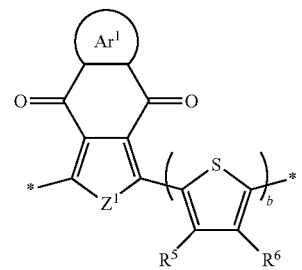
II1
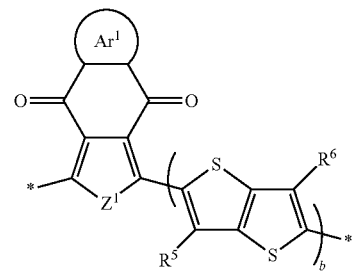
II2
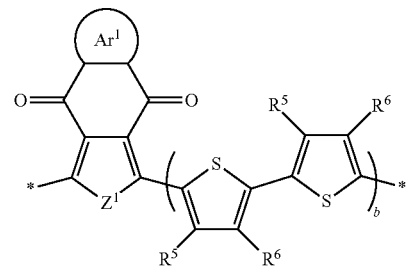
II3
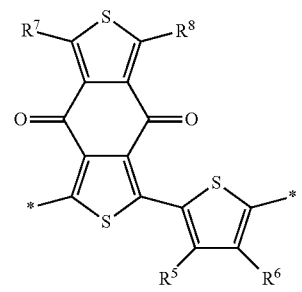
II1-1

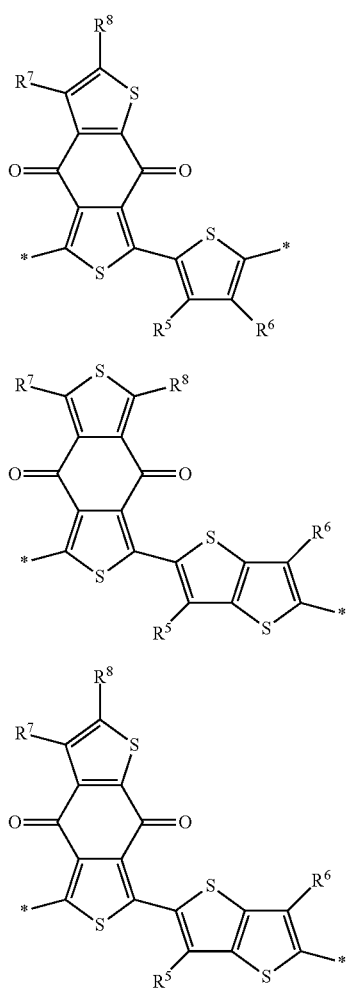
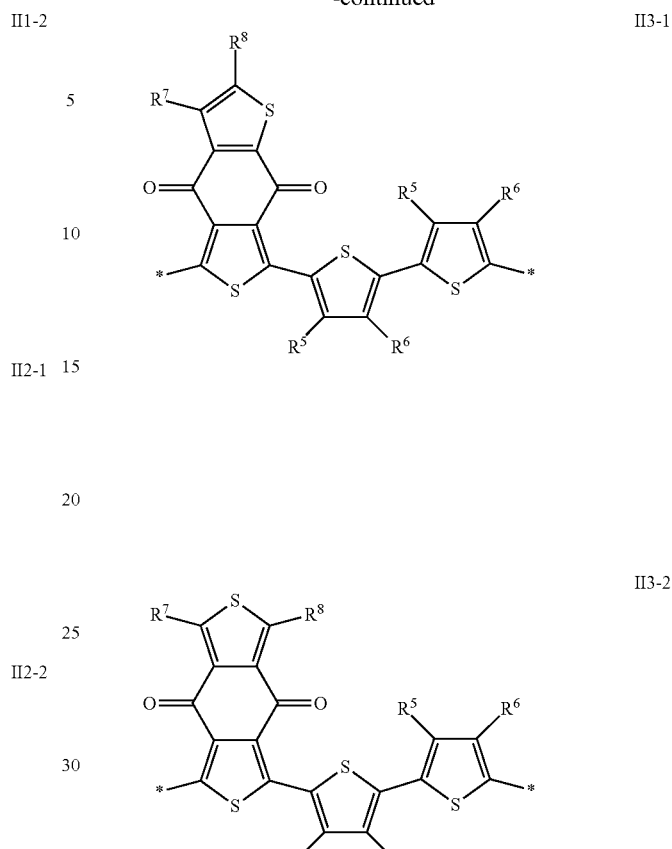
x, y are >0 and <1, with x+y=1, and
n is an integer>1.
7. The conjugated polymer according to claim 6, characterized in that it is selected from the following subformulae:
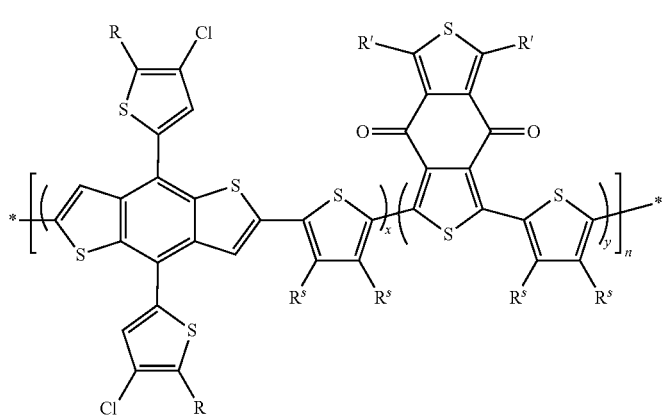

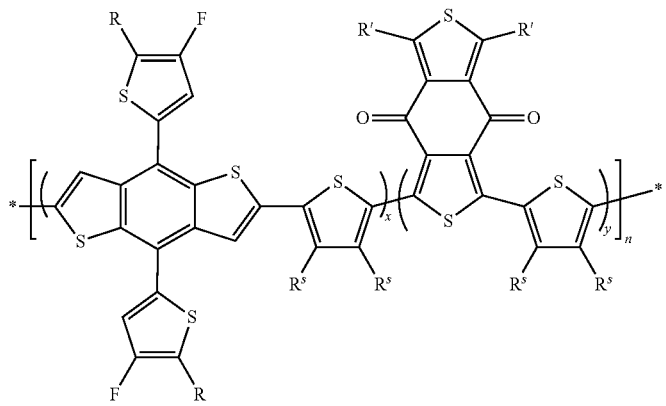
III2
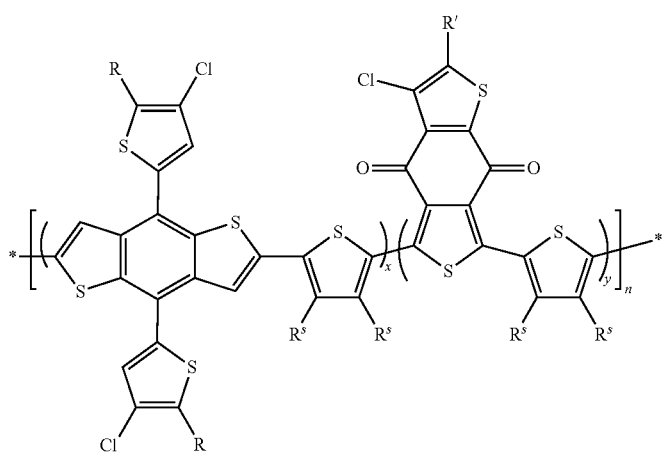
III3
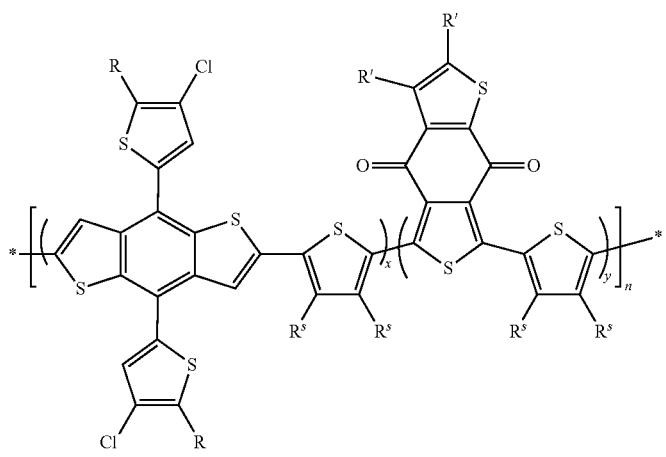
III4

-continued
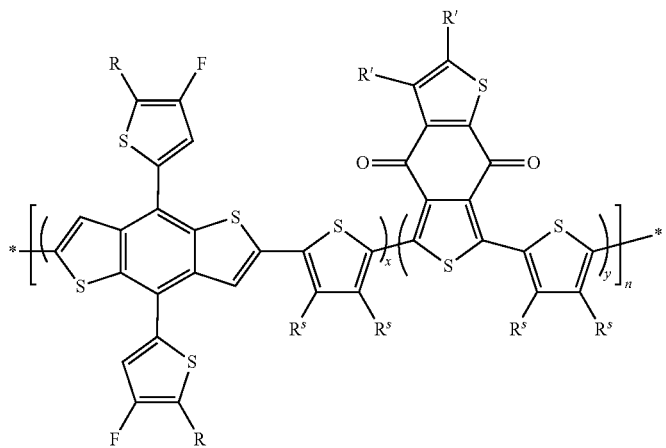
III5
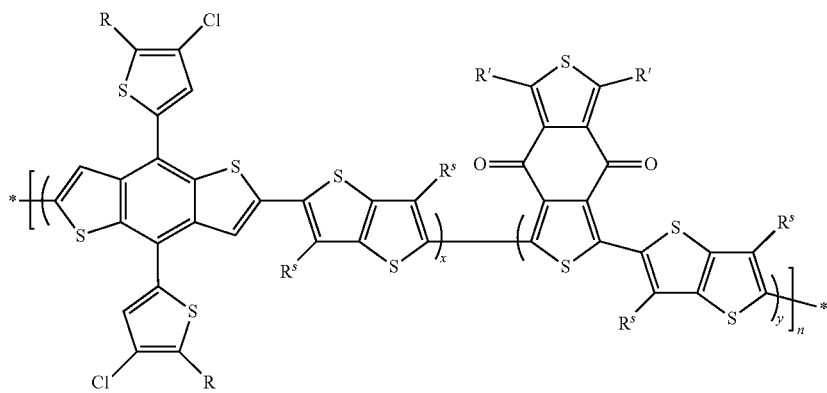
III6
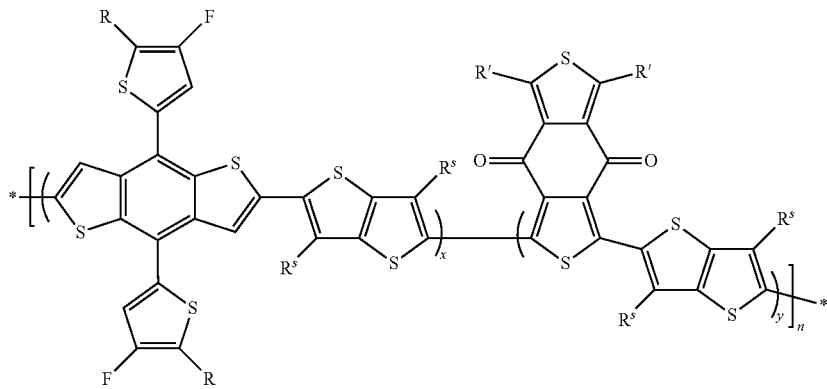
III7
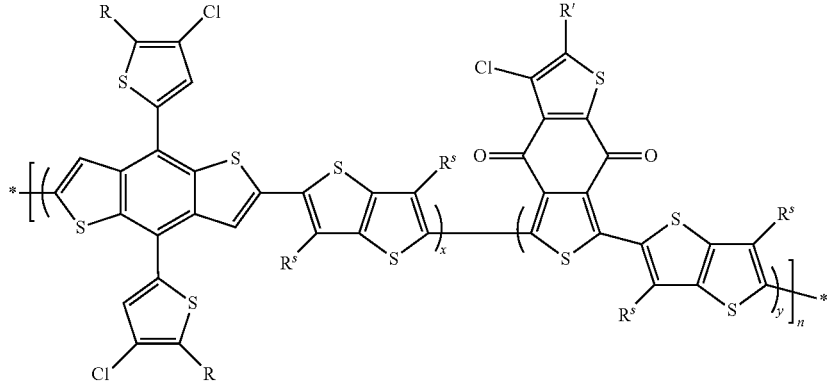
III8

-continued
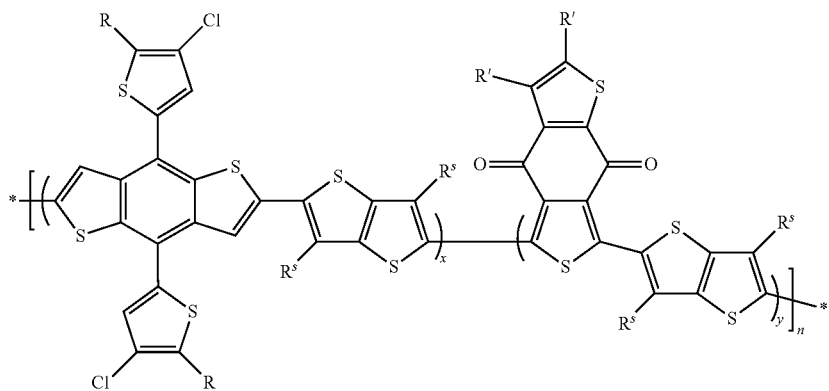
III9
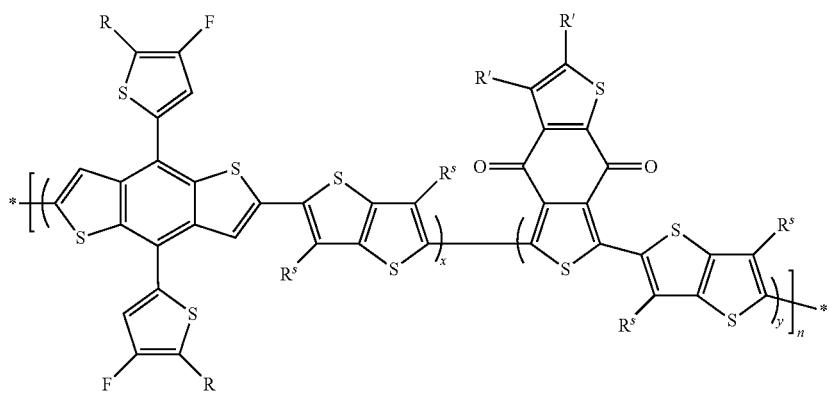
III10
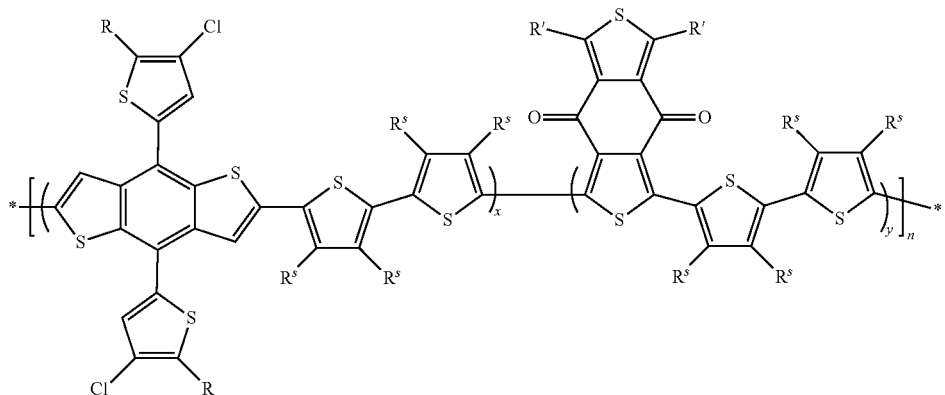
III11
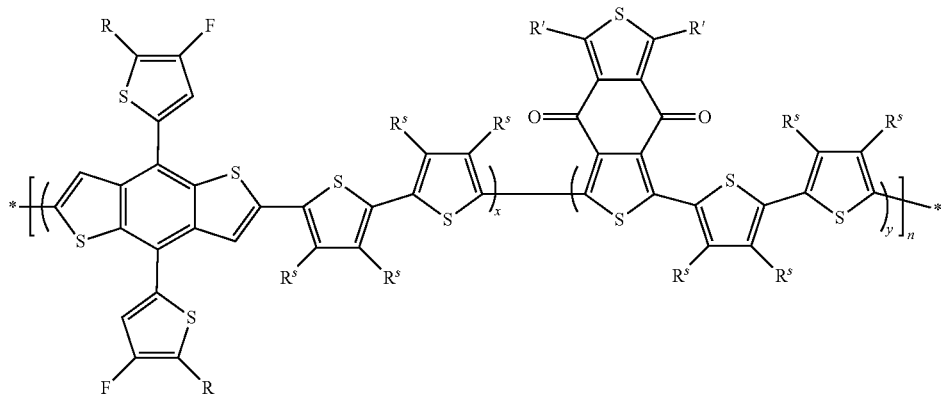
III12

-continued

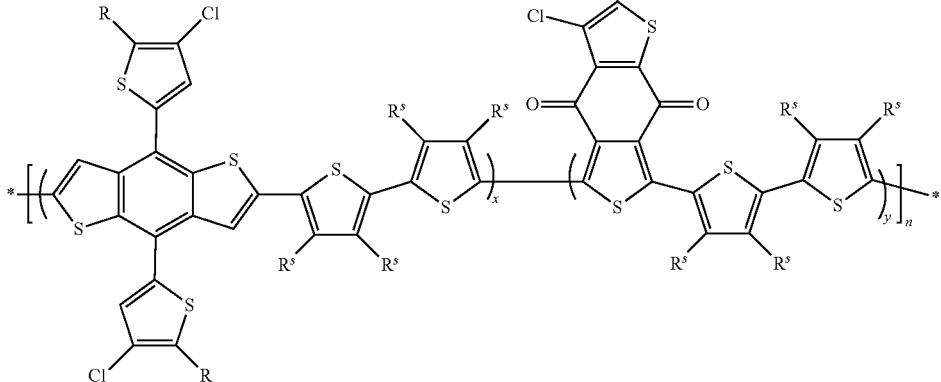
III13

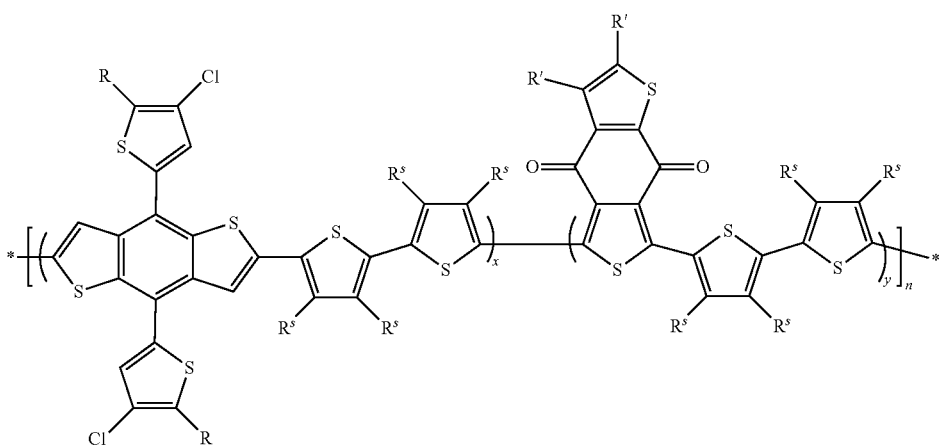
III-14

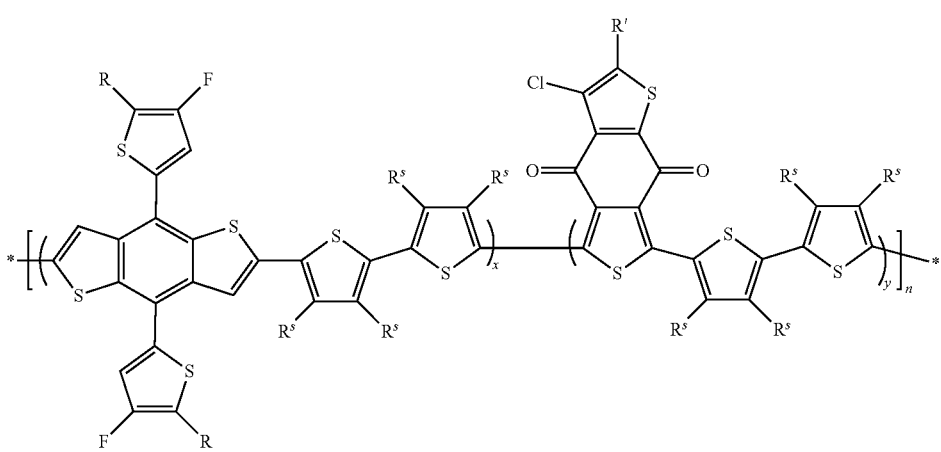
III-15 wherein

R, R', R$^S$ have on each occurrence identically or differently denote H, F, Cl, straight-chain, branched or cyclic alkyl with 1 to 30 C atoms, in which one or more CH$_2$ groups are optionally replaced by —O—, —S—, —C(=O)—, —C(=S)—, —C(=O)—O—, —O—C(=O)—, —NR$^0$—, —SiR$^0$R$^{00}$—, —CF$_2$—, —CR$^0$= =CR$^{00}$—, —CY$^1$=CY$^2$— or —C≡C— in such a manner that O and/or S atoms are not linked directly to one another, and in which one or more H atoms are optionally replaced by F, Cl, Br, I or CN, and in which one or more CH$_2$ or CH$_3$ groups are optionally replaced by a cationic or anionic group, or aryl, heteroaryl, arylalkyl or heteroarylalkyl, wherein each of the aforementioned cyclic groups has 5 to 20 ring atoms, is mono- or polycyclic, does optionally contain fused rings, and is unsubstituted or substituted by one or more identical or different groups L, L is F, Cl, —CN, —NC, —NCO, —NCS, —OCN, —SCN, $R^0$, $OR^0$, $SR^0$, —C(=O)$X^0$, —C(=O)$R^0$, —C(=O)—$OR^0$, —O—C(=O)—$R^0$, —$NH_2$, —$NHR^0$, —$NR^0R^{00}$, —C(=O)$NHR^0$, —C(=O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with with 1 to 30 C atoms that is optionally substituted and optionally comprises one or more hetero atoms, $Y^1$, $Y^2$ are H, F, Cl or CN, $X^0$ is halogen, $R^0$, $R^{00}$ are H or straight-chain or branched alkyl with 1 to 20 C atoms that is optionally fluorinated.

8. The conjugated polymer according to claim 1, characterized in that it is selected of formula IV $$R^{21}\text{-chain-}R^{22} \qquad \text{IV}$$

wherein "chain" denotes an oligomer or polymer chain selected from the following formulae, $$*\!-\!\!\left[\!(A)_x\!-\!(B)_y\!\right]_{\!n}\!\!-\!* \qquad \text{III}$$

III1

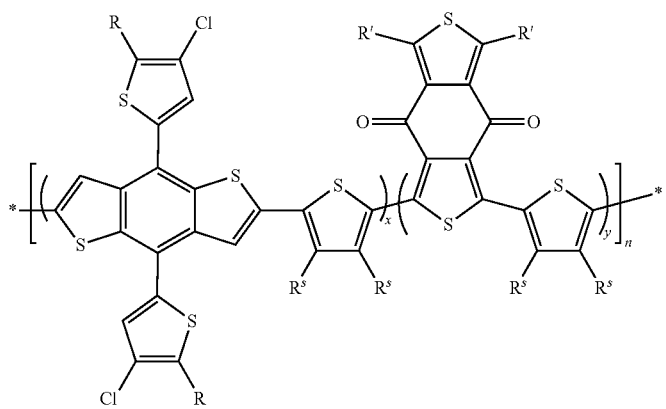

III2

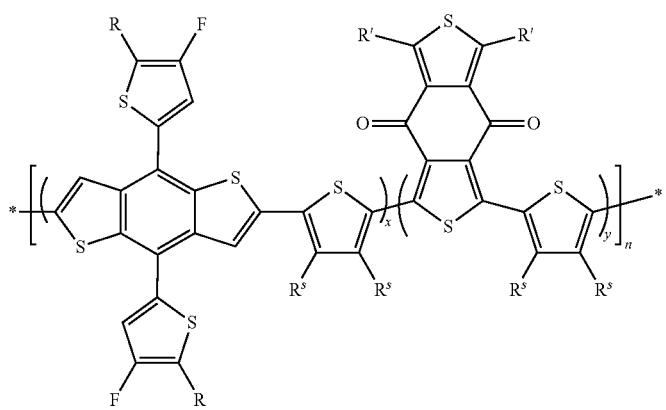

III3

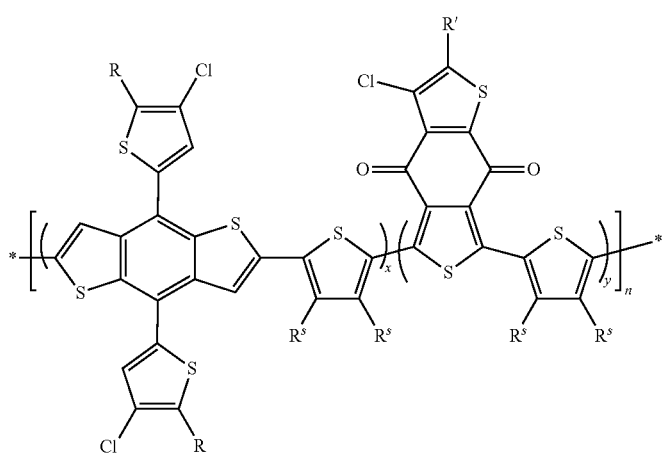

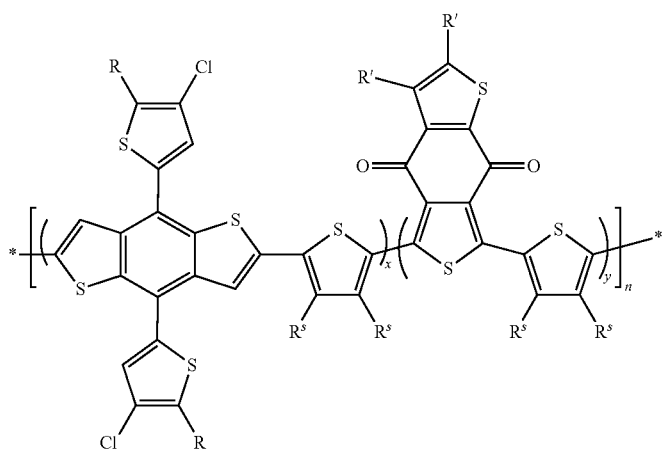
III4
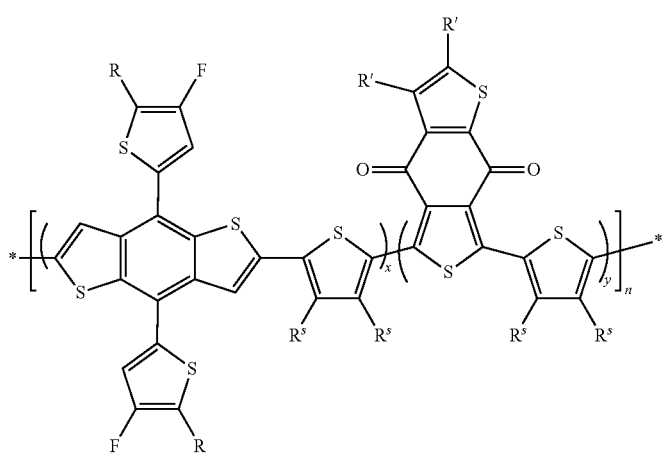
III5
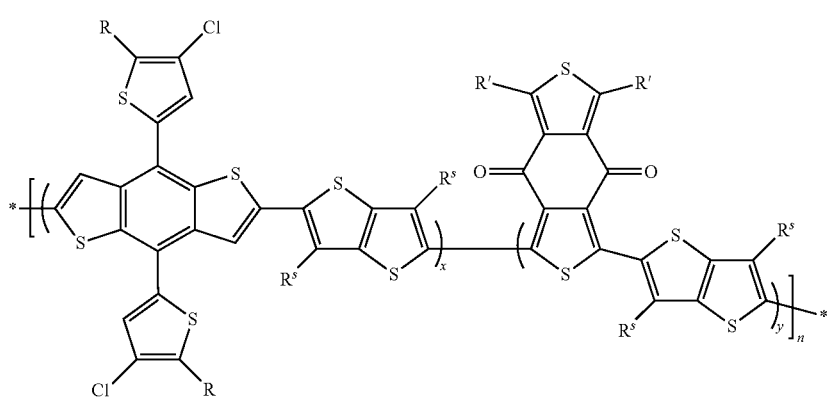
III6

-continued
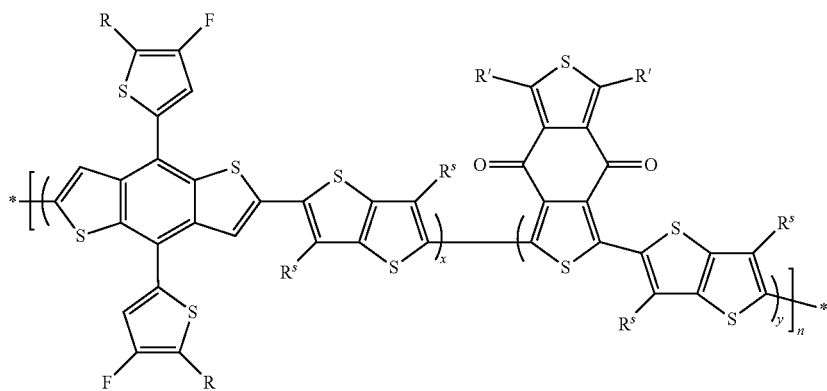
III7
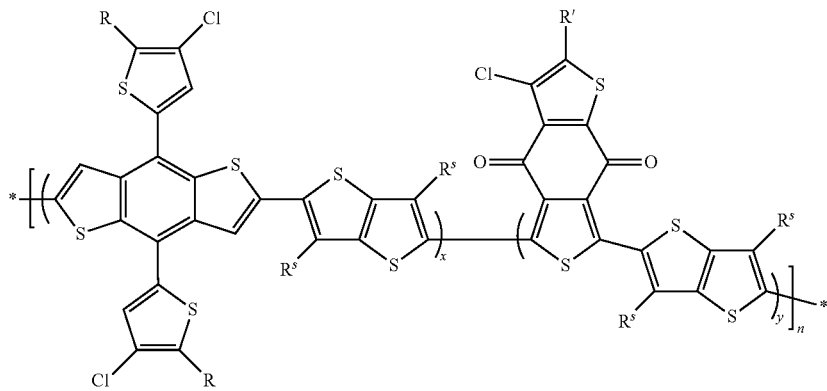
III8
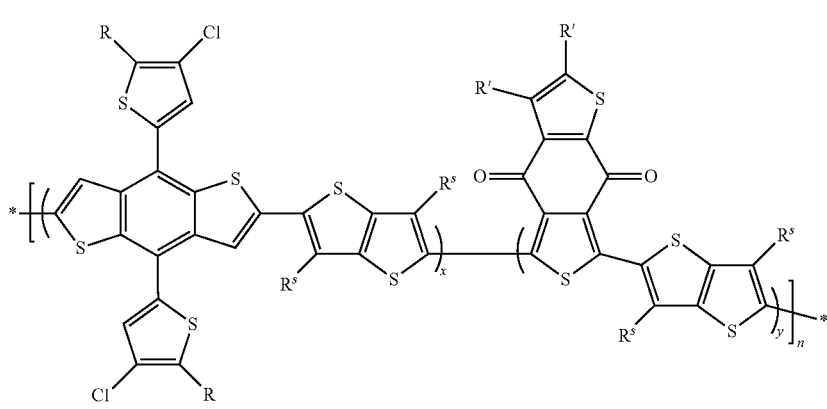
III9
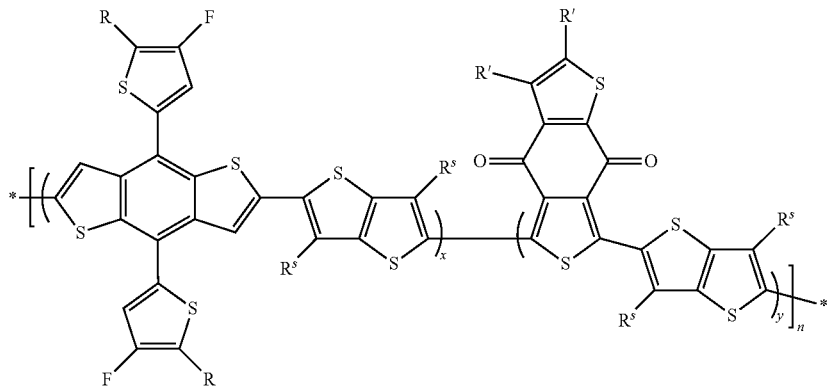
III10

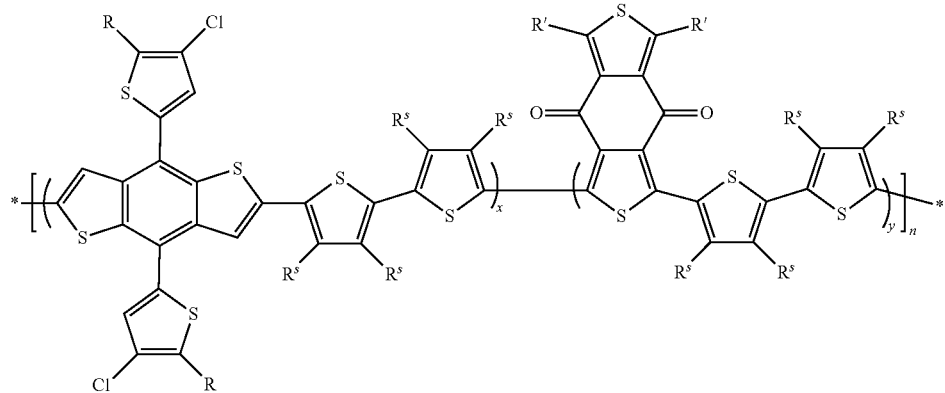
III11
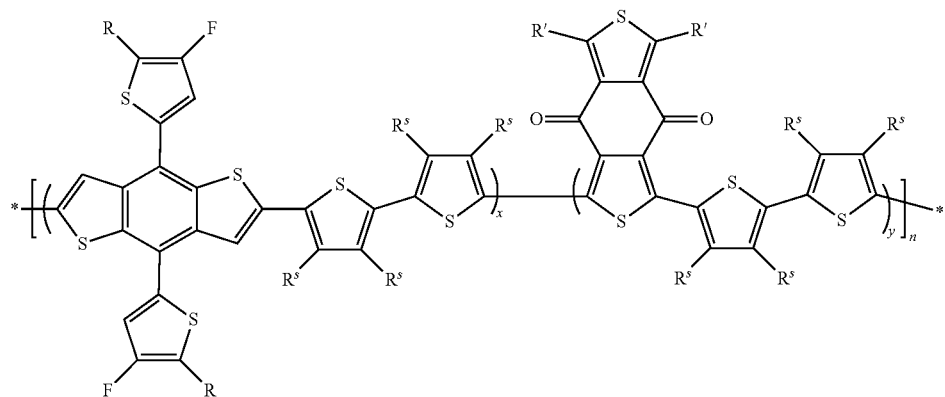
III12
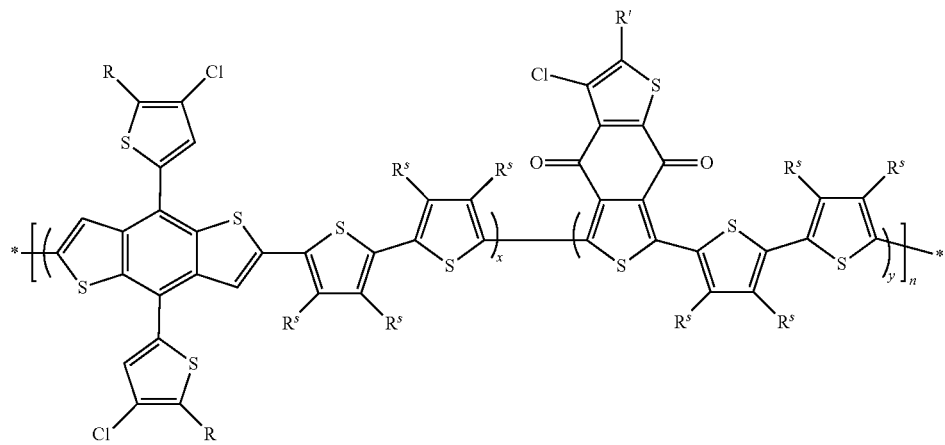
III13

-continued

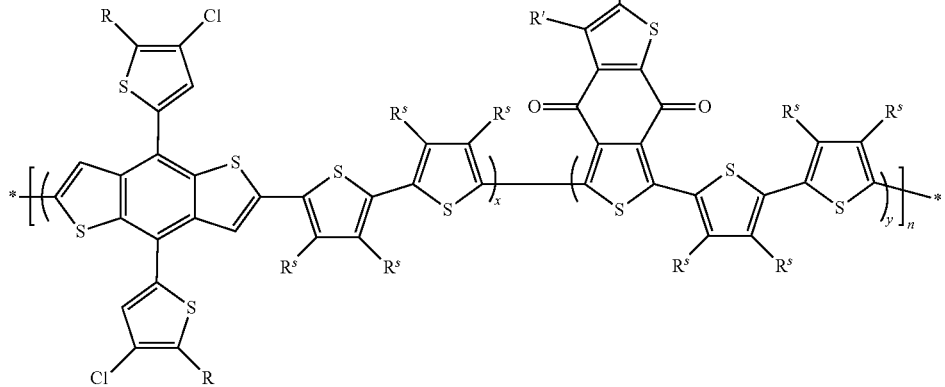

III-14

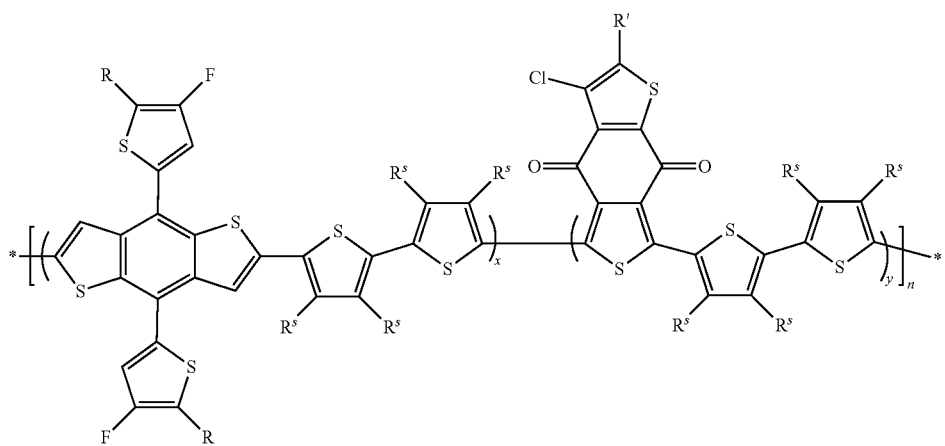

III-15 and $R^{21}$ and $R^{22}$ have independently of each other one of the meanings of L, or denote, independently of each other, H, F, Br, Cl, I, —CH$_2$Cl, —CHO, —CR$^a$=CR$^b_2$, —SiR$^a$R$^b$R$^c$, —SiR$^a$X$^a$X$^b$, —SiR$^a$R$^b$X$^a$, —SnR$^a$R$^b$R$^c$, —BR$^a$R$^b$, —B(OR$^a$)(OR$^b$), —B(OH)$_2$, —O—SO$_2$—R$^a$, —C≡CH, —C≡C—SiR$^a_3$, —ZnX$^a$ or an endcap group, X$^a$ and X$^b$ denote halogen, R$^a$, R$^b$ and R$^c$ have independently of each other one of the meanings of R$^0$, and two of R$^a$, R$^b$ and R$^c$ may also form a cyclosilyl, cyclostannyl, cycloborane or cycloboronate group with 2 to 20 C atoms together with the respective hetero atom to which they are attached, L is F, Cl, —CN, —NC, —NCO, —NCS, —OCN, —SCN, R$^0$, OR$^0$, SR$^0$, —C(=O)X$^0$, —C(=O)R$^0$, —C(=O)—OR$^0$, —O—C(=O)—R$^0$, —NH$_2$, —NHR$^0$, —NR$^0$R$^{00}$, —C(=O)NHR$^0$, —C(=O) NR$^0$R$^{00}$, —SO$_3$R$^0$, —SO$_2$R$^0$, —OH, —NO$_2$, —CF$_3$, —SF$^5$, or optionally substituted silyl, or carbyl or hydrocarbyl with with 1 to 30 C atoms that is optionally substituted and optionally comprises one or more hetero atoms, $Y^1$, $Y^2$ are H, F, Cl or CN, $X^0$ is halogen, $R^0$, $R^{00}$ are H or straight-chain or branched alkyl with 1 to 20 C atoms that is optionally fluorinated.

9. A composition comprising a conjugated polymer according to claim 1 and one or more additional compounds having one or more of semiconducting, charge transport, hole or electron transport, hole or electron blocking, electrically conducting, photoconducting or light emitting properties.

10. The composition of claim 9, further comprising one or more p-type semiconductors, and one or more n-type semiconductors.

11. The composition of claim 10, wherein the composition comprising one or more n-type semiconductors selected from small molecules that do not contain a fullerene moiety.

12. A bulk heterojunction (BHJ) formed from a composition according to claim 9.

13. A formulation comprising a conjugated polymer according to claim 1, and further comprising one or more organic solvents.

14. An electronic or optoelectronic device, or a component thereof, or an assembly comprising it, which comprises a conjugated polymer according to one or more of claim 1.

15. The electronic or optoelectronic device according to claim 14, which is selected from organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells (PSC), laser diodes, Schottky diodes, photoconductors, photodetectors and thermoelectric devices.

16. The component according to claim 14, which is selected from charge injection layers, charge transport layers, interlayers, planarising layers, antistatic films, polymer electrolyte membranes (PEM), conducting substrates and conducting patterns.

17. The assembly according to claim 14, which is selected from integrated circuits (IC), radio frequency identification (RFID) tags, security markings, security devices, flat panel displays, backlights of flat panel displays, electrophotographic devices, electrophotographic recording devices, organic memory devices, sensor devices, biosensors and biochips.

18. A process of preparing a conjugated polymer according claim 1, by coupling one or more monomers of formula V1, one or more monomers of formula V2, and optionally one or more monomers of formula V3, with each other in an aryl-aryl coupling reaction 19. The process of claim 18, characterized in that the monomers of formula V1, V2 and V3 are selected from the following subformulae

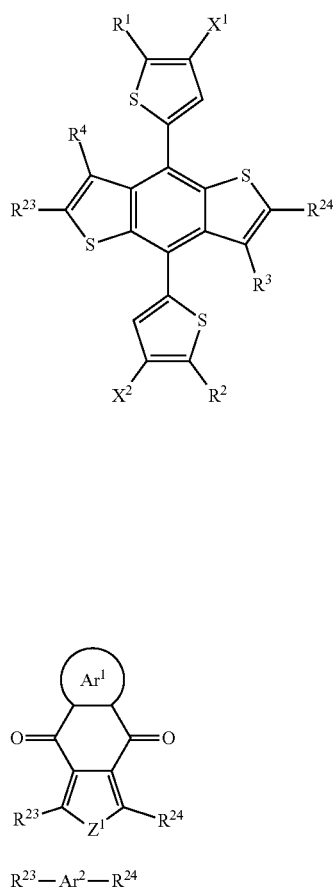

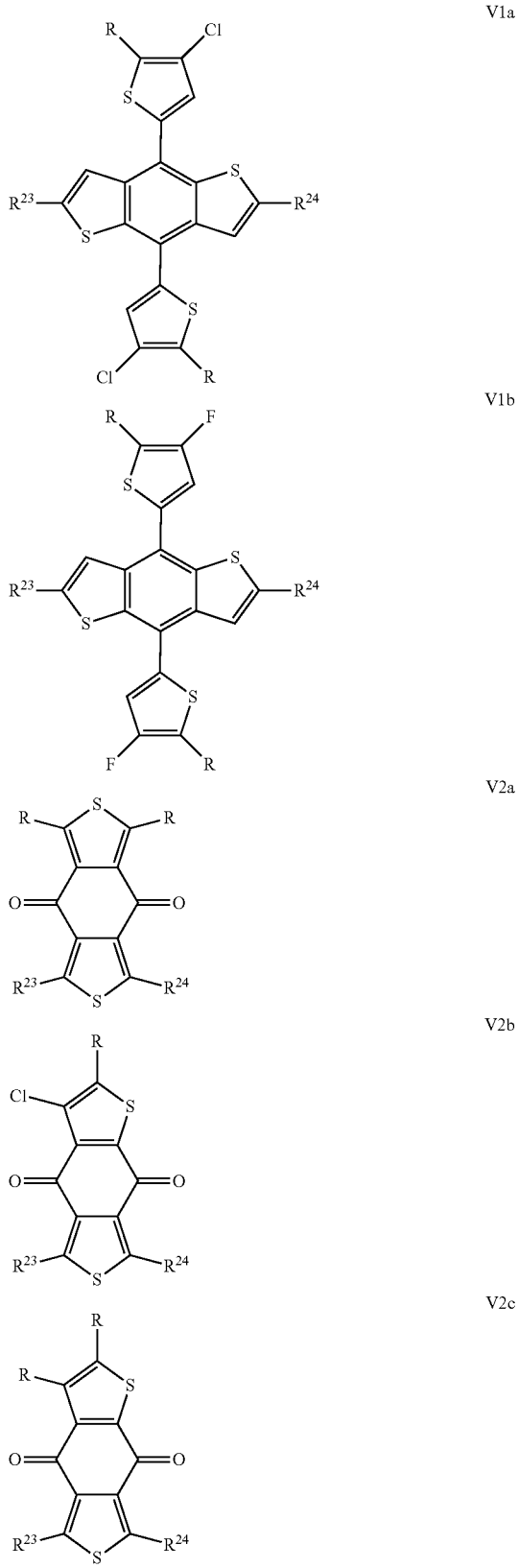

wherein $R^{23}$ and $R^{24}$ are independently of each other selected from the group consisting an activated C—H bond, Cl, Br, I, O-tosylate, O-triflate, O-mesylate, O-nonaflate, —SiMe$_2$F, —SiMeF$_2$, —O—SO$_2$Z$^a$, —B(OZ$^b$)$_2$, —CZ$^c$=C(Z$^c$)$_2$, —C≡CH, —C≡CSi(Z$^d$)$_3$, —ZnX$^0$ and —Sn(Z$^d$)$_3$, wherein Me is methyl, X$^0$ is halogen, Z$^{a-d}$ are selected from the group consisting of alkyl and aryl, and two groups Z$^b$ may also form a cycloboronate group having 2 to 20 C atoms together with the B- and O-atoms.

-continued

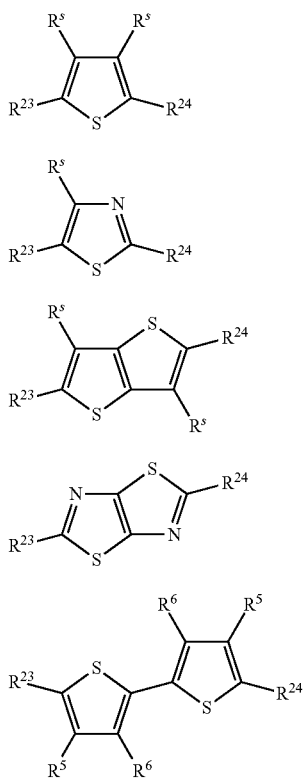

wherein R, $R^5$, $R^6$, $R^S$ have on each occurrence identically or differently H, F, Cl, straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl or heteroarylalkyl, wherein each of the aforementioned cyclic groups has 5 to 20 ring atoms, is mono- or polycyclic, does optionally contain fused rings, and is unsubstituted or substituted by one or more identical or different groups L, L is F, Cl, —CN, —NC, —NCO, —NCS, —OCN, —SCN, $R^o$, $OR^o$, $SR^o$, —C(=O)$X^o$, —C(=O)$R^o$, —C(=O)—$OR^o$, —O—C(=O)—$R^o$, —$NH_2$, —$NHR^o$, —$NR^oR^{oo}$, —C(=O)$NHR^o$, —C(=O)$NR^oR^{oo}$, —$SO_3R^o$, —$SO_2R^o$, —OH, —$NO_2$, —$CF_3$, —$SF_5$, or optionally substituted silyl, or carbyl or hydrocarbyl with with 1 to 30 C atoms that is optionally substituted and optionally comprises one or more hetero atoms, $Y^1$, $Y^2$ are H, F, Cl or CN, $X^o$ is halogen, $R^o$, $R^{oo}$ are H or straight-chain or branched alkyl with 1 to 20 C atoms that is optionally fluorinated, $R^{23}$ and $R^{24}$ are independently of each other selected from the group consisting an activated C—H bond, Cl, Br, I, O-tosylate, O-triflate, O-mesylate, O-nonaflate, —$SiMe_2F$, —$SiMeF_2$, —O—$SO_2Z^a$, —$B(OZ^b)_2$, —$CZ^c$=$C(Z^c)_2$, —C≡CH, —C≡CSi$(Z^a)_3$, —$ZnX^o$ and —Sn$(Z^d)_3$, wherein Me is methyl, $X^o$ is halogen, $Z^{a-d}$ are selected from the group consisting of alkyl and aryl, and two groups $Z^b$ may also form a cycloboronate group having 2 to 20 C atoms together with the B- and O-atoms.

20. A formulation comprising a composition according to claim 9, and further comprising one or more solvents selected from organic solvents.

21. An electronic or optoelectronic device, or a component thereof, or an assembly comprising it, which comprises a conjugated polymer according to a composition according to claim 9.

22. The electronic or optoelectronic device according to claim 21, which is selected from organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells (PSC), laser diodes, Schottky diodes, photoconductors, photodetectors and thermoelectric devices.

23. The component according to claim 21, which is selected from charge injection layers, charge transport layers, interlayers, planarising layers, antistatic films, polymer electrolyte membranes (PEM), conducting substrates and conducting patterns.

24. The assembly according to claim 21, which is selected from integrated circuits (IC), radio frequency identification (RFID) tags, security markings, security devices, flat panel displays, backlights of flat panel displays, electrophotographic devices, electrophotographic recording devices, organic memory devices, sensor devices, biosensors and biochips.

* * * * *